United States Patent
Yamazaki et al.

(10) Patent No.: US 10,672,913 B2
(45) Date of Patent: Jun. 2, 2020

(54) SEMICONDUCTOR DEVICE AND METHOD FOR MANUFACTURING THE SAME

(71) Applicant: Semiconductor Energy Laboratory Co., Ltd., Atsugi-shi, Kanagawa-ken (JP)

(72) Inventors: Shunpei Yamazaki, Tokyo (JP); Hideomi Suzawa, Kanagawa (JP); Tetsuhiro Tanaka, Kanagawa (JP); Hirokazu Watanabe, Kanagawa (JP); Yuhei Sato, Kanagawa (JP); Yasumasa Yamane, Kanagawa (JP); Daisuke Matsubayashi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 16/024,967

(22) Filed: Jul. 2, 2018

(65) Prior Publication Data

US 2019/0035937 A1    Jan. 31, 2019

Related U.S. Application Data

(62) Division of application No. 14/137,476, filed on Dec. 20, 2013, now abandoned.

(30) Foreign Application Priority Data

Dec. 25, 2012 (JP) .................. 2012-281801

(51) Int. Cl.
*H01L 29/786* (2006.01)
*H01L 29/45* (2006.01)
*H01L 29/66* (2006.01)

(52) U.S. Cl.
CPC ........ *H01L 29/78618* (2013.01); *H01L 29/45* (2013.01); *H01L 29/66969* (2013.01); *H01L 29/7869* (2013.01); *H01L 29/78696* (2013.01)

(58) Field of Classification Search
CPC ........... H01L 29/78696; H01L 29/7869; H01L 29/78693; H01L 29/66969; H01L 21/02554

(Continued)

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| CN | 102403361 A | 4/2012 |
| EP | 1737044 A | 12/2006 |

(Continued)

OTHER PUBLICATIONS

International Search Report (Application No. PCT/JP2013/084180) dated Mar. 4, 2014.

(Continued)

*Primary Examiner* — Jonathan Han
(74) *Attorney, Agent, or Firm* — Fish & Richardson P.C.

(57) ABSTRACT

A semiconductor device having a reduced amount of oxygen vacancy in a channel formation region of an oxide semiconductor is provided. Further, a semiconductor device which includes an oxide semiconductor and has improved electric characteristics is provided. Furthermore, a methods for manufacturing the semiconductor device is provided. An oxide semiconductor film is formed; a conductive film is formed over the oxide semiconductor film at the same time as forming a low-resistance region between the oxide semiconductor film and the conductive film; the conductive film (Continued)

is processed to form a source electrode and a drain electrode; and oxygen is added to the low-resistance region between the source electrode and the drain electrode, so that a channel formation region having a higher resistance than the low-resistance region is formed and a first low-resistance region and a second low-resistance region between which the channel formation region is positioned are formed.

20 Claims, 60 Drawing Sheets

(58) Field of Classification Search
USPC ...... 257/43, 57, 59, E29.296, E21.413, E21, 257/703, E27.111, E27.112; 438/104, 438/197, 149, 479
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,218,099 B2 | 7/2012 | Yamazaki et al. |
| 8,237,166 B2 | 8/2012 | Kumomi et al. |
| 8,304,773 B2 | 11/2012 | Shimada |
| 8,400,187 B2 | 3/2013 | Yamazaki et al. |
| 8,421,083 B2 | 4/2013 | Yamazaki et al. |
| 8,440,510 B2 | 5/2013 | Yamazaki |
| 8,461,007 B2 | 6/2013 | Yamazaki |
| 8,461,584 B2 | 6/2013 | Yamazaki |
| 8,502,221 B2 | 8/2013 | Yamazaki |
| 8,518,761 B2 | 8/2013 | Yamazaki et al. |
| 8,530,289 B2 | 9/2013 | Yamazaki |
| 8,530,892 B2 | 9/2013 | Yamazaki et al. |
| 8,546,225 B2 | 10/2013 | Yamazaki |
| 8,547,493 B2 | 10/2013 | Yamazaki et al. |
| 8,551,810 B2 | 10/2013 | Yamazaki |
| 8,575,608 B2 | 11/2013 | Sasagawa et al. |
| 8,653,514 B2 | 2/2014 | Yamazaki |
| 8,704,216 B2 | 4/2014 | Godo et al. |
| 8,709,922 B2 | 4/2014 | Koezuka et al. |
| 8,723,176 B2 | 5/2014 | Yamazaki |
| 8,748,886 B2 | 6/2014 | Yamazaki et al. |
| 8,785,928 B2 | 7/2014 | Yamazaki et al. |
| 8,796,683 B2 | 8/2014 | Yamazaki |
| 8,859,330 B2 | 10/2014 | Koezuka et al. |
| 8,890,159 B2 | 11/2014 | Yamazaki et al. |
| 8,901,557 B2 | 12/2014 | Yamazaki |
| 8,921,853 B2 | 12/2014 | Yamazaki |
| 8,946,702 B2 | 2/2015 | Yamazaki et al. |
| 8,952,377 B2 | 2/2015 | Yamazaki et al. |
| 8,952,381 B2 | 2/2015 | Yamazaki |
| 8,963,148 B2 | 2/2015 | Matsubayashi et al. |
| 8,981,372 B2 | 3/2015 | Yamazaki |
| 8,987,727 B2 | 3/2015 | Sasagawa et al. |
| 8,987,731 B2 | 3/2015 | Yamazaki |
| 9,018,624 B2 | 4/2015 | Yamazaki |
| 9,059,219 B2 | 6/2015 | Sasagawa et al. |
| 9,064,899 B2 | 6/2015 | Godo et al. |
| 9,082,863 B2 | 7/2015 | Yamazaki |
| 9,093,328 B2 | 7/2015 | Yamazaki et al. |
| 9,153,436 B2 | 10/2015 | Yamazaki et al. |
| 9,153,649 B2 | 10/2015 | Sasaki et al. |
| 9,153,699 B2 | 10/2015 | Yamazaki |
| 9,166,021 B2 | 10/2015 | Tezuka et al. |
| 9,184,245 B2 | 11/2015 | Yamazaki |
| 9,190,525 B2 | 11/2015 | Yamazaki |
| 9,209,256 B2 | 12/2015 | Tokunaga et al. |
| 9,214,474 B2 | 12/2015 | Yamazaki |
| 9,219,161 B2 | 12/2015 | Yamazaki |
| 9,240,492 B2 | 1/2016 | Yamazaki |
| 9,245,958 B2 | 1/2016 | Yamazaki |
| 9,246,011 B2 | 1/2016 | Yamazaki et al. |
| 9,252,283 B2 | 2/2016 | Matsubayashi et al. |
| 9,257,569 B2 | 2/2016 | Yamazaki et al. |
| 9,269,821 B2 | 2/2016 | Yamazaki |
| 9,299,815 B2 | 3/2016 | Sasagawa et al. |
| 9,318,613 B2 | 4/2016 | Yamazaki |
| 9,660,102 B2 | 5/2017 | Godo et al. |
| 9,667,148 B2 | 5/2017 | Kimura et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |

(56) References Cited

U.S. PATENT DOCUMENTS

| | | |
|---|---|---|
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0062433 A1 | 3/2011 | Yamazaki |
| 2011/0084272 A1 | 4/2011 | Miyanaga et al. |
| 2011/0108833 A1 | 5/2011 | Yamazaki et al. |
| 2011/0121289 A1 | 5/2011 | Miyanaga et al. |
| 2011/0127520 A1 | 6/2011 | You |
| 2011/0140100 A1 | 6/2011 | Takata et al. |
| 2011/0220894 A1 | 9/2011 | Furukawa |
| 2011/0233541 A1 | 9/2011 | Yamazaki |
| 2011/0233542 A1 | 9/2011 | Yamazaki et al. |
| 2011/0240991 A1 | 10/2011 | Yamazaki |
| 2011/0240992 A1 | 10/2011 | Yamazaki |
| 2011/0240993 A1 | 10/2011 | Yamazaki |
| 2011/0240994 A1 | 10/2011 | Yamazaki |
| 2011/0240995 A1 | 10/2011 | Yamazaki |
| 2011/0240998 A1 | 10/2011 | Morosawa et al. |
| 2011/0248260 A1 | 10/2011 | Yamazaki |
| 2011/0248261 A1 | 10/2011 | Yamazaki |
| 2011/0263082 A1 | 10/2011 | Yamazaki |
| 2011/0263091 A1 | 10/2011 | Yamazaki |
| 2011/0284848 A1 | 11/2011 | Yamazaki |
| 2011/0303914 A1 | 12/2011 | Yamazaki |
| 2011/0309411 A1 | 12/2011 | Takemura |
| 2011/0312127 A1 | 12/2011 | Ishizuka et al. |
| 2012/0001170 A1 | 1/2012 | Yamazaki |
| 2012/0049183 A1 | 3/2012 | Yamazaki |
| 2012/0052624 A1 | 3/2012 | Yamazaki |
| 2012/0187395 A1 | 7/2012 | Koezuka |
| 2012/0319102 A1 | 12/2012 | Yamazaki et al. |
| 2012/0319183 A1 | 12/2012 | Yamazaki et al. |
| 2013/0009148 A1 | 1/2013 | Yamazaki |
| 2013/0126862 A1 | 5/2013 | Yamazaki |
| 2013/0146870 A1 | 6/2013 | Yamazaki |
| 2013/0161611 A1 | 6/2013 | Yamazaki et al. |
| 2013/0200370 A1 | 8/2013 | Yamazaki et al. |
| 2013/0270564 A1 | 10/2013 | Yamazaki |
| 2013/0285050 A1 | 10/2013 | Yamazaki et al. |
| 2013/0285470 A1 | 10/2013 | Koyama et al. |
| 2013/0299819 A1 | 11/2013 | Yamazaki et al. |
| 2013/0320334 A1 | 12/2013 | Yamazaki et al. |
| 2014/0014947 A1 | 1/2014 | Yamazaki |
| 2014/0022479 A1 | 1/2014 | Hosaka et al. |
| 2014/0027762 A1 | 1/2014 | Tsurume et al. |
| 2014/0035478 A1 | 2/2014 | Kitakadoh et al. |
| 2014/0042434 A1 | 2/2014 | Yamazaki |
| 2014/0042437 A1 | 2/2014 | Yamazaki |
| 2014/0077205 A1 | 3/2014 | Yamazaki et al. |
| 2014/0091301 A1 | 4/2014 | Yamazaki |
| 2014/0103337 A1 | 4/2014 | Yamazaki et al. |
| 2014/0103339 A1* | 4/2014 | Yamazaki ......... H01L 29/78693 257/43 |
| 2014/0103346 A1 | 4/2014 | Yamazaki |
| 2014/0103960 A1 | 4/2014 | Yamazaki et al. |
| 2014/0108836 A1 | 4/2014 | Nishijima et al. |
| 2014/0110703 A1 | 4/2014 | Yamazaki |
| 2014/0110705 A1 | 4/2014 | Koezuka et al. |
| 2014/0110707 A1 | 4/2014 | Koezuka et al. |
| 2014/0110708 A1 | 4/2014 | Koezuka et al. |
| 2014/0113405 A1 | 4/2014 | Tsubuku et al. |
| 2014/0151688 A1 | 6/2014 | Yamazaki |
| 2014/0154837 A1 | 6/2014 | Yamazaki |
| 2014/0186998 A1 | 7/2014 | Koezuka et al. |
| 2015/0333090 A1 | 11/2015 | Yamazaki et al. |
| 2016/0225908 A1 | 8/2016 | Yamazaki |
| 2017/0250201 A1 | 8/2017 | Yamazaki et al. |
| 2017/0256650 A1 | 9/2017 | Godo et al. |
| 2018/0261699 A1 | 9/2018 | Yamazaki |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 09-121056 A | 5/1997 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086006 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2010-177450 A | 8/2010 |
| JP | 2010-226101 A | 10/2010 |
| JP | 2011-077517 A | 4/2011 |
| JP | 2011-086921 A | 4/2011 |
| JP | 2011-119714 A | 6/2011 |
| JP | 2011-124360 A | 6/2011 |
| JP | 2011-151382 A | 8/2011 |
| JP | 2011-228622 A | 11/2011 |
| JP | 2011-228695 A | 11/2011 |
| JP | 2011-233880 A | 11/2011 |
| JP | 2012-015491 A | 1/2012 |
| JP | 2012-059860 A | 3/2012 |
| JP | 2012-169610 A | 9/2012 |
| JP | 2012-212880 A | 11/2012 |
| JP | 2012-253329 A | 12/2012 |
| WO | WO-2004/114391 | 12/2004 |
| WO | WO-2011/027664 | 3/2011 |
| WO | WO-2011/033915 | 3/2011 |
| WO | WO-2011/055631 | 5/2011 |
| WO | WO-2011/122364 | 10/2011 |
| WO | WO-2012/102314 | 8/2012 |
| WO | WO-2012/117936 | 9/2012 |

OTHER PUBLICATIONS

Written Opinion (Application No. PCT/JP2013/084180) dated Mar. 4, 2014.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-DOPED Zinc Indium Oxide Thin Film Transistors for AMOLED Back-Plane", SID Digest '09 : SID

(56) References Cited

OTHER PUBLICATIONS

International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZNO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08: SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID Internatonal Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects In ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Dispay Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID System", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of The Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M, "Synthesis of Homologous Compound with New Long-Period Structure", NIRIM Newsletter, Mar. 1, 1995, vol. 150, pp. 1-4.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

(56) References Cited

OTHER PUBLICATIONS

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

EcS1>EcS3

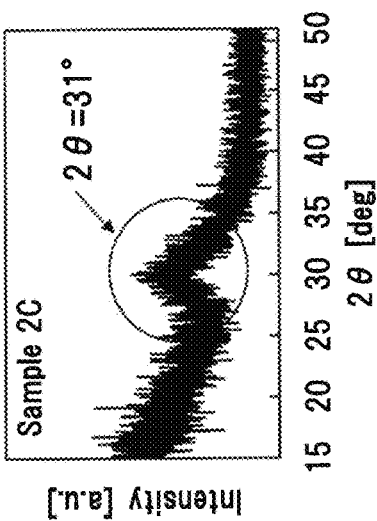
FIG. 32A
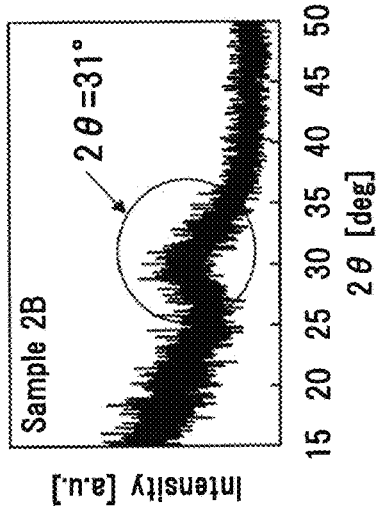
FIG. 32B
FIG. 32C
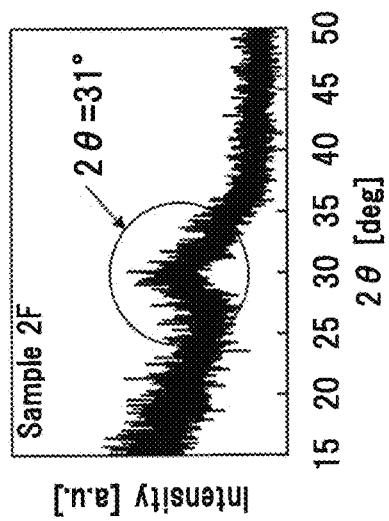
FIG. 32D
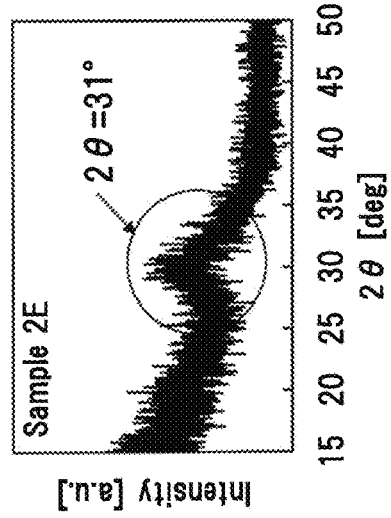
FIG. 32E
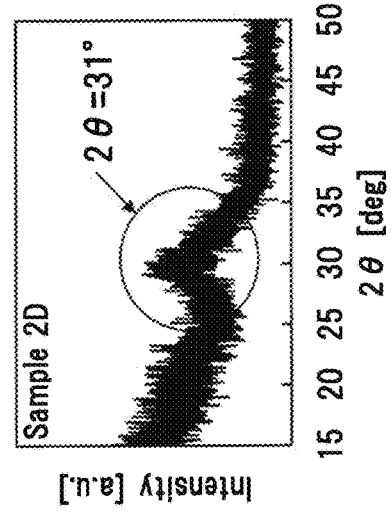
FIG. 32F

SEMICONDUCTOR DEVICE AND METHOD FOR MANUFACTURING THE SAME

CROSS-REFERENCE TO RELATED APPLICATIONS

This application is a divisional of U.S. application Ser. No. 14/137,476, filed Dec. 20, 2013, now pending, which claims the benefit of a foreign priority application filed in Japan as Serial No. 2012-281801 on Dec. 25, 2012, both of which are incorporated by reference.

TECHNICAL FIELD

The present invention relates to a product (including a machine, a manufacture, and a composition of matter) and a process (including a simple process and a production process). In particular, one embodiment of the present invention relates to, a semiconductor device, a display device, a light-emitting device, a power storage device, a driving method thereof, or a manufacturing method thereof. In particular, one embodiment of the present invention relates to a semiconductor device including an oxide semiconductor, a display device including an oxide semiconductor, or a light-emitting device including an oxide semiconductor.

BACKGROUND ART

Transistors used for most flat panel displays typified by a liquid crystal display device and a light-emitting display device are formed using silicon semiconductors such as amorphous silicon, single crystal silicon, and polycrystalline silicon provided over glass substrates. Further, transistors formed using such silicon semiconductors are used in integrated circuits (ICs) and the like.

In recent years, attention has been drawn to a technique in which, instead of a silicon semiconductor, a metal oxide exhibiting semiconductor characteristics is used for transistors. Note that in this specification, a metal oxide exhibiting semiconductor characteristics is referred to as an oxide semiconductor.

For example, a technique by which a transistor is formed using zinc oxide or an In—Ga—Zn-based oxide semiconductor as an oxide semiconductor is disclosed (see Patent Document 1).

REFERENCE

Patent Document

[Patent Document 1] Japanese Published Patent Application No. 2006-165528

DISCLOSURE OF INVENTION

In the case where a material of a conductive film to be a source electrode and a drain electrode formed over an oxide semiconductor film in a transistor including an oxide semiconductor is a conductive material which is more likely to be bonded to oxygen than to a metal element contained in the oxide semiconductor film, oxygen in the oxide semiconductor film is bonded to the conductive material. The bonding causes oxygen vacancy in a region of the oxide semiconductor film in the vicinity of an interface with the conductive film. Alternatively, damage (oxygen vacancy) to the top surface of the oxide semiconductor film is caused when the conductive film to be the source electrode and the drain electrode is formed over the oxide semiconductor film. A low-resistance region is formed owing to the oxygen vacancy and hydrogen, so that contact resistance between the oxide semiconductor film and the source electrode or the drain electrode is reduced. Accordingly, conductivity is improved, whereby high speed operation of the transistor can be achieved. Also in the case where the material of the conductive film is a conductive material which is easily diffused into the oxide semiconductor film by heat treatment, the low-resistance region is formed. However, the conductive film is also in contact with a channel formation region in the oxide semiconductor film, and thus oxygen vacancy is also caused in a region of the channel formation region in the vicinity of the interface with the conductive film; as a result, a defect of electrical characteristics of the transistor might occur.

Thus, an object of one embodiment of the present invention is to provide a semiconductor device or the like in which a channel formation region of an oxide semiconductor has a small amount of oxygen vacancy. Another object of one embodiment of the present invention is to provide a semiconductor device which includes an oxide semiconductor and has improved electrical characteristics. Another object of one embodiment of the present invention is to provide a method for manufacturing the semiconductor device or the like. Another object of one embodiment of the present invention is to provide a semiconductor device or the like with low off-state current. Another object of one embodiment of the present invention is to provide a semiconductor device or the like in which leakage current through an insulating film is small. Another object of one embodiment of the present invention is to provide a semiconductor device or the like with high mobility. Another object of one embodiment of the present invention is to provide a semiconductor device or the like with high switching characteristics. Another object of one embodiment of the present invention is to provide a semiconductor device or the like with low power consumption. Another object of one embodiment of the present invention is to provide a semiconductor device or the like including a transparent semiconductor film. Another object of one embodiment of the present invention is to provide a semiconductor device or the like using a highly reliable semiconductor film. Another object of one embodiment of the present invention is to provide a novel semiconductor device. Note that the descriptions of these problems do not disturb the existence of other problems. Note that in one embodiment of the present invention, there is no need to achieve all the objects. Other objects will be apparent from and can be derived from the description of the specification, the drawings, the claims, and the like.

Although the conductive film to be the source electrode and the drain electrode formed over the oxide semiconductor film also reduces the resistance of the channel formation region, the resistance of the channel formation region is increased by supply of oxygen using the source electrode and the drain electrode as masks.

One embodiment of the present invention is a semiconductor device including an oxide semiconductor film: a source electrode and a drain electrode over the oxide semiconductor film; a first low-resistance region between the oxide semiconductor film and the source electrode; a second low-resistance region between the oxide semiconductor film and the drain electrode; and a channel formation region positioned in the oxide semiconductor film and between the first low-resistance region and the second low-resistance region. The first low-resistance region is positioned in a region of the oxide semiconductor film at a depth of greater than 0 nm and less than or equal to 15 nm from an interface between the oxide semiconductor film and the source electrode, and the second low-resistance region is positioned in a region of the oxide semiconductor film at a depth of greater than 0 nm and less than or equal to 15 nm from an interface between the oxide semiconductor film and the drain electrode.

Another embodiment of the present invention is a semiconductor device including an oxide semiconductor film; a source electrode and a drain electrode over the oxide semiconductor film; a first low-resistance region between the oxide semiconductor film and the source electrode; a second low-resistance region between the oxide semiconductor film and the drain electrode; a channel formation region positioned in the oxide semiconductor film and between the first low-resistance region and the second low-resistance region; a gate insulating film over the oxide semiconductor film, the source electrode, and the drain electrode; and a gate electrode over the gate insulating film to overlap with the oxide semiconductor film. The first low-resistance region is positioned in a region of the oxide semiconductor film at a depth of greater than 0 nm and less than or equal to 15 nm from an interface between the oxide semiconductor film and the source electrode, and the second low-resistance region is positioned in a region of the oxide semiconductor film at a depth of greater than 0 nm and less than or equal to 15 nm from an interface between the oxide semiconductor film and the drain electrode.

Another embodiment of the present invention is a semiconductor device including a gate electrode; a gate insulating film over the gate electrode; an oxide semiconductor film over the gate insulating film; a source electrode and a drain electrode over the oxide semiconductor film; a first low-resistance region between the oxide semiconductor film and the source electrode; a second low-resistance region between the oxide semiconductor film and the drain electrode; a channel formation region positioned in the oxide semiconductor film and between the first low-resistance region and the second low-resistance region; and an insulating film over the oxide semiconductor film, the source electrode, and the drain electrode. The first low-resistance region is positioned in a region of the oxide semiconductor film at a depth of greater than 0 nm and less than or equal to 15 nm from an interface between the oxide semiconductor film and the source electrode, and the second low-resistance region is positioned in a region of the oxide semiconductor film at a depth of greater than 0 nm and less than or equal to 15 nm from an interface between the oxide semiconductor film and the drain electrode.

In the above structure, a first oxide film and a second oxide film between which the oxide semiconductor film is positioned are provided. The energy of the bottom of the conduction band in each of the first oxide film and the second oxide film is closer to a vacuum level than the energy of the bottom of the conduction band in the oxide semiconductor film by 0.05 eV or higher and 2 eV or lower.

In the above structure, a difference between a length between the source electrode and the drain electrode and a length between the first low-resistance region and the second low-resistance region is less than 30% of the length between the source electrode and the drain electrode.

In the above structure, a region in which an oxygen content is sequentially increased from a surface of the channel formation region toward a depth direction of the oxide semiconductor film is provided.

In the above structure, the gate insulating film contains aluminum oxide.

Another embodiment of the present invention is a method for manufacturing a semiconductor device, including the steps of forming an oxide semiconductor film; forming a conductive film over the oxide semiconductor film at the same step as forming a low-resistance region between the oxide semiconductor film and the conductive film; processing the conductive film to form a source electrode and a drain electrode; and adding oxygen to the low-resistance region that overlaps with neither the source electrode nor the drain electrode, so that a channel formation region having a higher resistance than the low-resistance region is formed and a first low-resistance region and a second low-resistance region between which the channel formation region is positioned are formed.

Another embodiment of the present invention is a method for manufacturing a semiconductor device, including the steps of forming an oxide semiconductor film; forming a conductive film over the oxide semiconductor film at the same step as forming a low-resistance region between the oxide semiconductor film and the conductive film; processing the conductive film to form a source electrode and a drain electrode; forming a gate insulating film over the oxide semiconductor film, the source electrode, and the drain electrode; adding oxygen to the low-resistance region that overlaps with neither the source electrode nor the drain electrode, so that a channel formation region having a higher resistance than the low-resistance region is formed and a first low-resistance region and a second low-resistance region between which the channel formation region is positioned are formed; and forming a gate electrode over the gate insulating film to overlap with the oxide semiconductor film.

Another embodiment of the present invention is a method for manufacturing a semiconductor device, including the steps of forming a gate electrode; forming a gate insulating film over the gate electrode; forming an oxide semiconductor film over the gate insulating film; forming a conductive film over the oxide semiconductor film at the same step as forming a low-resistance region between the oxide semiconductor film and the conductive film; processing the conductive film to form a source electrode and a drain electrode; adding oxygen to the low-resistance region that overlaps with neither the source electrode nor the drain electrode, so that a channel formation region having a higher resistance than the low-resistance region is formed and a first low-resistance region and a second low-resistance region between which the channel formation region is positioned are formed; and forming an insulating film over the oxide semiconductor film, the source electrode, and the drain electrode.

In the above manufacturing method, the addition of oxygen is performed by an ion doping method or an ion implantation method.

By the manufacturing method of one embodiment of the present invention, the amount of oxygen vacancy in the channel formation region in the oxide semiconductor can be reduced. In addition, electrical characteristics of a semiconductor device including the oxide semiconductor can be improved.

BRIEF DESCRIPTION OF DRAWINGS

FIGS. 19A, 19B1 and 19B2, and 19C are diagrams for describing a discharge state when sputtering is performed using an AC power source.

FIGS. 32A to 32F show measurement results of XRD spectra of samples formed in an example.

BEST MODE FOR CARRYING OUT THE INVENTION

Figure 1A:
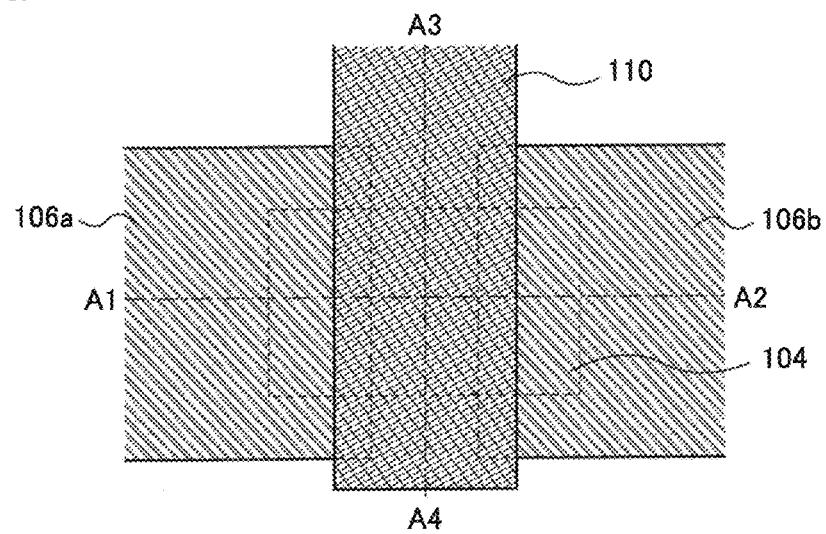
FIGS. 1A to 1C are a top view and cross-sectional views illustrating a transistor.

Embodiments will be described in detail with reference to the drawings. Note that the present invention is not limited to the following description and it will be readily appreciated by those skilled in the art that modes and details can be modified in various ways without departing from the spirit and the scope of the present invention. Therefore, the present invention should not be limited to the descriptions of the embodiment modes and the embodiment below. Note that, in the structures of the invention described below, in some cases, the same portions or portions having similar functions are denoted by the same reference numerals in different drawings, and the descriptions of such portions are not repeated.

Embodiment 1

In this embodiment, a semiconductor device of one embodiment of the present invention is described with reference to drawings.

Figure 1B:
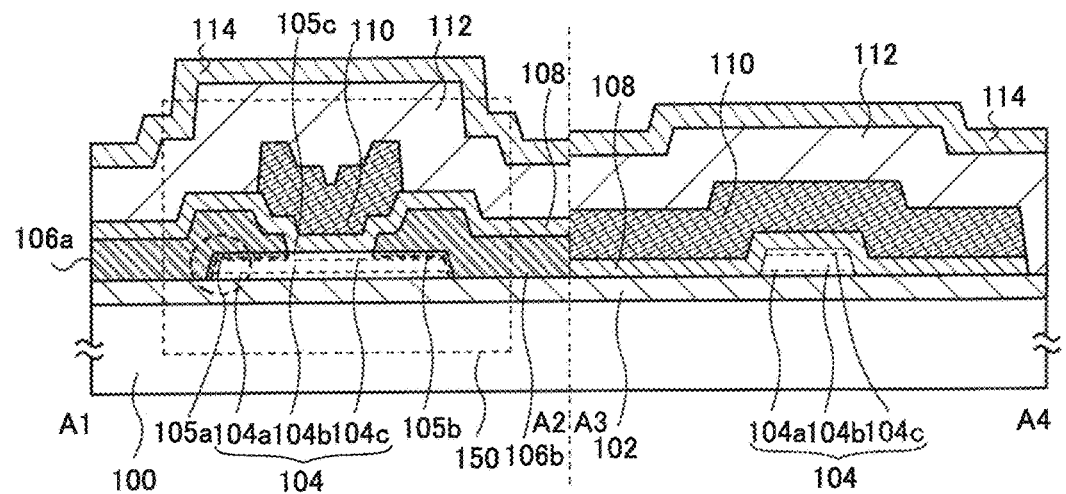
Figure 1C:
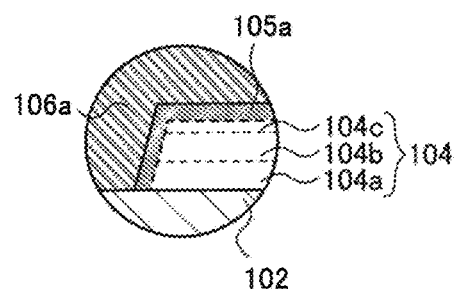

FIGS. 1A to 1C are a top view and cross-sectional views illustrating a transistor of one embodiment of the present invention. FIG. 1A is the top view, and a cross section taken along a dashed-dotted line A1-A2 and a dashed-dotted line A3-A4 in FIG. 1A corresponds to FIG. 1B. FIG. 1C is an enlarged view of a region surrounded by a circle of a dotted line in FIG. 1B. Note that some components in the top view in FIG. 1A are not illustrated for simplification of the drawing.

A transistor 150 illustrated in FIGS. 1A to 1C includes a base insulating film 102 over a substrate 100; a multilayer film 104 including an oxide semiconductor film over the base insulating film 102; a low-resistance region 105a and a low-resistance region 105b over the multilayer film 104; a source electrode 106a over the low-resistance region 105a; a drain electrode 106b over the low-resistance region 105b; a gate insulating film 108 over the multilayer film 104, the source electrode 106a, and the drain electrode 106b; and a gate electrode 110 over the gate insulating film 108. Further, an oxide insulating film 112 may be provided over the gate insulating film 108 and the gate electrode 110. The oxide insulating film 112 may be formed as necessary, and another insulating film (e.g., a nitride insulating film 114) may be provided thereover.

Note that functions of a source and a drain of a transistor may be switched in the case where transistors of different polarities are employed or in the case where the direction of a current flow changes in a circuit operation. Therefore, the terms "source" and "drain" can be replaced with each other in this specification.

The substrate 100 is not limited to a simple supporting substrate, and may be a substrate where a device such as a transistor is formed. In this case, at least one of the gate electrode 110, the source electrode 106a, and the drain electrode 106b of the transistor 150 may be electrically connected to the device.

The base insulating film 102 can have a function of supplying oxygen to the oxide semiconductor film of the multilayer film 104 as well as a function of preventing diffusion of an impurity from the substrate 100; thus, the base insulating film 102 is preferably an insulating film containing oxygen, further preferably an insulating film containing excess oxygen. Note that in the case where the substrate 100 is a substrate where another device is formed as described above, the base insulating film 102 has also a function as an interlayer insulating film. In that case, the base insulating film 102 is preferably subjected to planarization treatment such as chemical mechanical polishing (CMP) treatment so as to have a flat surface.

The multilayer film 104 has a structure in which an oxide film 104a, an oxide semiconductor film 104b, and an oxide film 104c are stacked from the substrate 100 side. An oxide semiconductor whose electron affinity (an energy from the vacuum level to the bottom of the conduction band) is higher than those of the oxide film 104a and the oxide film 104c is used as the oxide semiconductor film 104b. The electron affinity can be obtained by subtracting an energy difference between the bottom of the conduction band and the top of the valence band (what is called a band gap) from an energy difference between the vacuum level and the top of the valence band (what is called an ionization potential).

Depending on materials used for the oxide film 104a, the oxide semiconductor film 104b, and the oxide film 104c, boundaries between the oxide film 104a and the oxide semiconductor film 104b and between the oxide semiconductor film 104b and the oxide film 104c in the multilayer film 104 cannot be clearly recognized in some cases. Thus, the boundaries of the oxide film 104a, the oxide semiconductor film 104b, and the oxide film 104c are denoted by dotted lines in the drawings.

Although the case where the multilayer film 104 is a stack of three layers is described in this embodiment, the multilayer film 104 may be a single layer or a stack of two layers or four or more layers. In the case of a single layer, a layer corresponding to the oxide semiconductor film 104b is used. In the case of two layers, a layer corresponding to the oxide semiconductor film 104b is used on the substrate 100 side and a layer corresponding to the oxide film 104a or the oxide film 104c is used on the gate insulating film 108 side. In the case of four or more layers, as in the description of this embodiment, a structure in which the oxide semiconductor film 104b is sandwiched between layers corresponding to the oxide film 104a and the oxide film 104c is used.

It is preferable that each of the oxide film 104a and the oxide film 104c contains one or more kinds of metal elements forming the oxide semiconductor film 104b, and is formed using an oxide whose energy of the bottom of the conduction band is closer to the vacuum level than that of the oxide semiconductor film 104b by 0.05 eV or more, 0.07 eV or more, 0.1 eV or more, or 0.15 eV or more and 2 eV or less, 1 eV or less, 0.5 eV or less, or 0.4 eV or less.

When a voltage is applied to the gate electrode 110 in such a structure, a channel is formed in the oxide semiconductor film 104b of the multilayer film 104, because the oxide semiconductor film 104b has the lowest energy at the bottom of the conduction band. In other words, the oxide film 104c is formed between the oxide semiconductor film 104b and the gate insulating film 108, whereby a structure in which the channel of the transistor is not in contact with the gate insulating film can be obtained.

Further, the oxide film 104a contains one or more metal elements which are contained in the oxide semiconductor film 104b; therefore, an interface state is not easily formed at the interface between the oxide semiconductor film 104b and the oxide film 104a. The interface state sometimes forms a channel; therefore, a second transistor which has a different threshold voltage is formed and accordingly the apparent threshold voltage of the transistor is changed in some cases. Thus, with the oxide film 104a, variation in electrical characteristics of the transistor, such as a threshold voltage, can be reduced.

Further, since the oxide film 104c contains one or more metal elements which are contained in the oxide semiconductor film 104b, carrier scattering is not likely to occur at the interface between the oxide semiconductor film 104b and the oxide film 104c. Therefore, with the oxide film 104c, the field-effect mobility of the transistor can be increased.

Note that when each of the oxide film 104a, the oxide semiconductor film 104b, and the oxide film 104c is an In-M-Zn oxide containing at least indium, zinc, and M (M is a metal such as Al, Ti, Ga, Ge, Y, Zr, Sn, La, Ce, or Hf), and the oxide film 104a has an atomic ratio of In:M:Zn=$x_1$:$y_1$:$z_1$, the oxide semiconductor film 104b has an atomic ratio of In:M:Zn=$x_2$:$y_2$:$z_2$, and the oxide film 104c has an atomic ratio of In:M:Zn=$x_3$:$y_3$:$z_3$, each of $y_1/x_1$ and $y_3/x_3$ is preferably larger than $y_2/x_2$. Each of $y_1/x_1$ and $y_3/x_3$ is one and a half times or more as large as $y_2/x_2$, preferably twice or more as large as $y_2/x_2$, more preferably three times or more as large as $y_2/x_2$. At this time, when $y_2$ is greater than or equal to $x_2$ in the oxide semiconductor film 104b, a transistor can have stable electrical characteristics. However, when $y_2$ is three times or more as great as $x_2$, the field-effect mobility of the transistor is reduced; accordingly, $y_2$ is preferably less than three times $x_2$.

The atomic ratio of In to M in each of the oxide film 104a and the oxide film 104c in the case where Zn and O are not taken into consideration is preferably as follows: the proportion of In is lower than 50 atomic % and the proportion of M is higher than or equal to 50 atomic %; and it is further preferably as follows: the proportion of In be lower than 25 atomic % and the proportion of M is higher than or equal to 75 atomic %. The atomic ratio of In to M in the oxide semiconductor film 104b in the case where Zn and O are not taken into consideration is preferably as follows: the proportion of In is higher than or equal to 25 atomic % and the proportion of M is lower than 75 atomic %; and it is further preferably as follows: the proportion of In is higher than or equal to 34 atomic % and the proportion of M is lower than 66 atomic %.

The thickness of each of the oxide film 104a and the oxide film 104c is greater than or equal to 3 nm and less than or equal to 100 nm, preferably greater than or equal to 3 nm and less than or equal to 50 nm. The thickness of the oxide semiconductor film 104b is greater than or equal to 3 nm and less than or equal to 200 nm, preferably greater than or equal to 3 nm and less than or equal to 100 nm, further preferably greater than or equal to 3 nm and less than or equal to 50 nm.

For each of the oxide film 104a, the oxide semiconductor film 104b, and the oxide film 104c, for example, an oxide semiconductor containing indium, zinc, and gallium can be used. Note that the oxide semiconductor film 104b preferably contains indium because carrier mobility can be increased.

In order to obtain a transistor having stable electrical characteristics, where a channel is the oxide semiconductor film, it is effective to make the oxide semiconductor film intrinsic or substantially intrinsic by reducing the concentration of impurities in the oxide semiconductor film. The term "substantially intrinsic" refers to the state where an oxide semiconductor film has a carrier density lower than $1 \times 10^{17}/cm^3$, preferably lower than $1 \times 10^{15}/cm^3$, further preferably lower than $1 \times 10^{13}/cm^3$.

Further, in the oxide semiconductor film, hydrogen, nitrogen, carbon, silicon, and a metal element other than main components are impurities. For example, hydrogen and nitrogen form donor levels to increase the carrier density. Silicon forms impurity states in an oxide semiconductor film. The impurity state becomes a trap, which might deteriorate the electric characteristics of the transistor. Therefore, it is effective to reduce the impurity concentrations in the oxide film 104a, the oxide semiconductor film 104b, and the oxide film 104c, and the impurity concentrations at interfaces thereof.

In order that the oxide semiconductor film is intrinsic or substantially intrinsic, the concentration of silicon in the oxide semiconductor film, which is measured by secondary ion mass spectrometry (SIMS) analysis, is set lower than $1 \times 10^{19}$ atoms/$cm^3$, preferably lower than $5 \times 10^{18}$ atoms/$cm^3$, further preferably lower than $1 \times 10^{18}$ atoms/$cm^3$. The concentration of hydrogen in the oxide semiconductor film is set lower than or equal to $1 \times 10^{19}$ atoms/$cm^3$, preferably lower than or equal to $5 \times 10^{17}$ atoms/$cm^3$, further preferably lower than or equal to $1 \times 10^{17}$ atoms/$cm^3$. The concentration of nitrogen in the oxide semiconductor film is set lower than $5 \times 10^{19}$ atoms/$cm^3$, preferably lower than or equal to $5 \times 10^{18}$ atoms/$cm^3$, further preferably lower than or equal to $1 \times 10^{18}$ atoms/$cm^3$, still further preferably lower than or equal to $5 \times 10^{17}$ atoms/$cm^3$.

In addition, in a case where the oxide semiconductor film includes a crystal, the crystallinity of the oxide semiconductor film might be decreased if silicon or carbon is included at high concentration. In order not to lower the crystallinity of the oxide semiconductor film, the concentration of silicon in the oxide semiconductor film is preferably set lower than $1 \times 10^{19}$ atoms/$cm^3$, preferably lower than $5 \times 10^{18}$ atoms/$cm^3$, further preferably lower than $1 \times 10^{18}$ atoms/$cm^3$. Moreover, the concentration of carbon in the oxide semiconductor film is set lower than $1 \times 10^{19}$ atoms/$cm^3$, preferably lower than $5 \times 10^{18}$ atoms/$cm^3$, more preferably lower than $1 \times 10^{18}$ atoms/$cm^3$.

Further, the concentration of alkali metal or alkaline earth metal of the oxide semiconductor film, which is measured by SIMS analysis, is set lower than or equal to $1 \times 10^{18}$ atoms/$cm^3$, preferably lower than or equal to $2 \times 10^{16}$ atoms/$cm^3$. This is because an alkali metal and an alkaline earth metal might generate carriers when bonded to an oxide semiconductor, in which case the off-state current of the transistor might be increased.

A transistor in which a highly purified oxide semiconductor film is used for a channel formation region as described above has an extremely low off-state current, and the off-state current normalized on the channel width of the transistor can be as low as several yoktoamperes per micrometer to several zeptoamperes per micrometer.

Note that as the gate insulating film of the transistor, an insulating film containing silicon is used in many cases; therefore, it is preferable that a region of the oxide semiconductor film, which serves as a channel, be not in contact with the gate insulating film for the above-described reason. In the case where a channel is formed at the interface between a gate insulating film and an oxide semiconductor film, scattering of carriers occurs at the interface, whereby the field-effect mobility of a transistor is reduced in some cases. Also from the view of the above, it is preferable that a region of the oxide semiconductor film, which serves as a channel, be distant from the gate insulating film.

Therefore, when the multilayer film 104 has the stacked-layer structure of the oxide film 104a, the oxide semiconductor film 104b, and the oxide film 104c, the oxide semiconductor film 104b in which a channel of the transistor is formed can be distant from the gate insulating film, so that the transistor can have high field-effect mobility and stable electrical characteristics.

Here, the localized level in the oxide semiconductor film is described. Here, measurement results of the oxide semiconductor film obtained by a constant photocurrent method (CPM) are described.

First, the structures of measurement samples are described.

The measurement samples each include an oxide semiconductor film provided over a glass substrate, a pair of electrodes in contact with the oxide semiconductor film, and an insulating film covering the oxide semiconductor film and the pair of electrodes.

Next, methods for forming the oxide semiconductor films included in the measurement samples are described.

A first oxide semiconductor film was formed by a sputtering method under the following conditions: an In—Ga—Zn-oxide target (having an atomic ratio of In:Ga:Zn=1:1:1) was used; argon with a flow rate of 30 sccm and oxygen with a flow rate of 15 sccm were used as a sputtering gas; the pressure was 0.4 Pa; the substrate temperature was room temperature; and a DC power of 0.5 kW was applied. Note that the first oxide semiconductor film is a microcrystalline oxide semiconductor film.

In addition, the first oxide semiconductor film was heated at 450° C. in a nitrogen atmosphere for one hour and then heated at 450° C. in an oxygen atmosphere for one hour, whereby hydrogen contained in the first oxide semiconductor film was released and oxygen was supplied to the first oxide semiconductor film; as a result, a second oxide semiconductor film was formed. The second oxide semiconductor film is a microcrystalline oxide semiconductor film.

Next, the measurement sample including the first oxide semiconductor film and the measurement sample including the second oxide semiconductor film were subjected to CPM measurement. Specifically, the amount of light with which a surface of the measurement sample between the pair of electrodes was irradiated was adjusted so that a photocurrent value was kept constant in the state where voltage was applied between the electrodes provided in contact with the oxide semiconductor film, and then an absorption coefficient was derived from the amount of the irradiation light in an intended wavelength range.

Figure 43A:
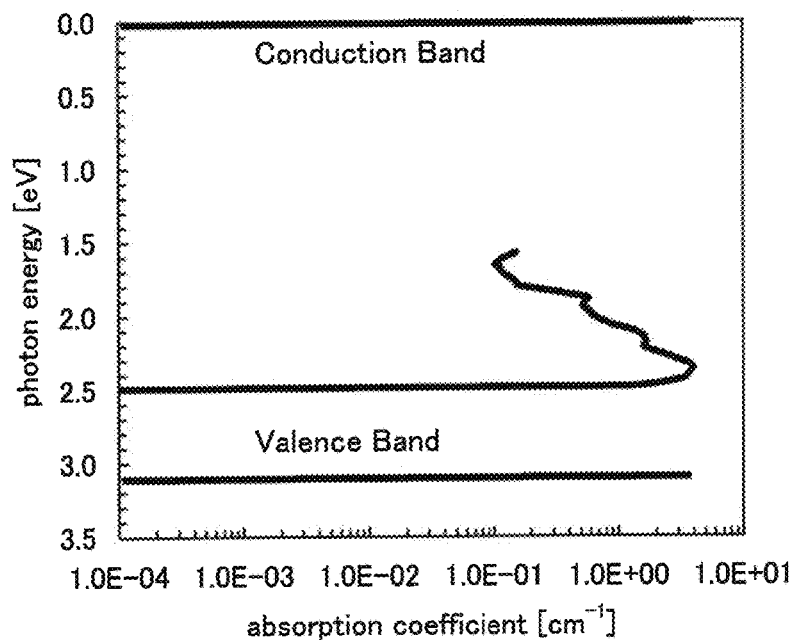
FIGS. 43A and 43B each show CPM measurement results of an oxide semiconductor film.
Figure 43B:
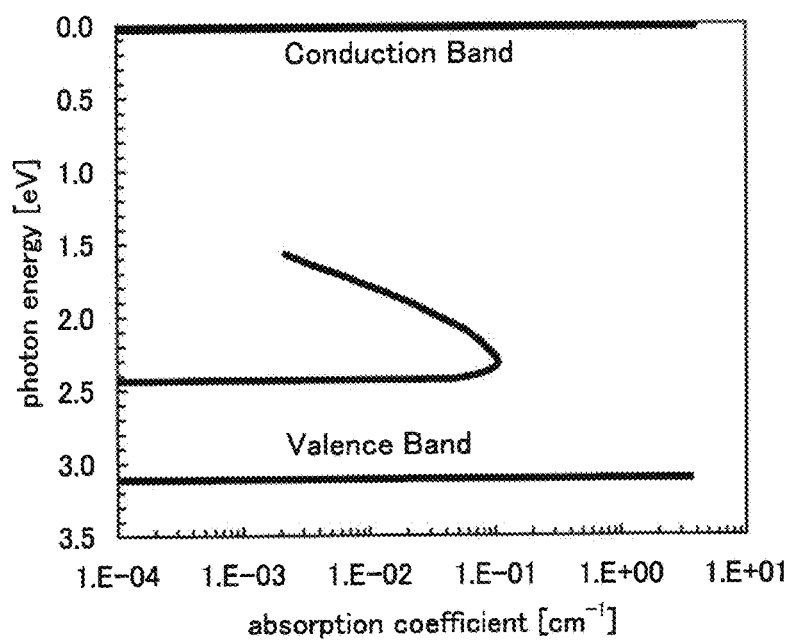

Absorption coefficients shown in FIGS. 43A and 43B were each obtained by removing an absorption coefficient due to the band tail from the absorption coefficient obtained by CPM measurement of the measurement sample. That is, absorption coefficients due to defects are shown in FIGS. 43A and 43B. In FIGS. 43A and 43B, the horizontal axis indicates the absorption coefficient, and the vertical axis indicates the photon energy. On the vertical axis in each of FIGS. 43A and 43B, the bottom of the conduction band of the oxide semiconductor film is set to 0 eV, and the top of the valence band is set to 3.15 eV. Each curve in FIGS. 43A and 43B represents a relation between the absorption coefficient and photon energy, which corresponds to a defect level.

FIG. 43A shows measurement results of the measurement sample including the first oxide semiconductor film, in which an absorption coefficient due to a defect level is $5.28 \times 10^{-1}$ cm$^{-1}$. FIG. 43B shows measurement results of the measurement sample including the second oxide semiconductor film, in which an absorption coefficient due to a defect level is $1.75 \times 10^{-2}$ cm$^{-1}$.

These results show that defects in the oxide semiconductor film can be reduced by heat treatment.

Note that film densities of the first oxide semiconductor film and the second oxide semiconductor film were measured by X-ray reflectometry (XRR). The film density of the first oxide semiconductor film was 5.9 g/cm$^3$ and the film density of the second oxide semiconductor film was 6.1 g/cm$^3$.

These results indicate that the film density of an oxide semiconductor film can be increased by heat treatment.

That is, it is found that as the film density of an oxide semiconductor film becomes higher, the number of defects in the oxide semiconductor film is reduced.

Next, a measurement result of another measurement sample prepared in a condition different from the above measurement sample obtained by a constant photocurrent method (CPM) is described First, the structure of a sample subjected to CPM measurement are described.

The measurement sample includes an oxide semiconductor film provided over a glass substrate, a pair of electrodes in contact with the oxide semiconductor film, and an insulating film covering the oxide semiconductor film and the pair of electrodes.

Next, a method for forming the oxide semiconductor film included in the measurement sample is described.

The oxide semiconductor film was formed by a sputtering method under the following conditions: an In—Ga—Zn-oxide target (having an atomic ratio of In:Ga:Zn=1:1:1) was used; argon with a flow rate of 30 sccm and oxygen with a flow rate of 15 sccm were used as a sputtering gas; the pressure was 0.4 Pa; the substrate temperature was 400° C.; and a DC power of 0.5 kW was applied. Next, the oxide semiconductor film was heated at 450° C. in a nitrogen atmosphere for one hour and then heated at 450° C. in an oxygen atmosphere for one hour, whereby hydrogen contained in the oxide semiconductor film was released and oxygen was supplied to the oxide semiconductor film. Note that the oxide semiconductor film is a CAAC-OS (c-axis-aligned crystalline oxide semiconductor) film.

Next, the measurement sample including the oxide semiconductor film was subjected to CPM measurement. Specifically, the amount of light with which a surface of the sample between the pair of electrodes was irradiated was adjusted so that a photocurrent value was kept constant in the state where voltage was applied between the electrodes provided in contact with the oxide semiconductor film, and then an absorption coefficient is derived from the amount of the irradiation light in an intended wavelength range.

Figure 44:
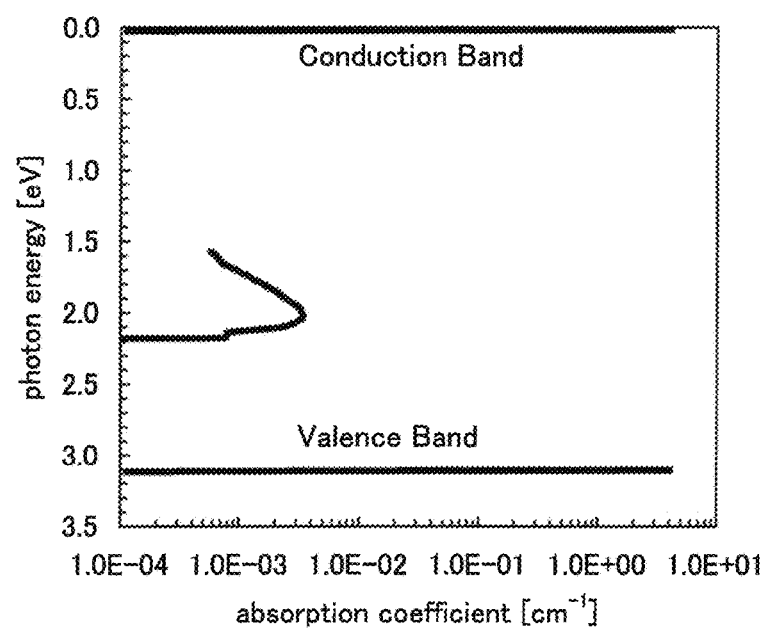
FIG. 44 shows CPM measurement results of an oxide semiconductor film.

An absorption coefficient shown in FIG. 44 was obtained by removing an absorption coefficient due to the band tail from the absorption coefficient obtained by CPM measurement of the measurement sample. That is, an absorption coefficient due to defects is shown in FIG. 44. In FIG. 44, the horizontal axis indicates the absorption coefficient, and the vertical axis indicates the photon energy. The bottom of the conduction band and the top of the valence band of the oxide semiconductor film are set to 0 eV and 3.15 eV, respectively, on the vertical axis in FIG. 44. The curve in FIG. 44 represents a relation between the absorption coefficient and photon energy, which corresponds to a defect level.

In a curve shown in FIG. 44, an absorption coefficient due to a defect level is $5.86 \times 10^{-4}$ cm$^{-1}$. That is, the CAAC-OS film has an absorption coefficient due to a defect level of less than $1 \times 10^{-3}$ cm$^{-1}$, preferably less than $1 \times 10^{-4}$ cm$^{-1}$ and is a film which has a low density of a defect level.

The film density of the oxide semiconductor film was measured by X-ray reflectometry (XRR). The film density of the oxide semiconductor film was 6.3 g/cm$^3$. That is, the CAAC-OS film is a film with a high film density.

Next, deterioration caused by the application of positive voltage to the drain electrode of the transistor is described.

Figure 40:
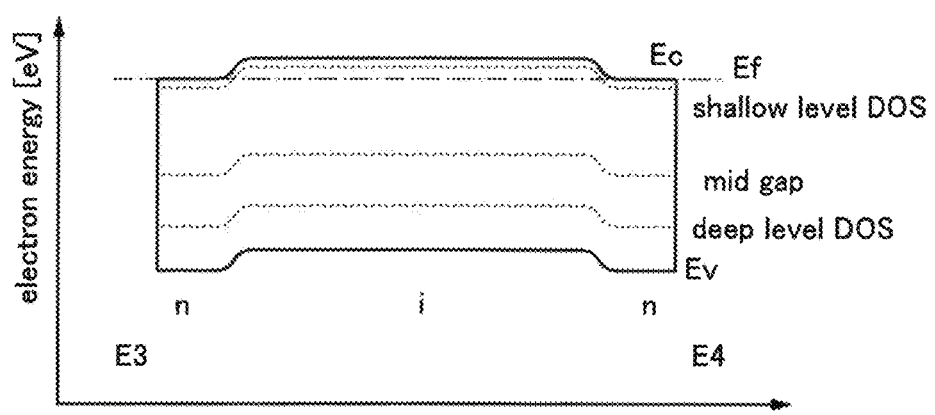
FIG. 40 shows a band structure of a transistor including an oxide semiconductor film.

FIG. 40 shows a band structure in the channel length direction. Note that an oxide semiconductor film (OS) is shown as an i-layer (denoted by "i") in FIG. 40 to be distinguished from the n-layer.

As shown in FIG. 40, the Fermi energy of the oxide semiconductor film is higher than the mid gap. This is because when the distance between the source electrode and the drain electrode is sufficiently short, the energy (Ec) of the bottom of the conduction band is lowered by the effect of the source electrode and the drain electrode and thus, the energy of the bottom of the conduction band and the Fermi energy come close to each other. This phenomenon is called a conduction band lowering (CBL) effect. The CBL effect is an effect specific to an oxide semiconductor, which is due to an extremely large depletion layer of the oxide semiconductor film.

Here, the CBL effect is described in detail.

It seems intuitively that in the case where an intrinsic or substantially intrinsic oxide semiconductor film is used as the oxide semiconductor film, a barrier that is about half the energy gap of the oxide semiconductor film is formed between the source and drain electrodes and the oxide semiconductor film. However, the transistor including the oxide semiconductor film actually has such Vg-Id characteristics that drain current starts to flow when gate voltage is about 0 V.

Figure 41:
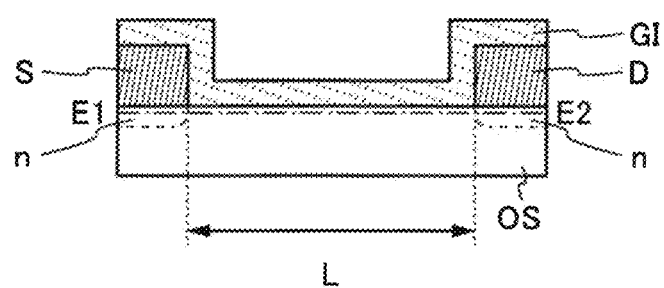
FIG. 41 illustrates a cross-sectional structure of a calculation model.

In view of the above, the following structure illustrated in FIG. 41 is assumed: an oxide semiconductor film (OS) is provided; a source electrode (S) and a drain electrode (D) are provided over the oxide semiconductor film; and a gate insulating film (GI) is provided over the oxide semiconductor film, the source electrode, and the drain electrode. Then, a band structure along dashed-dotted line E1-E2 of the case where the channel length (L) is changed is calculated. In FIG. 41, n-layers are provided in regions of the oxide semiconductor film, which are in contact with the source electrode and the drain electrode.

From an estimate of the curve width of the band obtained by solving the Poisson's equation, the curve width of the band is found to be characterized by the Debye shielding length $\lambda_D$ in the following formula. Note that in the following equation, $k_B$ represents a Boltzmann constant.

$$\text{the curve width of the band} = \sqrt{\frac{\varepsilon\varepsilon_0 k_B T}{e^2 ni}} = \text{the Debye shielding length } \lambda_D \quad \text{[Formula 1]}$$

By substituting $6.6\times10^{-9}$ cm$^{-3}$ for the intrinsic carrier density ni of the oxide semiconductor film, 15 for the relative permittivity s of the oxide semiconductor film, and 300 K for temperature T in the above formula, the Debye shielding length $\lambda_D$ is found to be as long as $5.7\times10^{10}$ μm. This indicates that when the channel length is greater than $1.14\times10^{11}$ μm, which is twice as large as the Debye shielding length $\lambda_D$, the height of a barrier between the p-layer and the i-layer is half the energy gap of the oxide semiconductor film.

Figure 42:
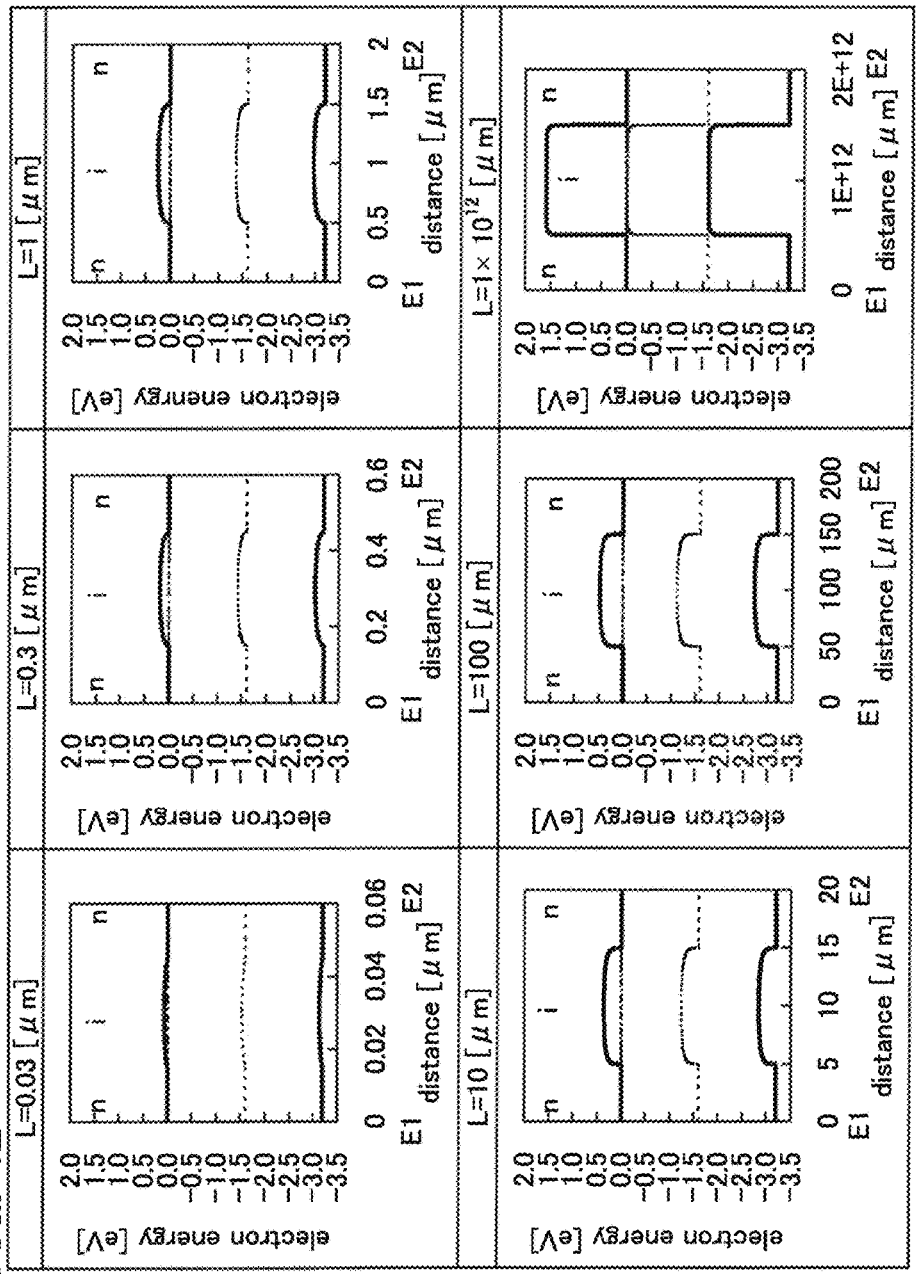
FIG. 42 shows band structures of calculation models.

FIG. 42 shows calculation results of band structures with channel lengths of 0.03 μm, 0.3 μm, 1 μm, 10 μm, 100 μm, and $1\times10^{12}$ μm. Note that in FIG. 42, "n" denotes the n-layer and "i" denotes a region of an oxide semiconductor film (i-layer) which is sandwiched between the n-layers, and a dashed-dotted line represents the Fermi energy of the oxide semiconductor film and a dashed line indicates the mid gap of the oxide semiconductor film.

According to FIG. 42, in the case where a channel length is as large as $1\times10^{12}$ μm, the difference in electron energy between the i-layer and the n-layer is half the energy gap of the oxide semiconductor film. However, the difference in electron energy between the i-layer and the n-layer gradually becomes smaller as the channel length becomes smaller, and there is almost no barrier when the channel length is 1 μm or less. Note that the electron energy of the n-layer is fixed by the source electrode and the drain electrode.

As described above, the barrier between the n-layer and the i-layer is sufficiently small when the channel length is small.

Owing to the CBL effect, the subthreshold value of the transistor including the oxide semiconductor film is reduced to near the theoretical limit even when there is a barrier between the source and drain electrodes and the oxide semiconductor film; thus, favorable switching characteristics are obtained.

In a channel having n-type conductivity, an electron can easily pass from the source to the drain and a path is formed between the source and the drain. As a result, the switching characteristics are hard to be obtained. To avoid this, the channel needs to be completely prevented from having n-type conductivity and needs to be necessarily intrinsic (i-type).

A material of a conductive film to be the source electrode and the drain electrode is a conductive material which is more likely to be bonded to oxygen than to a metal element included in the oxide semiconductor film; therefore, oxygen in the multilayer film 104 is bonded to the conductive material. The bonding causes oxygen vacancy in a region of the multilayer film 104 in the vicinity of an interface with the conductive film. Alternatively, damage (oxygen vacancy) to the top surface of the multilayer film 104 is caused when the conductive film to be formed over the multilayer film 104 is formed. Regions whose resistances are reduced owing to the oxygen vacancy and hydrogen, i.e., the low-resistance region 105a and the low-resistance region 105b are formed, so that contact resistance between the multilayer film and the source electrode or the drain electrode is reduced. Also in the case where the material of the conductive film is a conductive material which is easily diffused into the oxide semiconductor film by heat treatment, the low-resistance region 105a and the low-resistance region 105b are formed. Although boundaries between the multilayer film 104 and each of the low-resistance region 105a and the low-resistance region 105b exist in the oxide film 104c, this embodiment is not limited thereto; the boundaries may exist in the oxide film 104a, in the oxide semiconductor film 104b, at the interface between the oxide film 104a and the oxide semiconductor film 104b, or at the interface between the oxide semiconductor film 104b and the oxide film 104c. A low-resistance region is, for example, a region that has a sheet resistance lower than or equal to $1.0\times10^6$ Ω/square, preferably lower than or equal to $1.0\times10^5$ Ω/square, further preferably lower than or equal to $1.0\times10^4$ Ω/square.

The source electrode 106a and the drain electrode 106b are formed so as to have a step-like edge portion. The end portions can be formed in such a manner that a step of making a resist mask recede by ashing and an etching step are alternately performed plural times. Therefore, the edge portions of the source electrode 106a and the drain electrode 106b are provided over the low-resistance region 105a and the low-resistance region 105b, respectively.

Accordingly, a channel formation region of the transistor 150 corresponds to a region 105c of the multilayer film 104 between the low-resistance region 105a and the low-resistance region 105b, a region of the low-resistance region 105a which is not in contact with the source electrode 106a, and a region of the low-resistance region 105b which is not in contact with the drain electrode 106b. The resistance of the channel formation region of the transistor 150 is reduced (the channel formation region is made to be an n-type); therefore, it is necessary that the impurity concentration of the oxide semiconductor film in the multilayer film 104 is reduced so that the oxide semiconductor film is highly purified to be intrinsic. Obtaining a highly purified intrinsic oxide semiconductor film refers to making the oxide semiconductor film be an intrinsic or substantially intrinsic oxide semiconductor film. The term "substantially intrinsic" refers to the state where an oxide semiconductor film has a carrier density lower than $1 \times 10^{17}/cm^3$, preferably lower than $1 \times 10^{15}/cm^3$, further preferably lower than $1 \times 10^{13}/cm^3$.

In order that the channel formation region of the transistor 150 is highly purified to be intrinsic, oxygen is added to the region 105c of the multilayer film 104. The addition of oxygen can reduces the amount of oxygen vacancy, so that a highly purified intrinsic region can be formed. Accordingly, the highly purified intrinsic region and the low resistance regions can be formed separately at one time.

Further, excess oxygen can be easily released from the base insulating film 102, the gate insulating film 108, and the oxide insulating film 112 by heat treatment, so that the oxygen vacancy in the multilayer film 104 can be reduced. Thus, the amount of oxygen vacancy in the channel formation region of the multilayer film 104 is further reduced, so that the channel formation region is highly purified intrinsic.

Next, the band structure of the multilayer film 104 is described. A stack corresponding to the multilayer film 104 is formed, and in the stack, an In—Ga—Zn oxide having an energy gap of 3.15 eV is used as a layer corresponding to each of the oxide film 104a and the oxide film 104c and an In—Ga—Zn oxide having an energy gap of 2.8 eV is used as a layer corresponding to the oxide semiconductor film 104b. The band structure thereof is analyzed. Note that the stack is referred to as the multilayer film 104 and the layers included in the stack are referred to as the oxide film 104a, the oxide semiconductor film 104b, and the oxide film 104c, for convenience.

The thickness of each of the oxide film 104a, the oxide semiconductor film 104b, and the oxide film 104c was 10 nm. The energy gap was measured with use of a spectroscopic ellipsometer (UT-300 manufactured by HORIBA Jobin Yvon). Further, the energy gap in the vicinity of the interface between the oxide film 104a and the oxide semiconductor film 104b and the energy gap in the vicinity of the interface between the oxide film 104c and the oxide semiconductor film 104b were each 3 eV.

Figure 2A:
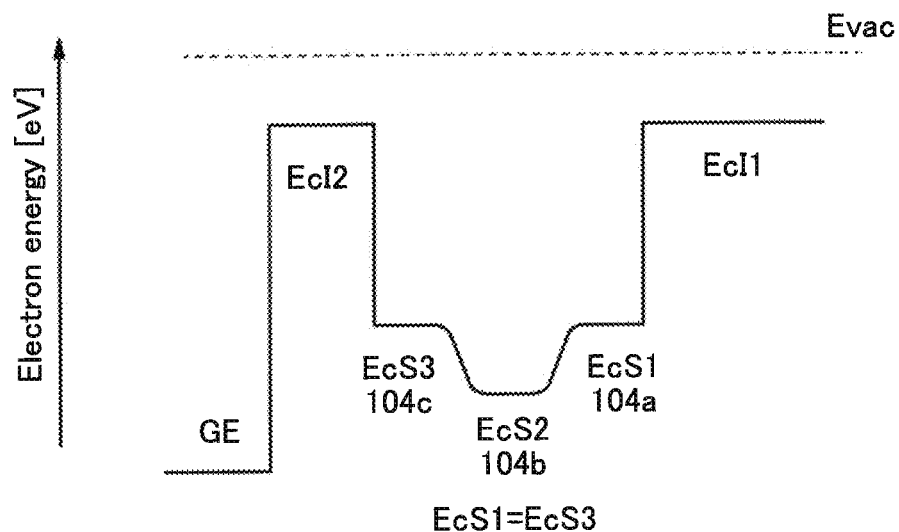
FIGS. 2A and 2B each illustrate the band structure of an oxide semiconductor film.

FIG. 2A schematically shows part of a band structure of a difference in energy (electron affinity) between the vacuum level and the bottom of the conduction band of each layer, which is calculated by subtracting the energy gap of each layer from the difference in energy between the vacuum level and the top of the valence band. With reference to FIG. 2A, a case is described in which silicon oxide films are provided in contact with the oxide film 104a and the oxide film 104c. Here, Evac represents energy of the vacuum level, EcI1 and EcI2 each represent the energy of the bottom of the conduction band in the silicon oxide film, EcS1 represents the energy of the bottom of the conduction band in the oxide film 104a, EcS2 represents the energy of the bottom of the conduction band in the oxide semiconductor film 104b, and EcS3 represents the energy of the bottom of the conduction band in the oxide film 104c. Further, in forming a transistor, a gate electrode (the gate electrode 110 in the transistor 150) is to be in contact with a silicon oxide film having EcI2.

As shown in FIG. 2A, the energies of the bottoms of the conduction band in the oxide film 104a, the oxide semiconductor film 104b, and the oxide film 104c are changed continuously. This can be understood also from the fact that the compositions of the oxide film 104a, the oxide semiconductor film 104b, and the oxide film 104c are close to each other and oxygen is easily diffused among them. Thus, the oxide film 104a, the oxide semiconductor film 104b, and the oxide film 104c have a continuous physical property although they are a stack of layers having different compositions. In the drawings in this specification, interfaces between the layers of the stack are indicated by dotted lines.

The multilayer film 104 in which layers containing the same main components are stacked is formed to have not only a simple stacked-layer structure of the layers but also a continuous energy band (here, in particular, a well structure having a U-shape in which energies of the bottoms of the conduction band are changed continuously between layers). That is, a stacked structure is formed so that impurities that cause defect levels such as a trap center and a recombination center for the oxide semiconductor or a barrier impeding carrier flow do not exist at the interfaces between the layers. If impurities are mixed between the oxide semiconductor film and the oxide film stacked, the continuity of the energy band is lost and carriers disappear by a trap or recombination.

In order to form continuous junction, the layers need to be stacked successively without being exposed to the air by using a multi-chamber deposition system (sputtering apparatus) provided with a load lock chamber. It is preferable that each chamber of the sputtering apparatus be able to be evacuated to a high vacuum (to about $1 \times 10^{-4}$ Pa to $5 \times 10^{-7}$ Pa) by an adsorption vacuum pump such as a cryopump and that the chamber be able to heat a substrate over which a film is to be deposited to 100° C. or higher so that water and the like acting as impurities of the oxide semiconductor are removed as much as possible. Alternatively, a combination of a turbo molecular pump and a cold trap is preferably used to prevent back-flow of a gas containing a carbon component, moisture, or the like from an exhaust system into a chamber.

Not only high vacuum evaporation in a chamber but also high purity of a sputtering gas is necessary to obtain a high-purity intrinsic oxide semiconductor. As an oxygen gas or an argon gas used for a sputtering gas, a gas which is highly purified to have a dew point of −80° C. or lower, preferably −100° C. or lower, further preferably −120° C. or lower is used, whereby entry of moisture or the like into the oxide semiconductor film can be prevented as much as possible.

Figure 2B:
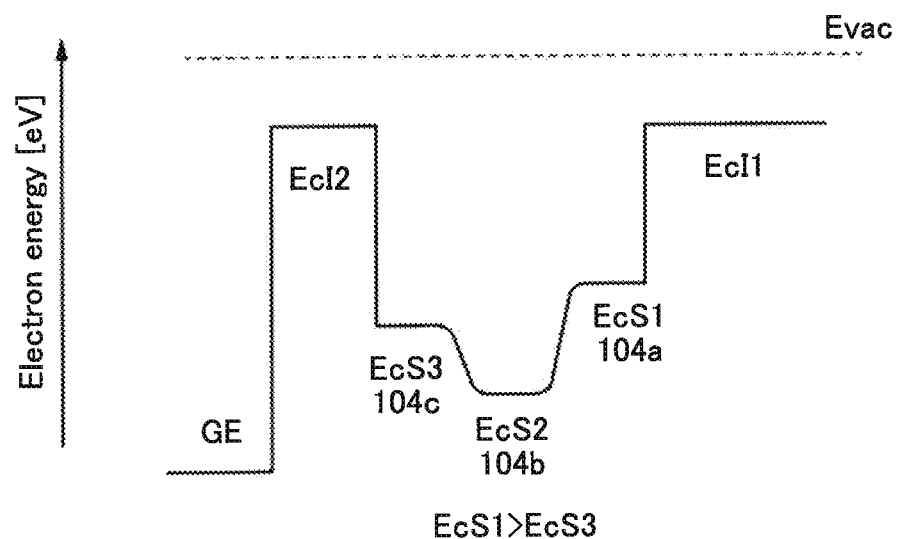

Note that FIG. 2A shows the case where EcI1 and EcI3 are similar to each other; however, EcI1 and EcI3 may be different from each other. For example, in the case where EcS1 is higher than EcS3, the structure of FIG. 2B is more favorable than the structure of FIG. 2A. This is because current flows mainly through EcS2 near EcS3 on the gate electrode side.

When the oxide film 104c and the gate electrode are provided so that a silicon oxide film is sandwiched therebetween, the silicon oxide film functions as a gate insulating film, and the oxide film 104c can prevent indium contained in the oxide semiconductor film 104b from diffusing into the gate insulating film. To prevent indium diffusion by the oxide film 104c, the indium content of the oxide film 104c is preferably lower than that of the oxide semiconductor film 104b.

For example, when EcI1 is equal to EcI3, an In—Ga—Zn oxide having an atomic ratio of In:Ga:Zn=1:3:2 can be used for the oxide film 104a and the oxide film 104c and an In—Ga—Zn oxide having an atomic ratio of In:Ga:Zn=1:1:1 can be used for the oxide semiconductor film 104b. Further, when EcI1 is higher than EcI3, an In—Ga—Zn oxide having an atomic ratio of In:Ga:Zn=1:6:4 or 1:9:6 can be used for the oxide film 104a, an In—Ga—Zn oxide having an atomic ratio of In:Ga:Zn is 1:1:1 or 3:1:2 can be used for the oxide semiconductor film 104b, and an In—Ga—Zn oxide having an atomic ratio of In:Ga:Zn=1:3:2 can be used for the oxide film 104c.

According to FIGS. 2A and 2B, the oxide semiconductor film 104b of the multilayer film 104 serves as a well and a channel of the transistor including the multilayer film 104 is formed in the oxide semiconductor film 104b. Since the energy of the bottom of the conduction band is continuously changed, the multilayer film 104 can also be referred to as a U-shaped well. Further, a channel formed to have such a structure can also be referred to as a buried channel.

Note that trap levels resulting from impurities or defects can be formed in the vicinity of the interfaces between the oxide film 104a and an insulating film such as the silicon oxide film and between the oxide film 104c and an insulating film. The oxide films 104a and 104c enables the oxide semiconductor film 104b and the trap levels to be distant from each other. However, when the energy difference between EcS1 and EcS2 and the energy difference between EcS3 and EcS2 is small, an electron in the oxide semiconductor film 104b might reach the trap level by passing over the energy difference. When the electrons are captured by the trap levels, negative fixed charges are generated, so that the threshold voltage of the transistor is shifted in the positive direction.

Thus, the energy gap between EcS1 and EcS2 and the energy gap between EcS3 and EcS2 are each preferably 0.1 eV or larger, further preferably 0.15 eV or larger, because the variation amount of the threshold voltage of the transistor is reduced and the transistor can have stable electrical characteristics.

Note that one or more of the oxide film 104a, the oxide semiconductor film 104b, and the oxide film 104c preferably contain crystal parts. For example, the oxide film 104a is amorphous, and the oxide semiconductor film 104b and the oxide film 104c are layers containing crystal parts. Since the oxide semiconductor film 104b where a channel is formed includes crystal parts, the transistor can have stable electrical characteristics.

In particular, crystal parts included in the oxide semiconductor film 104b and the oxide film 104c are preferably crystals whose c-axes are aligned in a direction substantially perpendicular to the surfaces of the oxide semiconductor film 104b and the oxide film 104c.

In the transistor having the structure in FIGS. 1A to 1C, the oxide film 104c is in contact with the source electrode 106a and the drain electrode 106b, and it is preferable that the energy gap of the oxide film 104c be not large like an insulator and the film thickness be small in order that current can be extracted efficiently. Further, in the case where an In—Ga—Zn oxide is used for the multilayer film 104, it is preferable that the oxide film 104c contain less In than the oxide semiconductor film 104b so that diffusion of In to the gate insulating film can be prevented.

Figure 3A:
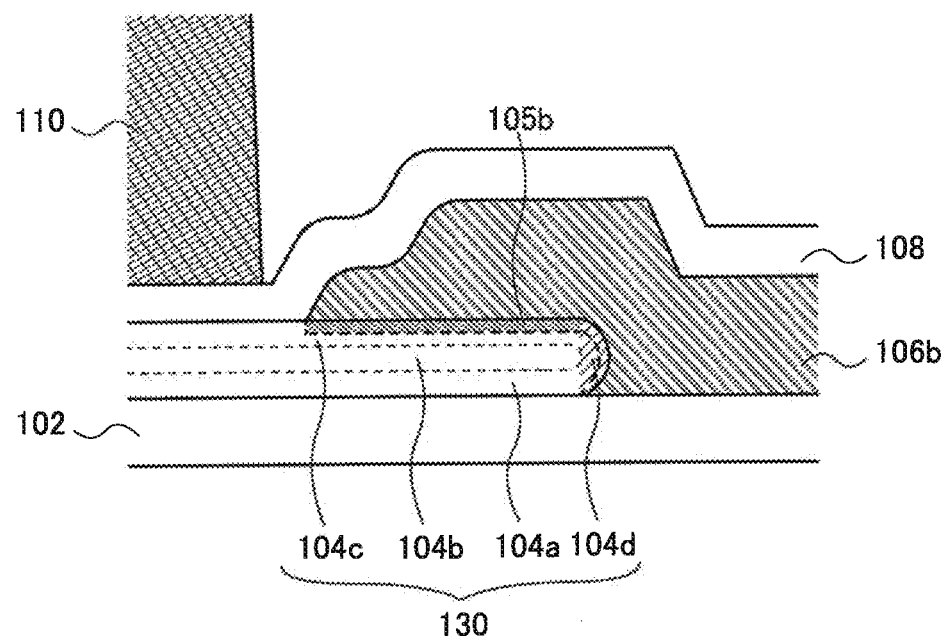
FIGS. 3A and 3B are each an enlarged cross-sectional view of a transistor.

As illustrated in a cross-sectional enlarged view of the transistor in FIG. 3A, a region 104d having a curved surface may be provided at an end portion of the multilayer film 104. In the case where the multilayer film 104 is formed using an In-M-Zn oxide (M is Al, Ti, Ga, Y, Zr, La, Ce, Nd, or Hf), the amount of M (MS4) contained in the region 104d is preferably larger than that of M (MS2) contained in the oxide semiconductor film 104b. Further preferably, the amount of MS4 is the same as that of M (MS1) contained in the oxide film 104a.

The region 104d at the end portion of the multilayer film 104 can be formed by utilizing a so-called rabbit ear, in which a composition of the oxide film 104a is reattached by a dry-etching method. Further, when the etching gas component attached at the formation of the rabbit ear is removed and the M component is oxidized by oxidation treatment, the insulating property of the region 104d can be improved.

Figure 3B:
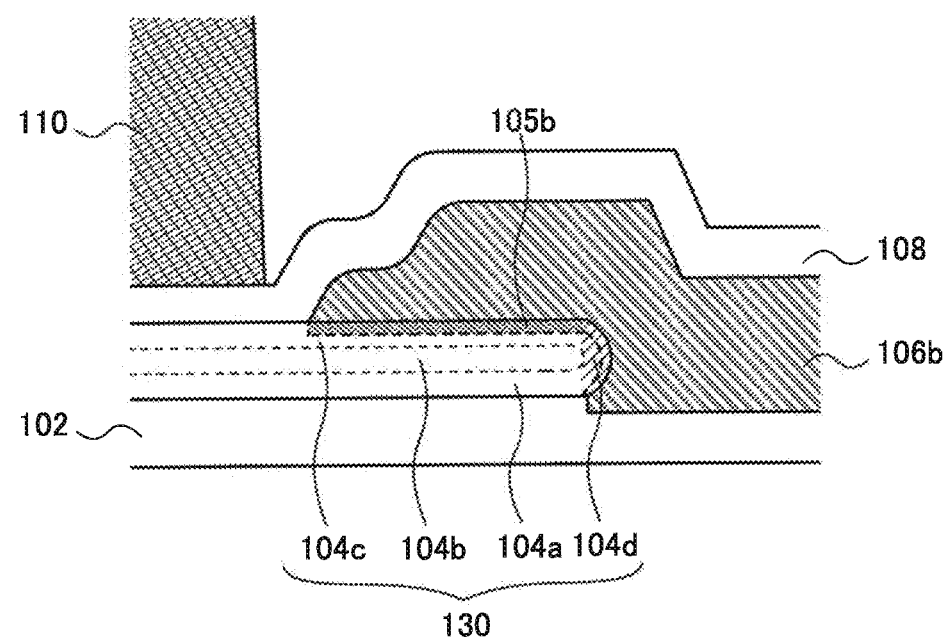

Further, as illustrated in FIG. 3B, the base insulating film 102 is partly etched when the multilayer film is subjected to dry etching. Therefore, a region of the base insulating film 102 which is in contact with the multilayer film has a larger thickness than a region of the base insulating film 102 which is not in contact with the multilayer film. With such a structure, the adhesion between the multilayer film and the source electrode or the drain electrode can be improved.

Figure 4A:
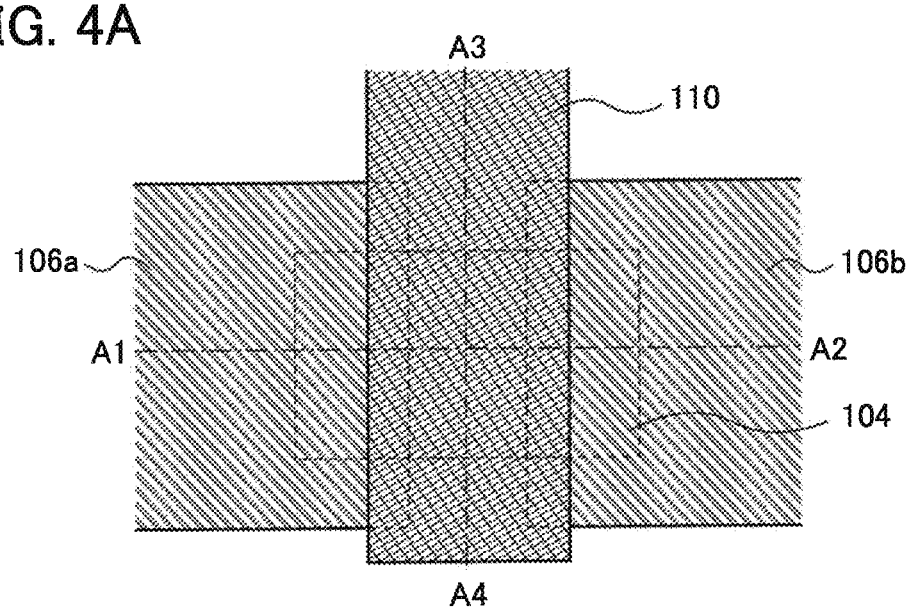
FIG. 4A is a top view and a cross-sectional view illustrating a transistor.
Figure 4A:
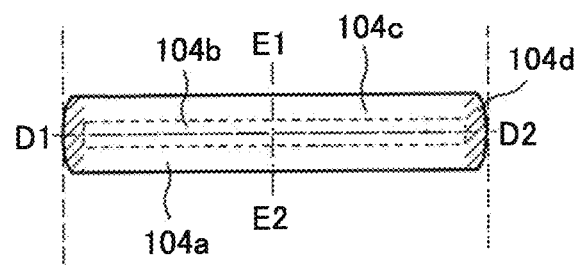

FIG. 4A is a top view of the transistor illustrated in FIGS. 1A to 1C and a cross-sectional view of the multilayer film 104. The region 104d of the multilayer film 104 overlapping with the gate electrode is likely to be changed to an n-type because impurities due to an external factor are mixed therein or oxygen vacancy is generated; thus, the region 104d acts as a parasitic channel in some cases. It is particularly noticeable that the oxide semiconductor film 104b having a small energy gap is likely to be changed to an n-type; therefore, the region 104d covering the oxide semiconductor film 104b has an effect of suppressing generation of a parasitic channel.

When the main components of the oxide film 104a are the same as those of the region 104d, the effect of suppressing generation of a parasitic channel can be more enhanced as a difference (ΔE) between energy (EcS1) of the bottom of the conduction band in the oxide film 104a and energy (EcS4) at the bottom of the conduction band in the region 104d gets larger. Further, the 104d is preferably thicker than the oxide film 104a or the oxide film 104c, and generation of a parasitic channel due to change of an end portion of the oxide semiconductor film 104b to an n-type can be suppressed as the region 104d gets thicker.

Figure 4B:
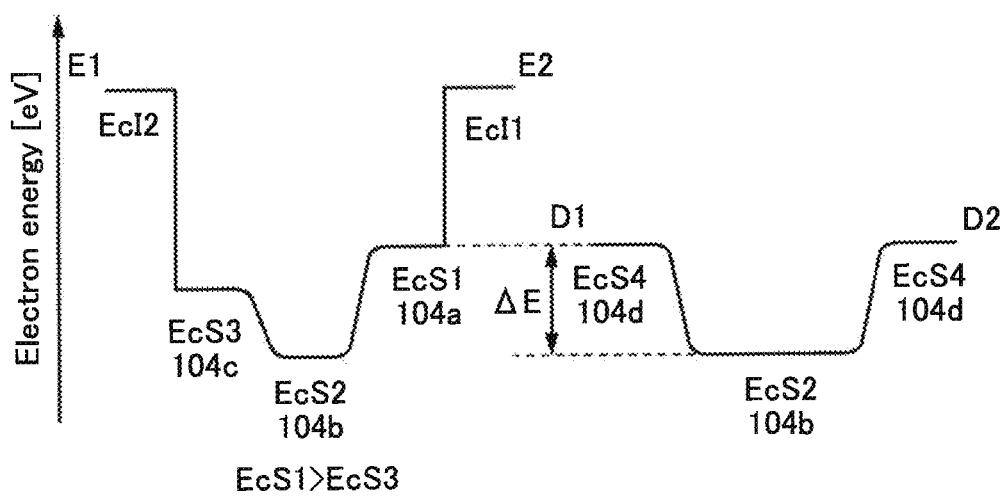
FIG. 4B illustrates the band structure of an oxide semiconductor film.

The composition of the region 104d approximates the compositions of the oxide film 104a, the oxide semiconductor film 104b, and the oxide film 104c, whereby the energy of the bottom of the conduction band continuously changes as illustrated in FIG. 4B showing part of the band structure of the multilayer film. That is, the oxide film 104a, the oxide semiconductor film 104b, the oxide film 104c, and the region 104d make a continuous junction. Note that the direction of D1-D2 and the direction of E1-E2 in FIG. 4B corresponds to the direction of a dashed-dotted line D1-D2 and the direction of a dashed-dotted line E1-E2 in the cross-sectional view of the multilayer film 104 in FIG. 4A, respectively.

The source electrode 106a and the drain electrode 106b can be formed using a conductive material which is more likely to be bonded to oxygen than a metal element contained in the oxide film and the oxide semiconductor film (hereinafter the phrase "than a metal element contained in the oxide film and the oxide semiconductor film" is omitted and the phrase "be bonded easily to oxygen" may be used without a comparison object). For example, Al, Cr, Cu, Ta, Mo, or W can be used. W (tungsten) having a high melting point is especially preferred because a relatively high process temperature can be employed in a later step. Note that the conductive material which is likely to be bonded to oxygen includes a material in which oxygen is more easily diffused than the oxide film and the oxide semiconductor film (hereinafter the phrase "than the oxide film and the oxide semiconductor film" is omitted and the phrase "oxygen is easily diffused" may be used without a comparative object). Further, a conductive material which is easily diffused into the oxide semiconductor film by heat treatment can be used. For example, Ti can be used. Alternatively, a plurality of above materials may be stacked. For example, Cu may be stacked over W; Cu may be stacked over Ti.

A contact between the conductive material which is likely to be bonded to oxygen and the multilayer film causes a phenomenon in which oxygen in the multilayer film is bonded to the conductive material.

Some heating steps are included in the manufacturing process of the transistor, and thus owing to the phenomenon, oxygen vacancy is generated in and around the region of the multilayer film which is in contact with the source electrode and the drain electrode, so that the region becomes an n-type. When a conductive material which is easily diffused into the oxide semiconductor film is used as the material of the conductive film, the conductive material is diffused into the oxide semiconductor film by some heating steps, so that the region becomes an n-type. Accordingly, the n-type regions can serve as a source or a drain region of the transistor. Therefore, contact resistance between the multilayer film and the source electrode or the drain electrode is reduced to improve conductivity. As a result, high speed operation of the transistor can be achieved.

End portions of the source electrode 106a and the drain electrode 106b in FIGS. 1A to 1C each preferably have a shape having a plurality of steps. With such a shape including a plurality of steps, coverage with a film formed over the source electrode and the drain electrode can be improved, whereby the electrical characteristics and long-term reliability of the transistor can be improved.

The gate insulating film 108 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The gate insulating film 108 may be a stack of any of the above materials.

It is preferable that the gate insulating film 108 contain aluminum oxide because gettering of hydrogen contained in the multilayer film is performed owing to the aluminum oxide so that the hydrogen in the multilayer film is reduced. Further, it is preferable that an oxide insulating film containing excess oxygen be formed over the gate insulating film 108 containing the aluminum oxide. With such a structure, the hydrogen in the multilayer film is reduced owing to the aluminum oxide and oxygen can be supplied to the multilayer film by the oxide insulating film.

Further, the gate insulating film 108 may be a stack of an oxide insulating film containing excess oxygen and a barrier film. Silicon nitride or aluminum oxide can be used for the barrier film.

It is preferable that the gate insulating film 108 contain highly pure hafnium oxide because leakage current can be reduced.

For the gate electrode 110, a conductive film of Al, Ti, Cr, Co, Ni, Cu, Y, Zr, Mo, Ru, Ag, Ta, W, or the like can be used. The gate electrode 110 may be a stack of any of the above materials.

The oxide insulating film 112 may be formed over the gate insulating film 108 and the gate electrode 110. The oxide insulating film can be formed using an insulating film containing one or more of aluminum oxide, magnesium oxide, silicon oxide, silicon oxynitride, gallium oxide, germanium oxide, yttrium oxide, zirconium oxide, lanthanum oxide, neodymium oxide, hafnium oxide, and tantalum oxide. The oxide insulating film may be a stack of any of the above materials.

Here, the oxide insulating film 112 preferably contains excess oxygen. An oxide insulating film containing excess oxygen refers to an oxide insulating film which can release oxygen by heat treatment or the like. Preferably, the amount of oxygen released from the insulating film, which is converted into oxygen atoms in thermal desorption spectroscopy, is preferably $1.0 \times 10^{19}$ atoms/cm$^3$ or higher. Oxygen released from the oxide insulating film can be diffused to a channel formation region of the oxide semiconductor film 104b of the multilayer film 104 through the gate insulating film 108, so that oxygen vacancy which is undesirably formed can be filled with the oxygen. Accordingly, stable electric characteristics of the transistor can be provided.

Further, the nitride insulating film 114 may be provided over the oxide insulating film 112. The nitride insulating film 114 can prevent oxygen in the oxide insulating film 112 from diffusing to the outside at the time of heat treatment and functions as a barrier film which prevents hydrogen or a compound containing hydrogen (e.g., water) from entering the multilayer film 104 from the outside. Accordingly, the reliability of the transistor can be improved.

Figure 5A:
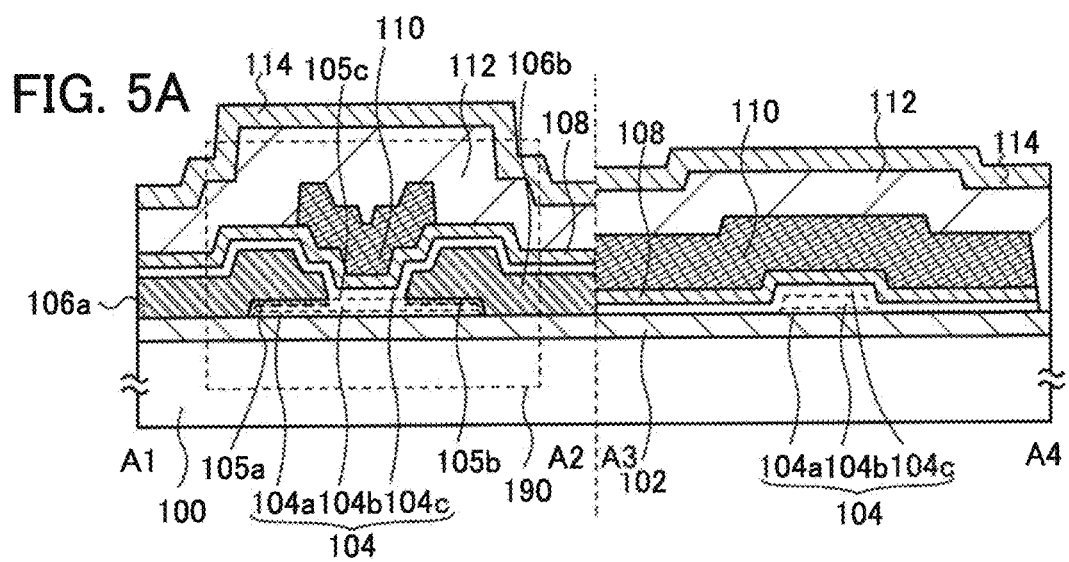
FIGS. 5A to 5C are each a cross-sectional view illustrating a transistor.

FIG. 5A illustrates another transistor structure. A transistor 190 illustrated in FIG. 5A includes: the base insulating film 102 over the substrate 100; the oxide film 104a over the base insulating film 102; the oxide semiconductor film 104b over the oxide film 104a; the source electrode 106a and the drain electrode 106b over the oxide semiconductor film 104b; the oxide film 104c over the source electrode 106a and the drain electrode 106b; the low-resistance region 105a which is formed in such a manner that oxygen is extracted from the oxide semiconductor film 104b and the oxide film 104c which are in contact with the source electrode 106a; the low-resistance region 105b which is formed in such a manner that oxygen is extracted from the oxide semiconductor film 104b and the oxide film 104c which are in contact with the drain electrode 106b; the gate insulating film 108 over the oxide film 104c, the source electrode 106a, and the drain electrode 106b; and the gate electrode 110 over the gate insulating film 108. Further, the oxide insulating film 112 may be formed over the gate insulating film 108 and the gate electrode 110. The oxide insulating film 112 may be provided as necessary, and another insulating film (e.g., the nitride insulating film 114) may be formed thereover.

The transistor 190 in FIG. 5A is the same as the transistor 150 in FIGS. 1A to 1C except that the oxide film 104c is formed over the source electrode 106a and the drain electrode 106b. Like the transistor 150, the transistor 190 includes the low-resistance region 105a and the low-resistance region 105b.

An In—Ga—Zn oxide having an atomic ratio of In:Ga:Zn=1:3:2 can be used for the oxide film 104a, an In—Ga—Zn oxide having an atomic ratio of In:Ga:Zn=1:1:1 can be used for the oxide semiconductor film 104b, and an In—Ga—Zn oxide having an atomic ratio of In:Ga:Zn=1:3:2 can be used for the oxide film 104c.

In the transistor 190, the oxide semiconductor film 104b in which the channel is formed is in contact with the source electrode 106a and the drain electrode 106b, so that oxygen vacancy is generated at a high density in the oxide semiconductor film 104b and n-type regions (the low-resistance region 105a and the low-resistance region 105b) are formed. Therefore, there is a few resistance component in a carrier path and carriers can be transported efficiently.

Further, the oxide film 104c is formed after the source electrode 106a and the drain electrode 106b are formed; therefore, overetching of the oxide film 104c does not occur at the time of forming the source electrode 106a and the drain electrode 106b. Therefore, the oxide semiconductor film 104b where the channel is formed can be sufficiently distant from the gate insulating film 108, and the effect of suppressing influence of diffusion of impurities from the interface can be enhanced.

Further, the oxide film 104c functions as a barrier film which suppresses entry of hydrogen or a compound containing hydrogen (e.g., water) from the outside to the oxide semiconductor film 104b; thus, the reliability of the transistor can be improved. Therefore, the nitride insulating film 114 is not necessarily provided.

Figure 5B:
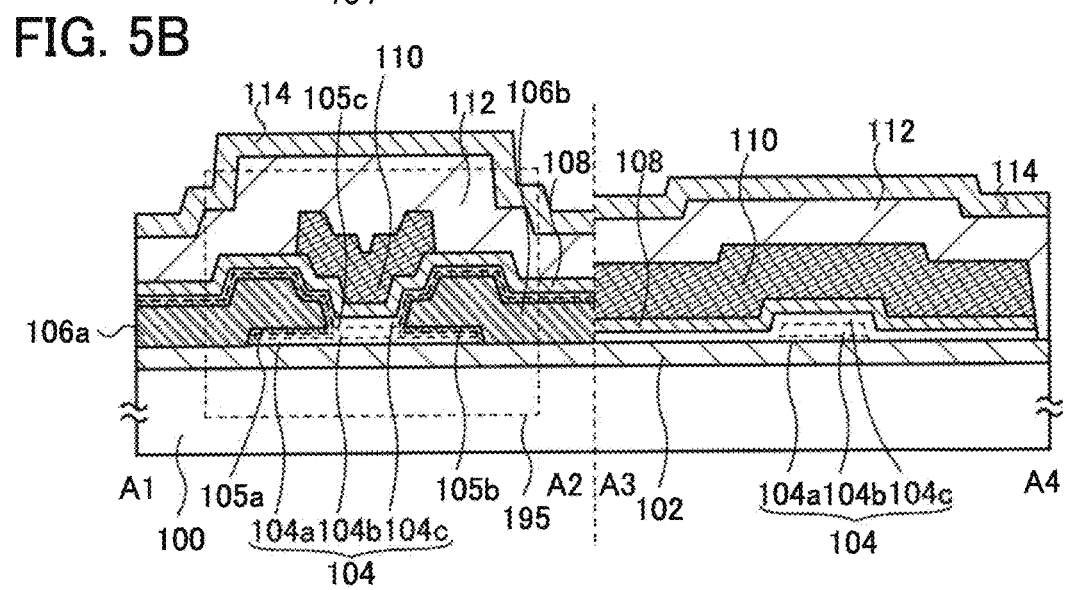

Further, when the source electrode 106a and the drain electrode 106b are formed using a conductive material which is likely to be bonded to oxygen, as in a transistor 195 illustrated in FIG. 5B, low-resistance regions are also formed in the oxide film 104c in contact with the source electrode 106a and the drain electrode 106b.

Figure 5C:
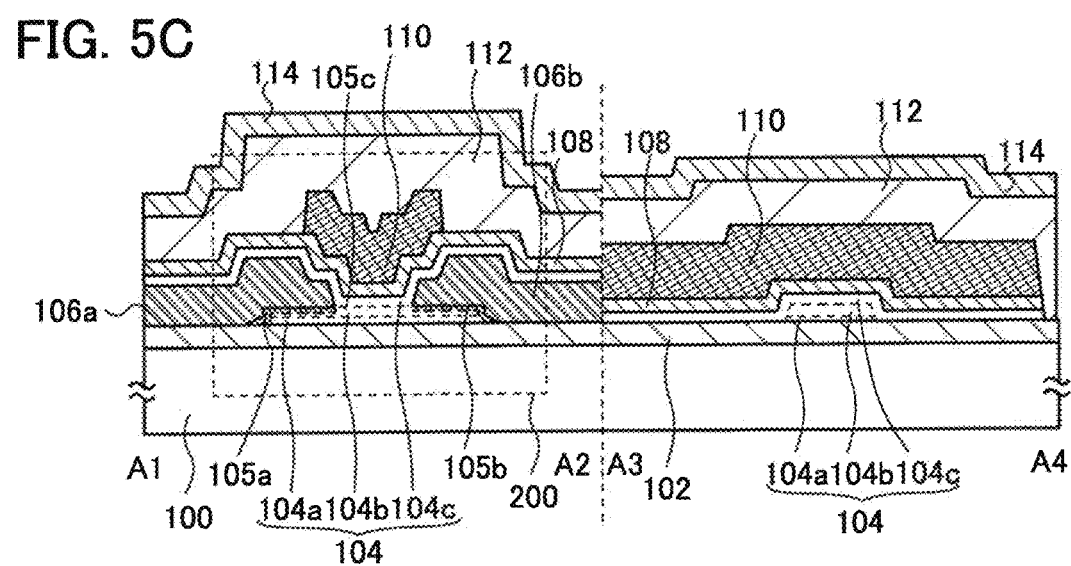

Further, as in a transistor 200 illustrated in FIG. 5C, a structure in which the end portion of the oxide film 104a and the end portion of the oxide semiconductor film 104b are not continuous may be employed. The shapes of the edge portions are formed in such a manner that a stack of the oxide film 104a and the oxide semiconductor film 104b is wet-etched using 85% phosphoric acid, an aluminum etchant (phosphoric acid (72%), nitric acid (2%), acetic acid (9%)), or the like under conditions where the etching rate of the oxide semiconductor film 104b is higher than that of the oxide film 104a.

The end portions of the oxide film 104a and the oxide semiconductor film 104b each have a taper shape. An inclination angle which is formed by the side surface and bottom surface of a layer having a taper shape (e.g., the oxide film 104a) when the layer is seen from a direction perpendicular to a cross section thereof (a plane orthogonal to the surface of the substrate) is referred to as a taper angle. A taper angle $\theta_1$ of the oxide film 104a is preferably greater than 30° and less than or equal to 70°, a taper angle $\theta_2$ of the oxide semiconductor film 104b is larger than the taper angle $\theta_1$ of the oxide film 104a and is preferably less than 90°, further preferably greater than 45° and less than 80°.

The contact area of the source electrode 106a and the drain electrode 106b can be large when the multilayer film 104 has such a tapered shape. Accordingly, the contact resistance between the multilayer film 104 and the source and drain electrodes 106a and 106b is reduced, whereby on-state current of the transistor can be increased.

Figure 6A:
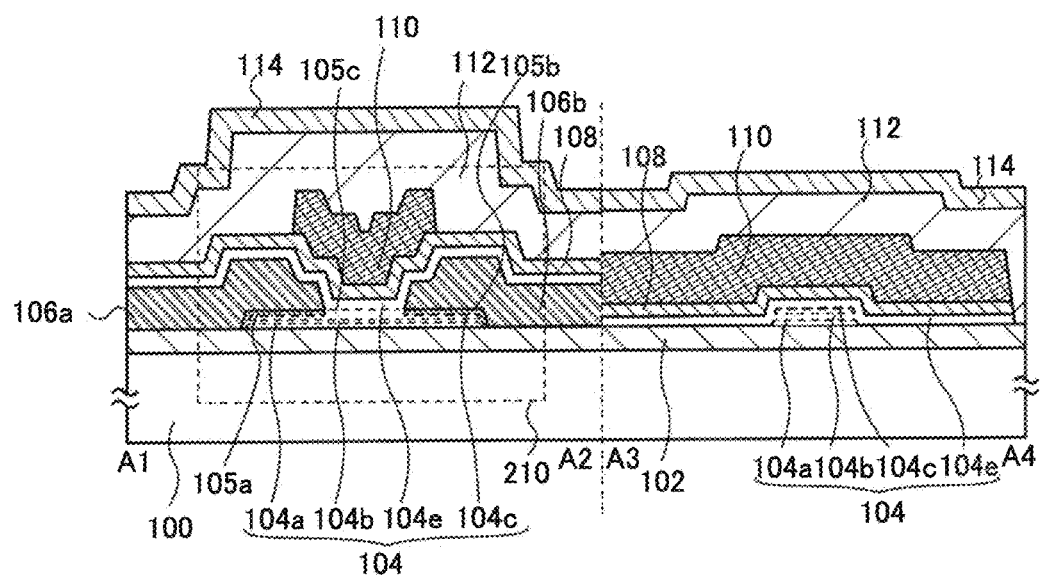
FIGS. 6A and 6B are each a cross-sectional view illustrating a transistor.

Like in a transistor 210 illustrated in FIG. 6A, after the oxide film 104a, the oxide semiconductor film 104b, and the oxide film 104c are formed in this order over the base insulating film 102, the source electrode 106a and the drain electrode 106b may be formed and then an oxide film 104e may be formed over the source electrode 106a and the drain electrode 106b. An In—Ga—Zn oxide having an atomic ratio of In:Ga:Zn=1:3:2 can be used for the oxide film 104e.

Figure 6B:
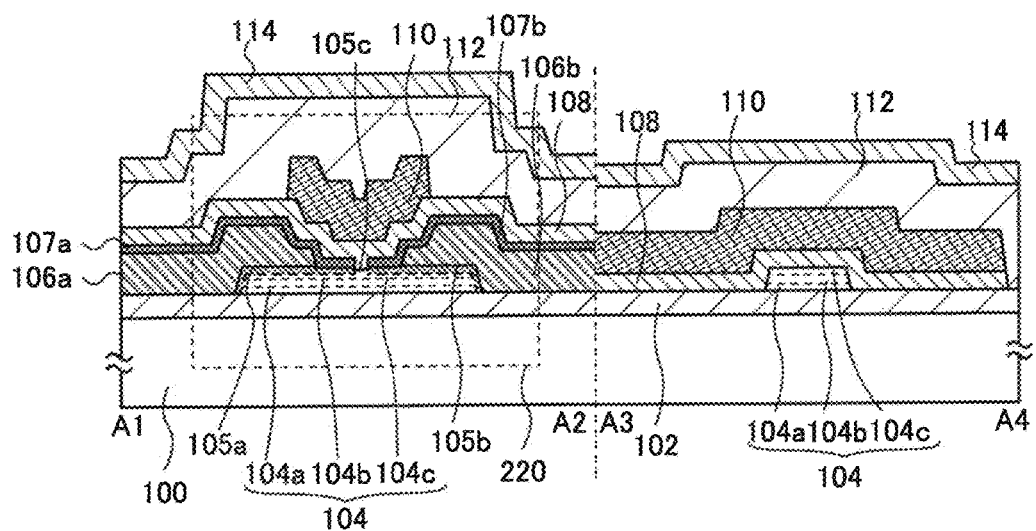

Further, FIG. 6B illustrates another transistor structure. A transistor 220 illustrated in FIG. 6B is the same as the transistor 150 in FIGS. 1A to 1C except that a conductive film 107a and a conductive film 107b are formed over the source electrode 106a and the drain electrode 106b. Like the transistor 150 described in Embodiment 1, the transistor 220 includes the low-resistance region 105a and the low-resistance region 105b.

Note that the conductive film 107a and the conductive film 107b function as part of the source electrode and part of the drain electrode. Thus, in the transistor 220 in FIG. 6B, a channel length corresponds to a distance between the conductive film 107a and the conductive film 107b.

Further, in the transistor 220 in FIG. 6B, a channel corresponds to a region of the oxide semiconductor film 104b which does not overlap with the conductive film 107a and the conductive film 107b.

Furthermore, in the transistor 220 in FIG. 6B, a channel formation region corresponds to regions of the oxide film 104a, the oxide semiconductor film 104b, and the oxide film 104c which do not overlap with the conductive film 107a and the conductive film 107b.

After the conductive film 107a and the conductive film 107b are formed, oxygen is added to the region 105c of the multilayer film 104, whereby the amount of oxygen vacancy in the channel formation region can be reduced and a highly purified intrinsic region can be formed. Accordingly, the highly purified intrinsic region and the low-resistance regions can be formed separately at one time.

When the conductive film 107a and the conductive film 107b are formed using a conductive material which is less likely to be bonded to oxygen than to a metal element included in the oxide semiconductor film, formation of oxygen vacancy in the channel formation region formed in the oxide semiconductor film can be prevented, so that change of the channel to an n-type can be prevented. Accordingly, even a transistor with an extremely short channel length can have favorable electrical characteristics.

When the source electrode and the drain electrode are formed using only the conductive material which is less likely to be bonded to oxygen, contact resistance with the multilayer film 104 becomes too high. Therefore, for example, as illustrated in FIG. 6B and the like, the conductive film 107a and the conductive film 107b are preferably formed to cover the source electrode 106a and the drain electrode 106b.

Tantalum nitride, titanium nitride, ruthenium, or an alloy material containing these substances as main components can be used for the conductive film 107a and the conductive film 107b. For example, a 20-nm-thick tantalum nitride film is formed by a sputtering method or the like.

When the conductive film 107a and the conductive film 107b are formed in such a manner that a conductive film is processed by light exposure with an electron beam, ArF immersion, or extreme ultraviolet (EUV), with the use of a resist mask with a small pattern width, the channel length can be greater than or equal to 1 nm and less than or equal to 30 nm. Here, in an electron beam writing apparatus capable of electron beam irradiation, the acceleration voltage is preferably in the range from 5 kV to 50 kV at the time of light exposure using an electron beam, for example. The current intensity is preferably in the range from $5\times10^{-12}$ A to $1\times10^{-11}$ A. The minimum beam size is preferably 2 nm or less. The minimum possible pattern line width is preferably 8 nm or less.

The channel length of the transistor is preferably equal in any part of the transistor. In the case where the shape of the channel formation region of the transistor includes a curved line, it is preferable to form the curved line by exposure to an electron beam so as to be smooth and so as to have an equal line width.

In order to form a smooth curved line with an equal line width by exposure to an electron beam, there is a method for exposure of a curved line by rotating a stage overlapping with a substrate thereon, for example. With a linearly movable stage, a resist mask can also be patterned so that the channel length of the transistor becomes equal, by using a method in which the size or direction of a figure for dividing electron beam writing regions is optimized in accordance with the pattern of the electron beam, a multi-pass writing method in which a figure is shifted by a uniform width and writing is performed with an overlap so that the amount of light exposure of a pattern becomes equal, or the like. It is preferable to use the above method or the like to form a resist mask with an equal line width so that the channel length of the transistor becomes equal.

Figure 7A:
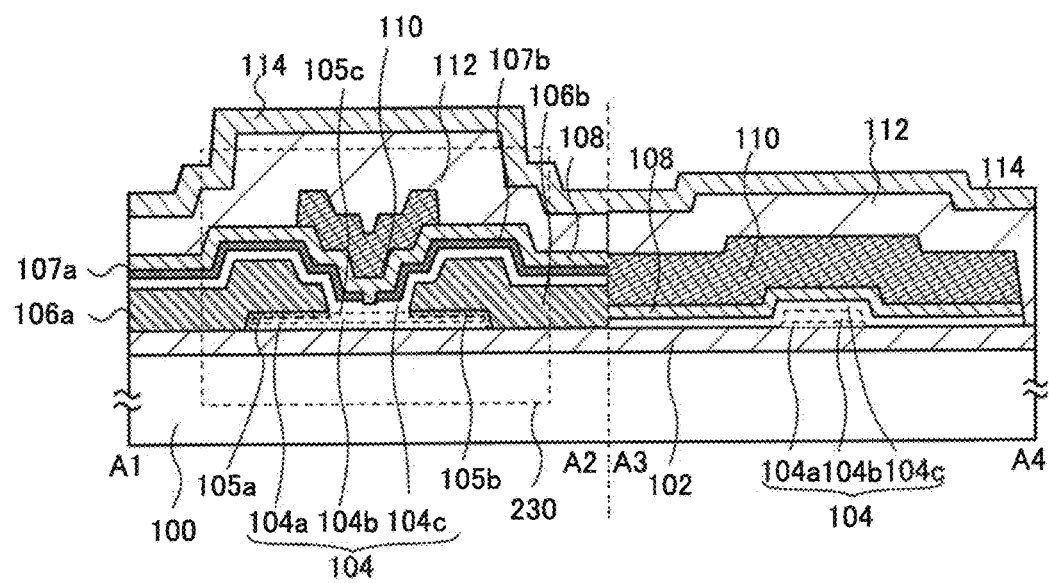
FIGS. 7A and 7B are each a cross-sectional view illustrating a transistor.

FIG. 7A illustrates another transistor structure. A transistor 230 has a structure of the transistor 190 in FIG. 5A which further includes the conductive film 107a and the conductive film 107b over the oxide film 104c.

Figure 7B:
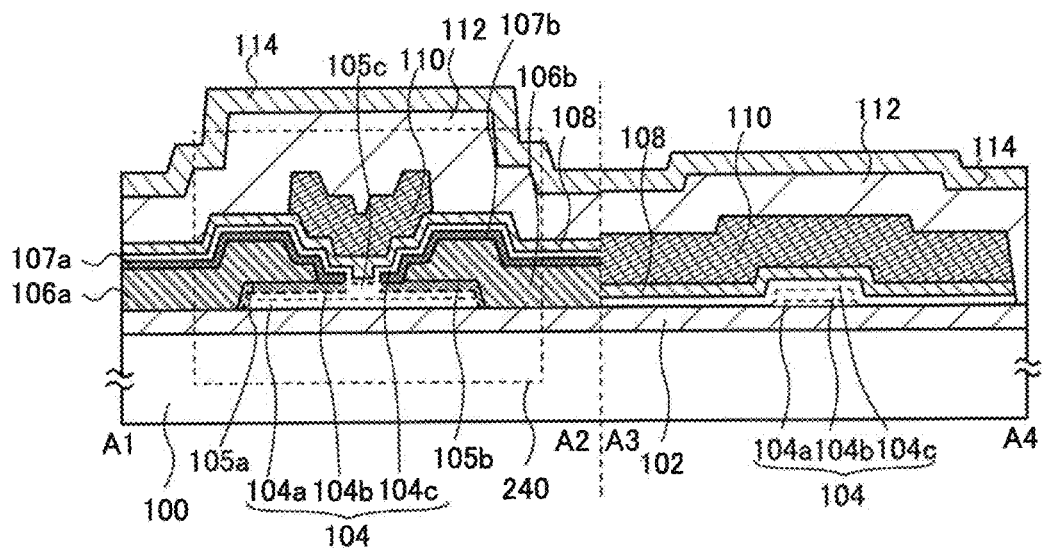

FIG. 7B illustrates another transistor structure. A transistor 240 is formed by a formation process of the transistor 230 in FIG. 7A in which the formation process of the oxide film 104c and the formation process of the conductive film 107a and the conductive film 107b are reversed.

The above is the description of the transistors of one embodiment of the present invention. The amount of oxygen vacancy in the channel formation region of the oxide semiconductor in the multilayer film in any of the transistors can be reduced and the electrical characteristics of any of the transistors are favorable; therefore, it is possible to provide a highly reliable semiconductor device.

This embodiment can be combined as appropriate with any of the other embodiments in this specification.

Embodiment 2

In this embodiment, a method for manufacturing the transistor 150 described in Embodiment 1 with reference to FIGS. 1A to 1C is described.

First, the base insulating film 102 is formed over the substrate 100.

A glass substrate, a ceramic substrate, a quartz substrate, a sapphire substrate, or the like can be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used. Still alternatively, any of these substrates further provided with a semiconductor element may be used.

The base insulating film 102 can be formed by a plasma chemical vapor deposition (CVD) method, a sputtering method, or the like using an oxide insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film of silicon nitride, silicon nitride oxide, aluminum nitride, aluminum nitride oxide, or the like; or a mixed material of any of these. Further, a stack of any of the above materials may be used, and at least an upper layer of the base insulating film 102, which is in contact with the multilayer film 104, is preferably formed using a material containing oxygen that might serve as a supply source of oxygen to the multilayer film 104.

In the case where the surface of the substrate 100 is made of an insulator and there is no influence of impurity diffusion to the multilayer film 104 to be formed later, the base insulating film 102 is not necessarily provided.

Figure 8A:
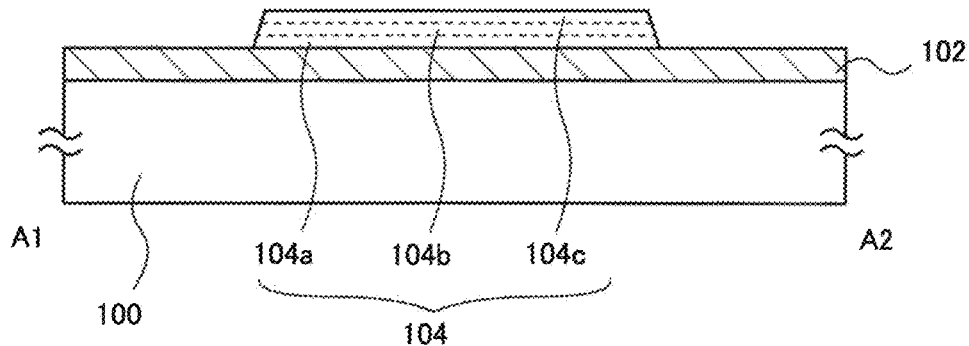
FIGS. 8A to 8C illustrate a method for manufacturing a transistor.

Next, the multilayer film 104 is formed in such a manner that the oxide film 104a, the oxide semiconductor film 104b, and the oxide film 104c are formed over the base insulating film 102 in this order from the substrate 100 side by a sputtering method, a chemical vapor deposition (CVD) method, a molecular beam epitaxy (MBE) method, an atomic layer deposition (ALD) method, or a pulsed laser deposition (PLD) method and are etched selectively (see FIG. 8A). Note that heating may be performed before the etching.

For the oxide film 104a, the oxide semiconductor film 104b, and the oxide film 104c, any of the materials described in the above embodiment can be used. For example, the oxide film 104a can be formed using an In—Ga—Zn oxide having an atomic ratio of In:Ga:Zn=1:3:2, the oxide semiconductor film 104b can be formed using an In—Ga—Zn oxide having an atomic ratio of In:Ga:Zn=1:1:1, and the oxide film 104c can be formed using an In—Ga—Zn oxide having an atomic ratio of In:Ga:Zn=1:3:2.

The multilayer film including the oxide film 104a, the oxide semiconductor film 104b, and the oxide film 104c preferably contains at least indium (In) or zinc (Zn). Alternatively, the multilayer film preferably contains both In and Zn. In order to reduce variation in electrical characteristics of the transistors including the multilayer film, the multilayer film preferably contains a stabilizer in addition to In and Zn.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide films and the oxide semiconductor film, for example, any of the following can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an AL-Ga—Zn oxide, an Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, or an In—Hf-AL-Zn oxide.

Note that, for example, an In—Ga—Zn oxide means an oxide containing In, Ga, and Zn as its main components and there is no particular limitation on the ratio of In, Ga, and Zn. The In—Ga—Zn oxide may contain a metal element other than the In, Ga, and Zn. Further, in this specification, a film formed using an In—Ga—Zn oxide is also referred to as an IGZO film.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co. Alternatively, as the oxide semiconductor, a material represented by a chemical formula, $In_2SnO_5(ZnO)_n$ (n>0, n is a natural number) may be used.

Note that as described in Embodiment 1 in detail, a material of each of the oxide film 104a and the oxide film 104c is selected so that the oxide film 104a and the oxide film 104c have higher electron affinities than that of the oxide semiconductor film 104b.

Note that the oxide films and the oxide semiconductor film are preferably formed by a sputtering method. As a sputtering method, an RF sputtering method, a DC sputtering method, an AC sputtering method, or the like can be used. In particular, a DC sputtering method is preferably used because dust generated in the deposition can be reduced and the film thickness can be uniform.

In the case where an In—Ga—Zn oxide is used for the oxide film 104a, the oxide semiconductor film 104b, and the oxide film 104c, a target which has an atomic ratio of, for example, In:Ga:Zn=1:1:1, 2:2:1, 3:1:2, 1:3:2, 1:3:4, 1:4:3, 1:5:4, 1:6:2, 1:6:6, 1:6:10, 2:1:3, 1:6:2, 1:6:4, 1:6:10, 1:9:6, 1:1:4, or 1:1:2 can be used so that the electron affinity of each of the oxide film 104a and the oxide film 104c is larger than that of the oxide semiconductor film 104b. Alternatively, a Ga—Zn oxide may be used for each of the oxide film 104a, the oxide semiconductor film 104b, and the oxide film 104c.

The indium content in the oxide semiconductor film 104b is preferably higher than those in the oxide film 104a and the oxide film 104c. In an oxide semiconductor, the s orbital of heavy metal mainly contributes to carrier transfer, and when the proportion of In in the oxide semiconductor is increased, overlap of the s orbitals is likely to be increased. Therefore, an oxide having a composition in which the proportion of In is higher than that of Ga has higher mobility than an oxide having a composition in which the proportion of In is equal to or lower than that of Ga. Thus, with use of an oxide having a high indium content for the oxide semiconductor film 104b, a transistor having high mobility can be achieved.

A structure of an oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of crystal parts each fit inside a cube whose one side is less than 100 nm. Thus, there is a case where a crystal part included in the CAAC-OS film fits a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when $2\theta$ is around 56°. This peak is derived from the (110) plane of the $InGaZnO_4$ crystal. Here, analysis ($\phi$ scan) is performed under conditions where the sample is rotated around a normal vector of a sample surface as an axis ($\phi$ axis) with $2\theta$ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when $\phi$ scan is performed with $2\theta$ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases.

Further, when an impurity is added to the CAAC-OS film, the crystallinity in a region to which the impurity is added is changed, and the degree of crystallinity in the CAAC-OS film varies depends on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

With the use of the CAAC-OS film in a transistor, change in electric characteristics of the transistor due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.

A CAAC-OS film can be deposited by a sputtering method using a polycrystalline oxide semiconductor sputtering target, for example. When ions collide with the sputtering target, a crystal region included in the sputtering target might be separated from the target along an a-b plane; in other words, a sputtered particle having a plane parallel to an a-b plane (flat-plate-like sputtered particle or pellet-like sputtered particle) might be separated from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, impurities (e.g., hydrogen, water, carbon dioxide, or nitrogen) which exist in the deposition chamber may be reduced. Furthermore, impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made by mixing InO$_X$ powder, GaO$_Y$ powder, and ZnO$_Z$ powder in a predetermined molar ratio, applying pressure, and performing heat treatment at a temperature higher than or equal to 1000° C. and lower than or equal to 1500° C. Note that X, Y, and Z are each a given positive number. The kinds of powder and the molar ratio for mixing powder may be determined as appropriate depending on the desired sputtering target.

Here, Table 1 shows comparison between oxide semiconductors (represented by OS) having crystal structures and silicon semiconductors (represented by Si) having crystal structures.

TABLE 1

|  |  | amorphous | microcrystal | polycrystal | continuous crystal | single crystal |
|---|---|---|---|---|---|---|
| OS |  | a-OS<br>a-OS:H | nc-OS<br>μc-OS | polycrystalline OS | CAAC-OS | single crystal OS |
|  | nanobeam electron diffraction | halo | spot and/or ring | spot | spot | spot |
|  | crystal part | — | nm~μm | discontinuous | continuous | — |
|  | DOS | high | relatively low | — | low | extremely low |
|  | density | low | middle | — | high | — |
| Si |  | a-Si<br>a-Si:H | nc-Si<br>μc-Si | polycrystalline Si | continuous grain silicon | single crystal Si |

As shown in Table 1, examples of crystal states of oxide semiconductors include an amorphous oxide semiconductor (a-OS and a-OS:H), a microcrystalline oxide semiconductor (nc-OS and μc-OS), a polycrystalline oxide semiconductor (polycrystalline OS), a continuous crystal oxide semiconductor (CAAC-OS), and a single crystal oxide semiconductor (single crystal OS). Note that examples of the crystal state of silicon include, as shown in Table 1, amorphous silicon (a-Si and a-Si:H), microcrystalline silicon (nc-Si and μc-Si), polycrystalline silicon (polycrystalline Si), continuous crystal silicon (continuous grain (CG) silicon), and single crystal silicon (single crystal Si).

When the oxide semiconductors in the above crystal states are subjected to electron diffraction (nanobeam electron diffraction) using an electron beam whose diameter is reduced to less than or equal to 10 nmϕ, the following electron diffraction patterns (nanobeam electron diffraction patterns) can be observed. A halo pattern (also referred to as a halo ring or a halo) is observed in the amorphous oxide semiconductor. Spots and/or a ring pattern are/is observed in the microcrystalline oxide semiconductor. Spots are observed in the polycrystalline oxide semiconductor. Spots are observed in the continuous crystal oxide semiconductor. Spots are observed in the single crystal oxide semiconductor.

According to the nanobeam electron diffraction pattern, a crystal part in the microcrystalline oxide semiconductor has a diameter of nanometer order (nm) to micrometer order (µm). The polycrystalline oxide semiconductor has discontinuous grain boundaries between crystal parts. No boundary is observed between crystal parts in the continuous crystal oxide semiconductor and the crystal parts are connected continuously.

The density of the oxide semiconductor in each crystal state is described. The amorphous oxide semiconductor has a low density. The microcrystalline oxide semiconductor has a medium density. The continuous crystal oxide semiconductor has a high density. That is, the density of the continuous crystal oxide semiconductor is higher than that of the microcrystalline oxide semiconductor, and the density of the microcrystalline oxide semiconductor is higher than that of the amorphous oxide semiconductor.

A feature of density of states (DOS) existing in the oxide semiconductor in each crystal state is described. The DOS of the amorphous oxide semiconductor is high. The DOS of the microcrystalline oxide semiconductor is relatively low. The DOS of the continuous crystal oxide semiconductor is low. The DOS of the single crystal oxide semiconductor is extremely low. That is, the DOS of the single crystal oxide semiconductor is lower than that of the continuous crystal oxide semiconductor, the DOS of the continuous crystal oxide semiconductor is lower than that of the microcrystalline oxide semiconductor, and the DOS of the microcrystalline oxide semiconductor is lower than that of the amorphous oxide semiconductor.

Next, first heat treatment is preferably performed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more in order to compensate desorbed oxygen. The first heat treatment can increase the crystallinity of the oxide semiconductor film 104b and remove impurities such as water and hydrogen from the base insulating film 102, the oxide film 104a, and the oxide film 104c. Note that the first heat treatment may be performed before the etching for forming the multilayer film 104.

Figure 8B:
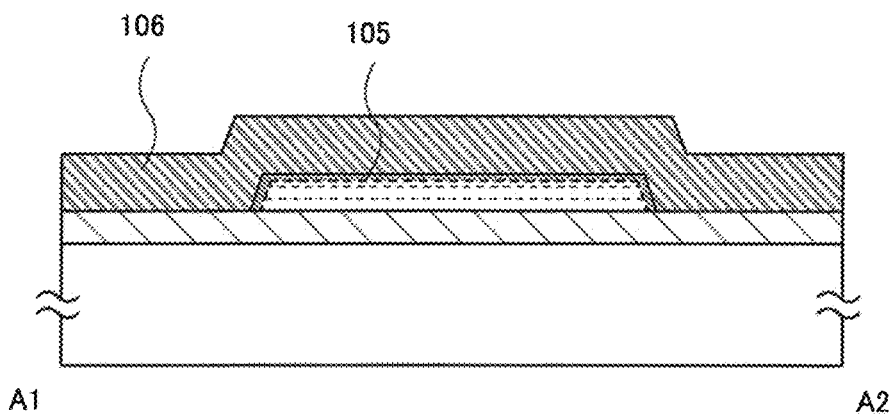

Next, a conductive film 106 to be the source electrode and the drain electrode is formed over the multilayer film 104. In this embodiment, a conductive material which is more likely to be bonded to oxygen than to a metal element contained in the oxide semiconductor film is used as a material of the conductive film 106. Since the material of the conductive film 106 is the conductive material which is likely to be bonded to oxygen, oxygen in the multilayer film 104 is bonded to the conductive material (the conductive film 106). The bonding causes oxygen vacancy in the multilayer film 104 in the vicinity of the interface with the conductive film 106. Further, damage (oxygen vacancy) to the top surface of the multilayer film 104 is caused when the conductive film 106 is formed over the multilayer film 104. By the oxygen vacancy, a low-resistance region 105 is formed in a self-aligned manner (see FIG. 8B). In this embodiment, the low-resistance region 105 exists in a region at a depth of greater than 0 nm and less than or equal to 15 nm, preferably less than 10 nm, further preferably less than 3 nm from the interface between the multilayer film 104 including the oxide semiconductor film and the conductive film 106 in the depth direction of the multilayer film 104.

Although the boundary between the low-resistance region 105 and the multilayer film 104 exists in the oxide film 104c in this embodiment, this embodiment is not limited thereto; the boundary may exist in the oxide film 104a, in the oxide semiconductor film 104b, at the interface between the oxide film 104a and the oxide semiconductor film 104b, or at the interface between the oxide semiconductor film 104b and the oxide film 104c.

For the conductive film 106, Al, Cr, Cu, Ta, Ti, Mo, W, or an alloy material containing any of these as a main component can be used. For example, a 100-nm-thick tungsten film is formed by a sputtering method or the like.

When the low-resistance region 105 is formed, contact resistance between the source electrode or the drain electrode to be formed later and the multilayer film 104 can be reduced, so that high speed operation of the transistor 150 can be achieved.

Figure 8C:
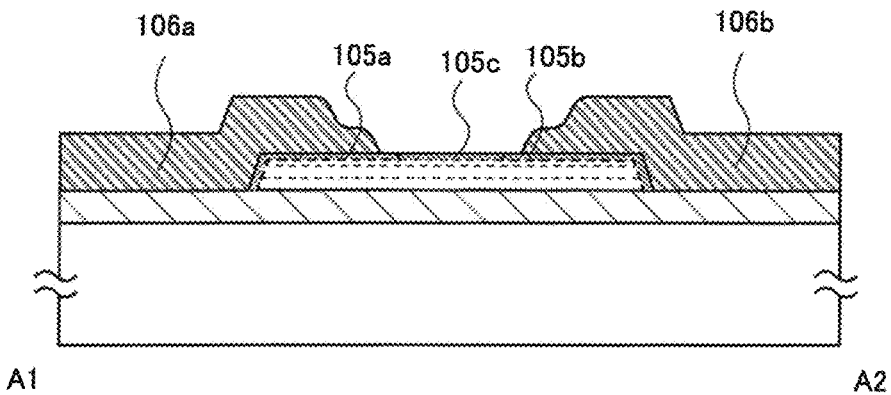

Next, the conductive film 106 is etched so as to be separated over the multilayer film 104, so that the source electrode 106a and the drain electrode 106b are formed (see FIG. 8C). The edge portions of the source electrode 106a and the drain electrode 106b are formed to have a step as shown in the drawings. The end portions can be formed in such a manner that a step of making a resist mask recede by ashing and an etching step are alternately performed plural times.

Note that the low-resistance region 105a and the low-resistance region 105b exist below the source electrode 106a and the drain electrode 106b, respectively, and an oxide semiconductor film between the low-resistance region 105a and the low-resistance region 105b corresponds to the region 105c.

Further, the step of making the resist mask recede by ashing and the etching step are alternately performed, whereby the edge portions of the source electrode 106a and the drain electrode 106b are provided over the low-resistance region 105a and the low-resistance region 105b.

Therefore, the channel formation region of the transistor 150 corresponds to the region 105c, a region of the low-resistance region 105a which is not in contact with the source electrode 106a, and a region of the low-resistance region 105b which is not in contact with the drain electrode 106b. The channel formation region of the transistor 150 is an n-type region; therefore, it is necessary to reduce the impurity concentration of the multilayer film 104 so that the channel formation region is highly purified to be intrinsic.

Note that at the time of etching the conductive film 106 to be separated over the multilayer film 104, part of the oxide film 104c might be etched and the thickness of the multilayer film in the channel formation region might be reduced.

Figure 9A:
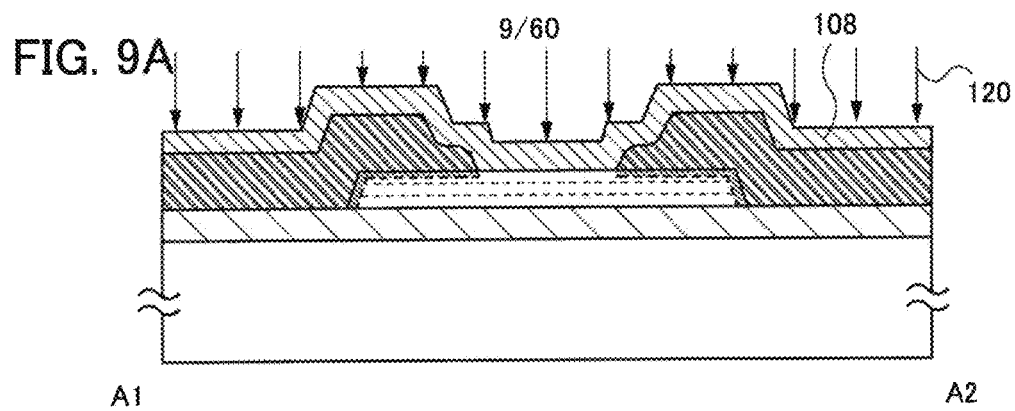
FIGS. 9A to 9C illustrate a method for manufacturing a transistor.

Next, the gate insulating film 108 is formed over the multilayer film 104, the source electrode 106a, and the drain electrode 106b. After that, oxygen 120 is added to the region 105c of the multilayer film 104 (see FIG. 9A).

The gate insulating film 108 can be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like. The gate insulating film 108 may be a stack of any of the above materials. The gate insulating film 108 can be formed by a sputtering method, a CVD method, an MOCVD method, an MBE method, an ALD method, a PLD method, or the like.

It is preferable that the gate insulating film 108 contain aluminum oxide because gettering of hydrogen contained in the multilayer film is performed owing to the aluminum oxide so that the hydrogen in the multilayer film is reduced. Further, it is preferable that an oxide insulating film containing excess oxygen be formed over the aluminum oxide. With such a structure, the hydrogen in the multilayer film is reduced owing to the aluminum oxide and oxygen can be supplied to the multilayer film by the oxide insulating film.

Further, the gate insulating film 108 may be a stack of an oxide insulating film containing excess oxygen and a barrier film. Silicon nitride or aluminum oxide can be used for the barrier film.

It is preferable that the gate insulating film 108 contain highly pure hafnium oxide because leakage current can be reduced.

Oxygen can be added to the region 105c of the multilayer film 104 by an ion doping method or an ion implantation method. Alternatively, as a method for adding oxygen, a plasma immersion ion implantation method may be used. By a plasma immersion ion implantation method, oxygen can be added efficiently even when the region 105c has an uneven shape. Alternatively, oxygen can be added by a method other than an ion doping method, an ion implantation method, or the like. For example, oxygen can be added in such a manner that plasma is generated in an oxygen atmosphere and then the region 105c is subjected to plasma treatment in the oxygen atmosphere. As an apparatus for generating plasma, a dry etching apparatus, a plasma CVD apparatus, a high-density plasma CVD apparatus, or the like can be used.

The oxygen 120 added to the region 105c is one or more of an oxygen radial, an oxygen atom, and an oxygen ion. Further, the oxygen 120 may be added to at least part of the region 105c, typically any of a surface of the region 105c, the region 105c, and the interface between the region 105c and the oxide film 104c.

In the case where oxygen is added to the region 105c by an ion doping method or an ion implantation method, the amount of oxygen added to the region 105c is larger than or equal to $5 \times 10^{19}/cm^3$ and smaller than or equal to $5 \times 10^{21}/cm^3$. In this case, when the oxygen 120 has high energy, the region 105c is damaged and physical defects are caused. Therefore, the oxygen 120 preferably has such energy which does not cause damage on the multilayer film. The region 105c includes a region in which an oxygen content increases from the surface toward the depth direction of the oxide semiconductor film.

The whole low-resistance region 105a does not necessarily overlap with the source electrode and may include a region which extends to the region 105c side and does not overlap with the source electrode. Further, the whole low-resistance region 105b does not necessarily overlap with the drain electrode and may include a region which extends to the region 105c side and does not overlap with the drain electrode. The low-resistance region 105a and the low-resistance region 105b do not necessarily have uniform thickness. For example, the end portion of the low-resistance region 105a which does not overlap with the source electrode may gently spread from the bottom surface toward the surface of the low-resistance region 105a. In a similar manner, for example, the end portion of the low-resistance region 105b which does not overlap with the drain electrode may gently spread from the bottom surface toward the surface of the low-resistance region 105b. A difference between the length between the source electrode 106a and the drain electrode 106b and the length between the low-resistance region 105a and the low-resistance region 105b is less than 30%, preferably less than 10%, further preferably less than 3% of the length between the source electrode 106a and the drain electrode 106b.

In the above structure, the region 105c has higher resistance than the low-resistance region and functions as the channel formation region. Further, the amount of oxygen vacancy in the region 105c can be reduced, a highly purified intrinsic region can be formed. Accordingly, the highly purified intrinsic region and the low-resistance regions can be formed separately at one time. Note that the hydrogen concentration of the region 105c functioning as the channel formation region is lower than or equal to $5 \times 10^{17}$ atoms/cm$^3$, preferably lower than or equal to $1 \times 10^{17}$ atoms/cm$^3$.

Although the oxygen 120 is added to the region 105c of the multilayer film 104 after the gate insulating film 108 is formed in this embodiment, this embodiment is not limited thereto; the oxygen 120 may be added after the source electrode 106a and the drain electrode 106b are formed, and then the gate insulating film 108 may be formed.

Next, second heat treatment is preferably performed. The second heat treatment can be performed in a similar condition to the first heat treatment. By the second heat treatment, impurities such as hydrogen and water can be further removed from the multilayer film 104.

Figure 9B:
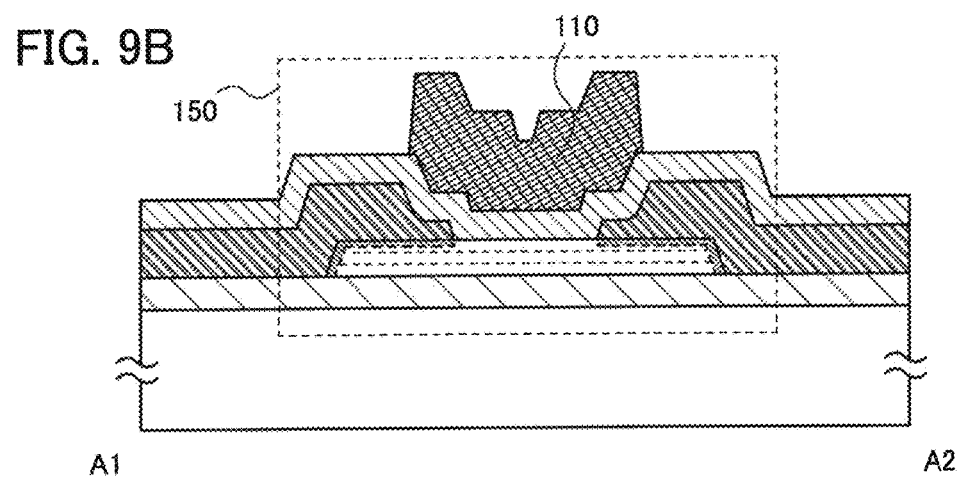

Next, the gate electrode 110 is formed over the gate insulating film 108 (see FIG. 9B).

For the gate electrode 110, Al, Ti, Cr, Co, Ni, Cu, Y, Zr, Mo, Ru, Ag, Ta, W, or an alloy material containing any of these as a main component can be used. The gate electrode 110 can be formed by a sputtering method or the like.

Through the above process, the transistor 150 illustrated in FIGS. 1A to 1C can be manufactured.

Figure 9C:
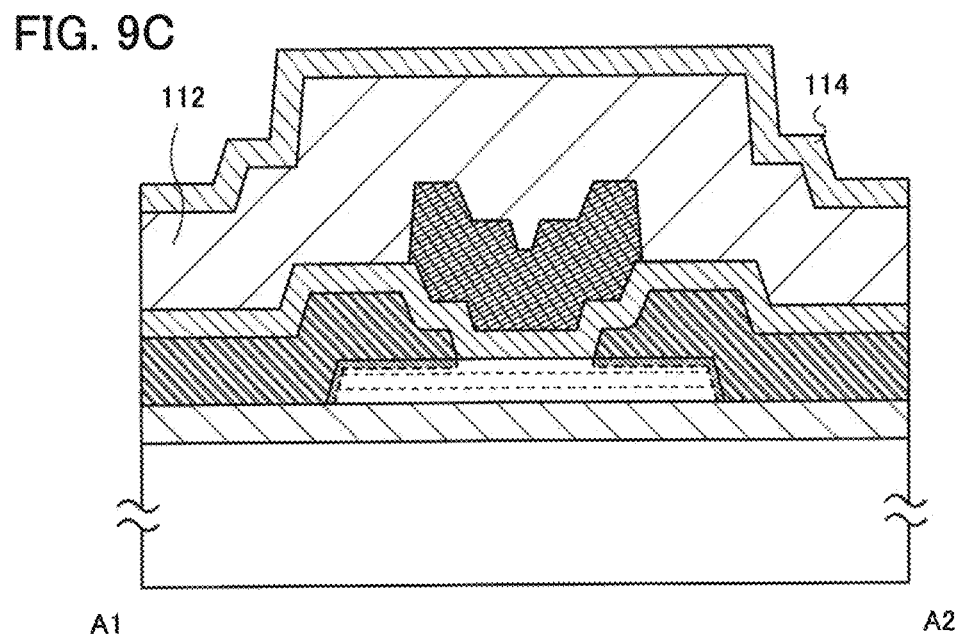

The oxide insulating film 112 may be formed over the gate insulating film 108 and the gate electrode 110 (see FIG. 9C).

The oxide insulating film 112 can be formed using a material and a method which are similar to those of the base insulating film 102. The oxide insulating film 112 may be formed using aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or an oxide insulating film containing nitrogen. The oxide insulating film 112 can be formed by a sputtering method, a CVD method, an MBE method, an ALD method, or a PLD method, and is preferably formed to contain excess oxygen so as to be able to supply oxygen to the multilayer film 104 (the oxide semiconductor film 104b).

The oxide insulating film 112 is preferably a stack of a first oxide insulating film and a second oxide insulating film. As the first oxide insulating film, a first silicon oxide film is deposited. The first silicon oxide film is preferably formed by a plasma CVD method which is one type of CVD method. Specifically, the first silicon oxide film may be formed by supplying high-frequency power to an electrode under the following conditions: the substrate temperature is higher than or equal to 180° C. and lower than or equal to 400° C., preferably higher than or equal to 200° C. and lower than or equal to 370° C., a deposition gas containing silicon and an oxidizing gas are used, and the pressure is higher than or equal to 20 Pa and lower than or equal to 250 Pa, preferably higher than or equal to 40 Pa and lower than or equal to 200 Pa. Note that typical examples of the deposition gas containing silicon include silane, disilane, trisilane, and silane fluoride. Examples of the oxidization gas include oxygen, ozone, nitrous oxide, and nitrogen dioxide.

By setting the flow rate of the oxidation gas to 100 times or more the flow rate of the deposition gas containing silicon, the hydrogen content in the first silicon oxide film can be reduced and dangling bonds can be reduced.

Next, a second silicon oxide film is deposited as the second oxide insulating film. The second silicon oxide film is preferably formed by a plasma CVD method. Specifically, the second silicon oxide film may be formed by supplying high-frequency power higher than or equal to $0.17$ $W/cm^2$ and lower than or equal to $0.5$ $W/cm^2$, preferably higher than or equal to $0.25$ $W/cm^2$ and lower than or equal to $0.35$ $W/cm^2$, to an electrode under the following conditions: the substrate temperature is higher than or equal to 160° C. and lower than or equal to 350° C., preferably higher than or equal to 180° C. and lower than or equal to 260° C., a deposition gas containing silicon and an oxidizing gas are used, and the pressure is higher than or equal to 100 Pa and lower than or equal to 250 Pa, preferably higher than or equal to 100 Pa and lower than or equal to 200 Pa.

By the above-described method, the decomposition efficiency of the gas in plasma is enhanced, oxygen radicals are increased, and oxidation of the gas is promoted; thus, the silicon oxide film containing excess oxygen can be formed as the second silicon oxide film.

Oxygen may be added to the oxide insulating film 112 by an ion implantation method, an ion doping method, a plasma immersion ion implantation method, or the like. By addition of oxygen, the oxide insulating film 112 can supply oxygen much easily to the multilayer film 104.

Further, the nitride insulating film 114 may be provided over the oxide insulating film 112. The nitride insulating film 114 can prevent oxygen in the oxide insulating film 112 from diffusing to the outside at the time of heat treatment and functions as a barrier film which prevents hydrogen or a compound containing hydrogen (e.g., water) from entering the oxide semiconductor film 104b from the outside. Accordingly, the reliability of the transistor can be improved.

The nitride insulating film is preferably a stack of a first nitride insulating film and a second nitride insulating film. A silicon nitride film is deposited as the first nitride insulating film. The first silicon nitride film is preferably formed by a plasma CVD method. Specifically, the first silicon nitride film may be formed by supplying high-frequency power under the following conditions: the substrate temperature is higher than or equal to 180° C. and lower than or equal to 400° C., preferably higher than or equal to 200° C. and lower than or equal to 370° C., a deposition gas containing silicon, a nitrogen gas, and an ammonia gas are used, and the pressure is higher than or equal to 20 Pa and lower than or equal to 250 Pa, preferably higher than or equal to 40 Pa and lower than or equal to 200 Pa.

Note that the flow rate of the nitrogen gas is set to 5 times or more and 50 times or less, preferably 10 times or more and 50 times or less the flow rate of the ammonia gas. The use of ammonia gas can promote decomposition of the deposition gas containing silicon and the nitrogen gas. This is because the ammonia gas is dissociated by plasma energy or heat energy, and energy generated by the dissociation contributes to decomposition of a bond of the deposition gas containing silicon and a bond of the nitrogen gas.

Next, a second silicon nitride film is deposited as the second nitride insulating film. The second silicon nitride film is preferably deposited by a sputtering method. Specifically, the second silicon nitride film may be formed under conditions where the substrate temperature is higher than or equal to 300° C. and lower than or equal to 400° C., a silicon target is used as a sputtering target, an argon gas and a nitrogen gas are used, the pressure in a reaction chamber is less than or equal to 0.5 Pa, preferably greater than or equal to 0.1 Pa and less than or equal to 0.3 Pa, and a high frequency power is supplied.

Through the above method, a silicon nitride film from which the hydrogen gas and the ammonia gas are less likely to be released and which can be applied to the nitride insulating film can be formed. The silicon nitride film has low hydrogen content, and thus is dense and does not transmit or hardly transmit hydrogen, water, and oxygen.

Next, third heat treatment is preferably performed. The third heat treatment can be performed under a condition similar to that of the first heat treatment. In the case where the base insulating film 102 and the oxide insulating film 112 contain excess oxygen, the excess oxygen is easily released from the base insulating film 102 and the oxide insulating film 112 by the third heat treatment, so that oxygen vacancy in the multilayer film 104 can be reduced. Accordingly, the amount of oxygen vacancy in the channel formation region of the multilayer film 104 can be further reduced, so that the channel formation region becomes highly purified intrinsic.

Further, although the treatment for adding the oxygen 120 to the region 105c of the multilayer film 104 is performed just after the source electrode 106a and the drain electrode 106b are formed in this embodiment, this embodiment is not limited thereto; the treatment may be performed after the gate insulating film 108 is formed, whereby oxygen may be supplied from the gate insulating film 108 to the region 105c of the multilayer film 104.

This embodiment can be combined as appropriate with any of the other embodiments in this specification.

Embodiment 3

In this embodiment, a transistor having a structure different from that of the transistor described in Embodiment 1 is described.

Figure 10A:
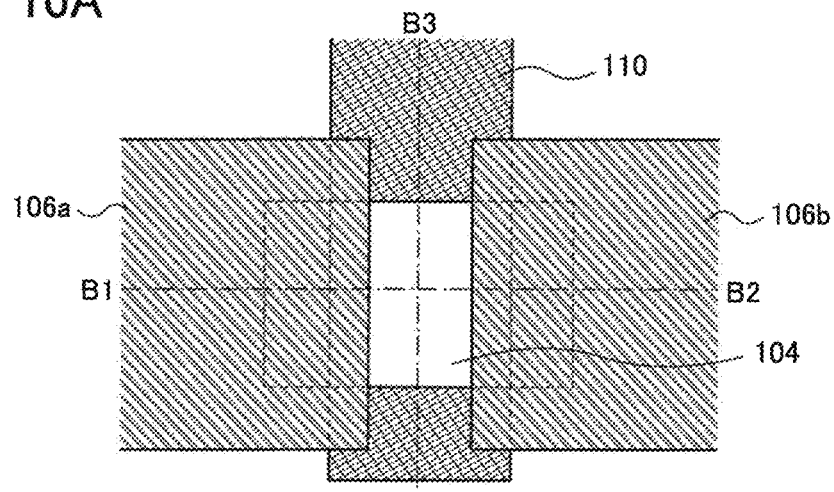
FIGS. 10A to 10C are a top view and cross-sectional views illustrating a transistor.
Figure 10B:
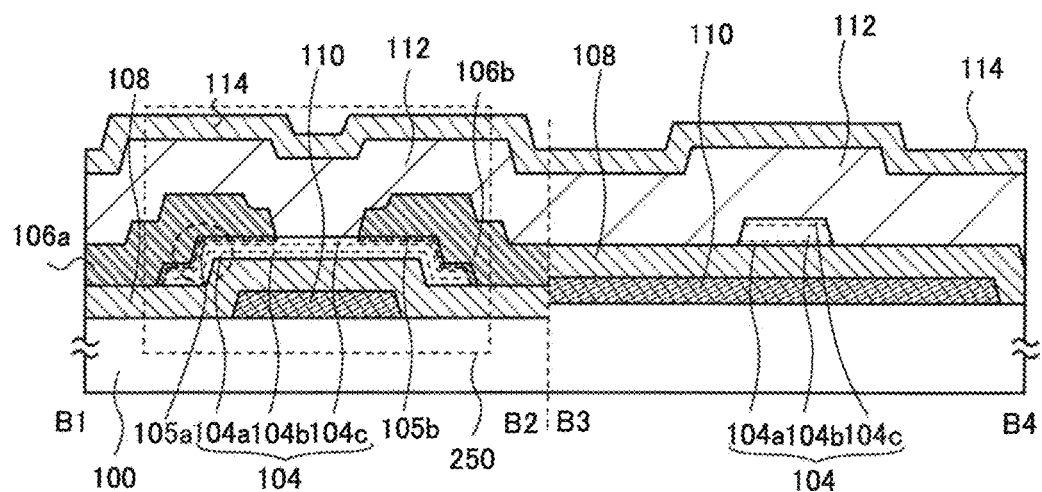
Figure 10C:
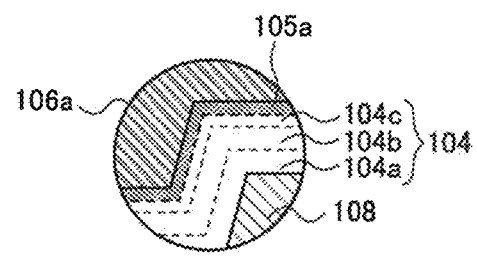

FIGS. 10A to 10C are a top view and cross-sectional views of a transistor of one embodiment of the present invention. FIG. 10A is a top view, and a cross section taken along a dashed-dotted line B1-B2 and a dashed-dotted line B3-B4 in FIG. 10A is illustrated in FIG. 10B. FIG. 10C is an enlarged view of a region surrounded by a dashed-line circle in FIG. 10B.

Note that for simplification of the drawing, some components in the top view in FIG. 10A are not illustrated.

A transistor 250 illustrated in FIGS. 10A to 10C includes: the gate electrode 110 over the substrate 100; the gate insulating film 108 over the gate electrode 110; the multilayer film 104 over the gate insulating film 108; the low-resistance region 105a and the low-resistance region 105b over the multilayer film 104; the source electrode 106a over the low-resistance region 105a; the drain electrode 106b over the low-resistance region 105b; and the oxide insulating film 112 over the multilayer film 104, the source electrode 106a, and the drain electrode 106b. Further, another insulating film (e.g., the nitride insulating film 114) may be provided over the oxide insulating film 112.

The transistor 250 in FIGS. 10A to 10C is the same as the transistor 150 in FIGS. 1A to 1C except for the positions of the gate electrode 110 and the gate insulating film 108. Further, like the transistor 150 described in Embodiment 1, the transistor 250 includes the low-resistance region 105a and the low-resistance region 105b.

The multilayer film 104 has a structure in which an oxide film 104a, an oxide semiconductor film 104b, and an oxide film 104c are stacked from the substrate 100 side.

Depending on materials used for the oxide film 104a, the oxide semiconductor film 104b, and the oxide film 104c, boundaries between the oxide film 104a and the oxide semiconductor film 104b and between the oxide semiconductor film 104b and the oxide film 104c in the multilayer film 104 cannot be clearly recognized in some cases. Thus, the boundaries of the oxide film 104a, the oxide semiconductor film 104b, and the oxide film 104c are denoted by dotted lines in the drawings.

A material of a conductive film to be the source electrode and the drain electrode is a conductive material which is more likely to be bonded to oxygen than to a metal element included in the oxide semiconductor film; therefore, oxygen in the multilayer film 104 is bonded to the conductive material of a conductive film to be the source electrode and the drain electrode. The bonding causes oxygen vacancy in a region of the multilayer film 104 in the vicinity of an interface with the conductive film. Alternatively, damage (oxygen vacancy) to the top surface of the multilayer film 104 is caused when the conductive film to be formed over the multilayer film 104 is formed. Regions whose resistances are reduced owing to the oxygen vacancy and hydrogen, i.e., the low-resistance region 105a and the low-resistance region 105b are formed, so that contact resistance between the multilayer film and the source electrode or the drain electrode is reduced. Also in the case where the material of the conductive film is a conductive material which is easily diffused into the oxide semiconductor film by heat treatment, the low-resistance regions are formed. Although boundaries between the multilayer film 104 and each of the low-resistance region 105a and the low-resistance region 105b exist in the oxide film 104c, this embodiment is not limited thereto; the boundaries may exist in the oxide film 104a, in the oxide semiconductor film 104b, at the interface between the oxide film 104a and the oxide semiconductor film 104b, or at the interface between the oxide semiconductor film 104b and the oxide film 104c.

The source electrode 106a and the drain electrode 106b are formed so as to have a step-like edge portion. The end portions can be formed in such a manner that a step of making a resist mask recede by ashing and an etching step are alternately performed plural times. Therefore, the edge portions of the source electrode 106a and the drain electrode 106b are provided over the low-resistance region 105a and the low-resistance region 105b, respectively.

Accordingly, a channel formation region of the transistor 250 corresponds to a region 105c of the multilayer film 104 between the low-resistance region 105a and the low-resistance region 105b, a region of the low-resistance region 105a which is not in contact with the source electrode 106a, and a region of the low-resistance region 105b which is not in contact with the drain electrode 106b. The channel formation region of the transistor 250 is made to be an n-type; therefore, it is necessary that the impurity concentration of the multilayer film 104 is reduced so that the multilayer film is highly purified to be intrinsic.

In order that the channel formation region of the transistor 250 is highly purified to be intrinsic, oxygen is added to the region 105c of the multilayer film 104. The addition of oxygen can reduces the amount of oxygen vacancy, so that a highly purified intrinsic region can be formed. Accordingly, the highly purified intrinsic region and the low resistance regions can be formed separately at one time.

Further, excess oxygen can be easily released from the base insulating film 102, the gate insulating film 108, and the oxide insulating film 112 by heat treatment, so that the oxygen vacancy in the multilayer film 104 can be reduced. Thus, the amount of oxygen vacancy in the channel formation region of the multilayer film 104 is further reduced, so that the channel formation region is highly purified intrinsic.

Figure 11A:
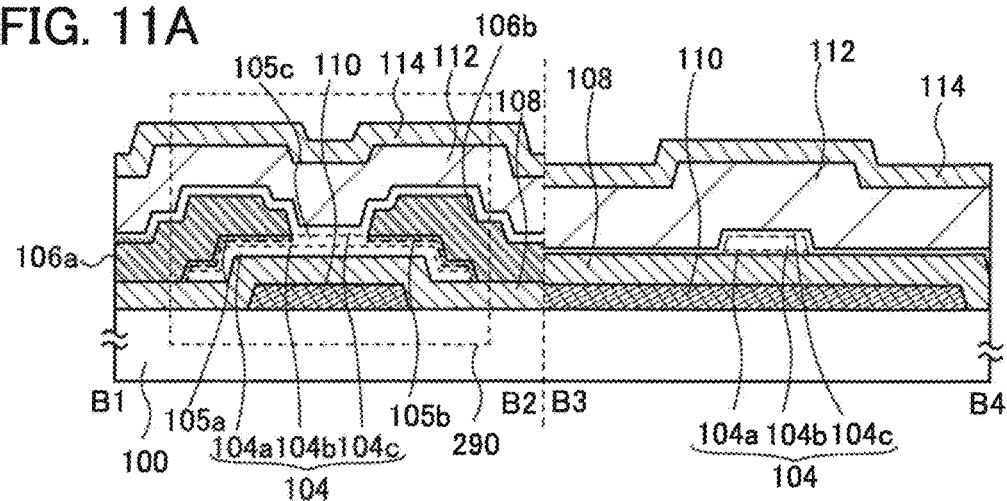
FIGS. 11A to 11C are each a cross-sectional view illustrating a transistor.

FIG. 11A illustrates another transistor structure. A transistor 290 illustrated in FIG. 11A includes the gate electrode 110 over the substrate 100; the gate insulating film 108 over the gate electrode 110; the oxide film 104a over the gate insulating film 108; the oxide semiconductor film 104b over the oxide film 104a; the source electrode 106a and the drain electrode 106b over the oxide semiconductor film 104b; the oxide film 104c over the source electrode 106a and the drain electrode 106b; the low-resistance region 105a which is formed in such a manner that oxygen is extracted from the oxide semiconductor film 104b which is in contact with the source electrode 106a; the low-resistance region 105b which is formed in such a manner that oxygen is extracted from the oxide semiconductor film 104b which is in contact with the drain electrode 106b; and the oxide insulating film 112 over the oxide film 104c, the source electrode 106a, and the drain electrode 106b. Further, another insulating film (e.g., the nitride insulating film 114) may be formed over the oxide insulating film 112.

The transistor 290 in FIG. 11A is the same as the transistor 250 in FIGS. 10A to 10C except that the oxide film 104c is provided over the source electrode 106a and the drain electrode 106b. Like the transistor 150 described in Embodiment 1, the transistor 290 includes the low-resistance region 105a and the low-resistance region 105b.

An In—Ga—Zn oxide having an atomic ratio of In:Ga:Zn=1:1:1 can be used for the oxide film 104a, an In—Ga—Zn oxide having an atomic ratio of In:Ga:Zn=1:3:2 can be used for the oxide semiconductor film 104b, and an In—Ga—Zn oxide having an atomic ratio of In:Ga:Zn=1:1:1 can be used for the oxide film 104c.

In the transistor 290, the oxide semiconductor film 104b in which the channel is formed is in contact with the source electrode 106a and the drain electrode 106b, so that oxygen vacancy is generated at a high density in the oxide semiconductor film 104b and n-type regions (the low-resistance region 105a and the low-resistance region 105b) are formed. Therefore, there is a few resistance component in a carrier path and carriers can be transported efficiently.

Further, the oxide film 104c is formed after the source electrode 106a and the drain electrode 106b are formed; therefore, overetching of the oxide film 104c does not occur at the time of forming the source electrode 106a and the drain electrode 106b. Therefore, the oxide semiconductor film 104b where the channel is formed can be sufficiently distant from the oxide insulating film 112, and the effect of suppressing influence of diffusion of impurities from the interface can be enhanced.

Further, the oxide film 104c functions as a barrier film which suppresses entry of hydrogen or a compound containing hydrogen (e.g., water) from the outside to the multilayer film 104; thus, the reliability of the transistor can be improved. Therefore, the nitride insulating film 114 is not necessarily provided.

Figure 11B:
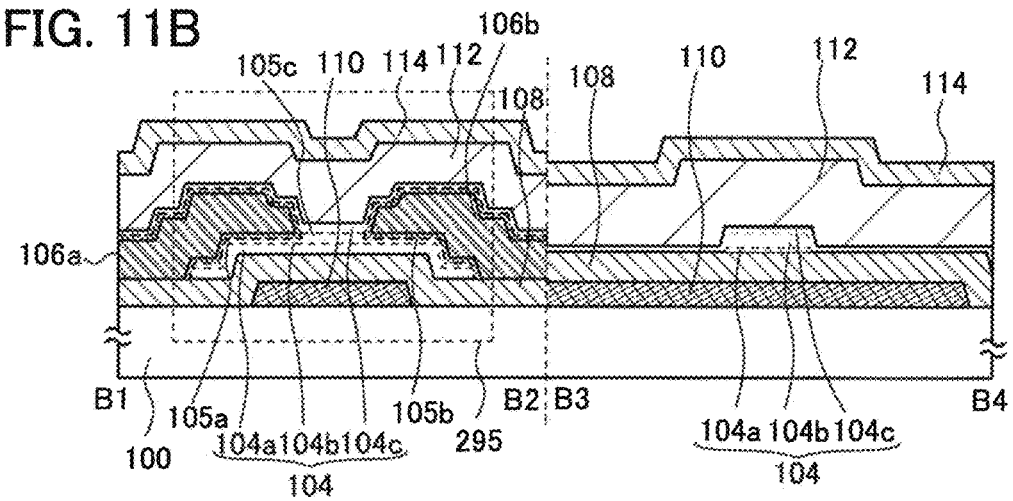

Further, when the source electrode 106a and the drain electrode 106b are formed using a conductive material which is likely to be bonded to oxygen, as in a transistor 295 illustrated in FIG. 11B, low-resistance regions are also formed in the oxide film 104c in contact with the source electrode 106a and the drain electrode 106b.

Figure 11C:
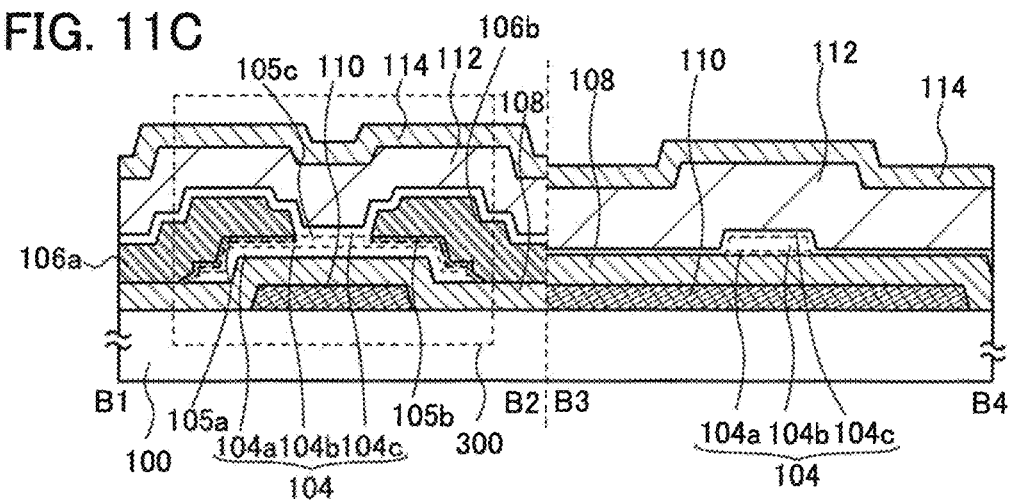

Further, as in a transistor 300 illustrated in FIG. 11C, a structure in which the end portion of the oxide film 104a and the end portion of the oxide semiconductor film 104b are not continuous may be employed. The shapes of the edge portions are formed in such a manner that a stack of the oxide film 104a and the oxide semiconductor film 104b is wet-etched under conditions where the etching rate of the oxide semiconductor film 104b is higher than that of the oxide film 104a.

The contact area of the source electrode 106a and the drain electrode 106b can be large when the multilayer film 104 has such a tapered shape. Accordingly, the contact resistance between the multilayer film 104 and the source and drain electrodes 106a and 106b is reduced, whereby on-state current of the transistor can be increased.

Figure 12A:
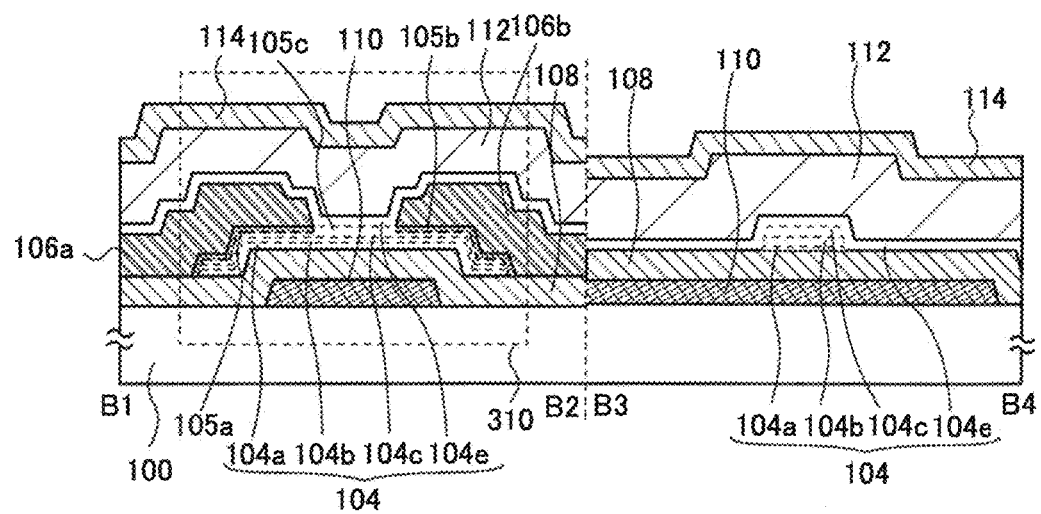
FIGS. 12A and 12B are each a cross-sectional view illustrating a transistor.

Like in a transistor 310 illustrated in FIG. 12A, after the oxide film 104a, the oxide semiconductor film 104b, and the oxide film 104c are formed in this order over the gate insulating film 108, the source electrode 106a and the drain electrode 106b may be formed and then an oxide film 104e may be formed over the source electrode 106a and the drain electrode 106b. An In—Ga—Zn oxide having an atomic ratio of In:Ga:Zn=1:3:2 can be used for the oxide film 104e.

Figure 12B:
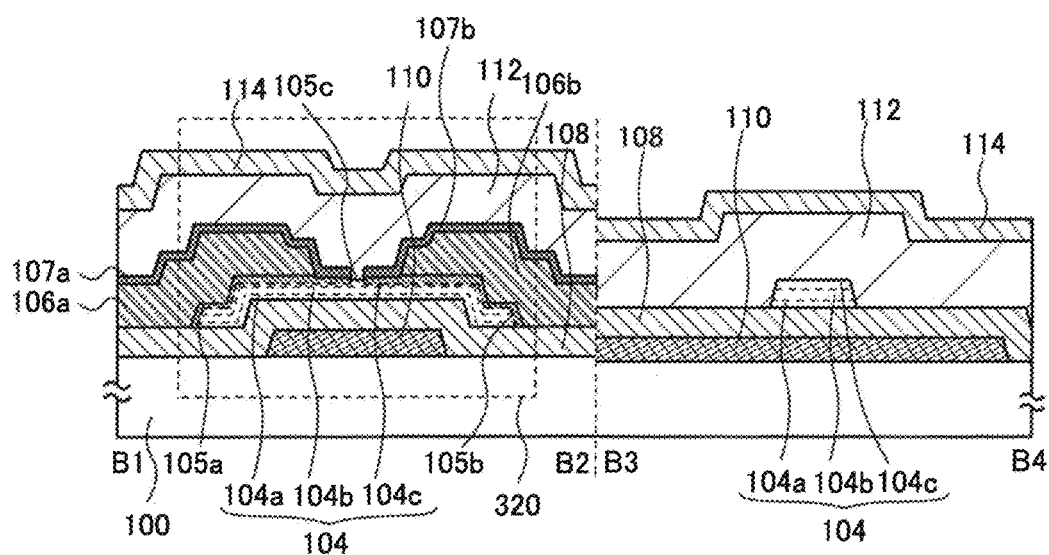

Further, FIG. 12B illustrates another transistor structure. A transistor 320 illustrated in FIG. 12B is the same as the transistor 250 in FIGS. 10A to 10C except that a conductive film 107a and a conductive film 107b are formed over the source electrode 106a and the drain electrode 106b. Like the transistor 150 described in Embodiment 1, the transistor 320 includes the low-resistance region 105a and the low-resistance region 105b.

Note that the conductive film 107a and the conductive film 107b function as part of the source electrode and part of the drain electrode. Thus, in the transistor 320 in FIG. 12B, a channel length corresponds to a distance between the conductive film 107a and the conductive film 107b.

Further, in the transistor 320 in FIG. 12B, a channel corresponds to a region of the oxide semiconductor film 104b which does not overlap with the conductive film 107a and the conductive film 107b.

Furthermore, in the transistor 320 in FIG. 12B, a channel formation region corresponds to regions of the oxide film 104a, the oxide semiconductor film 104b, and the oxide film 104c which do not overlap with the conductive film 107a and the conductive film 107b.

After the conductive film 107a and the conductive film 107b are formed, oxygen is added to the region 105c of the multilayer film 104, whereby the amount of oxygen vacancy in the channel formation region can be reduced and a highly purified intrinsic region can be formed. Accordingly, the highly purified intrinsic region and the low-resistance regions can be formed separately at one time.

The above embodiment can be referred to for the conductive film 107a and the conductive film 107b.

When the conductive film 107a and the conductive film 107b are formed in such a manner that a conductive film is processed by light exposure with an electron beam, ArF immersion, EUV, with the use of a resist mask with a small pattern width, the channel length can be greater than or equal to 1 nm and less than or equal to 30 nm.

Figure 13A:
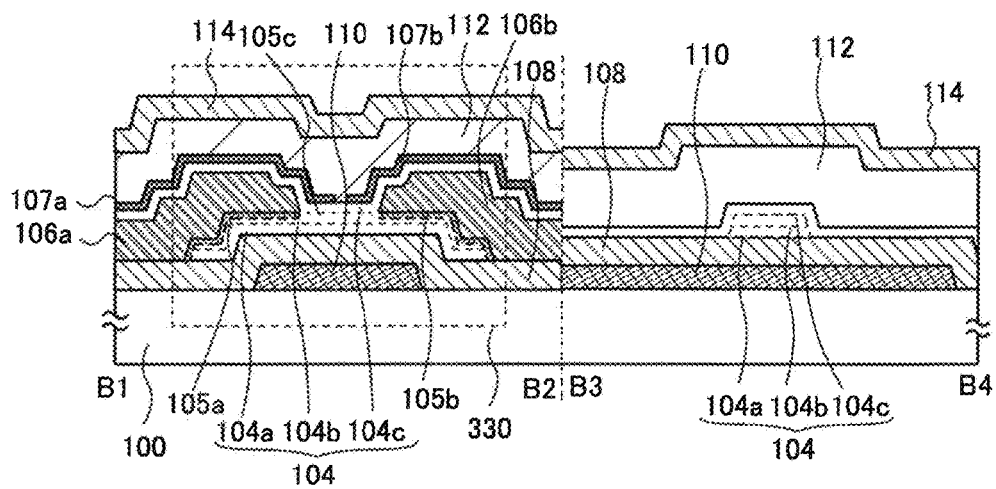
FIGS. 13A and 13B are each a cross-sectional view illustrating a transistor.

FIG. 13A illustrates another transistor structure. A transistor 330 has a structure of the transistor 290 in FIG. 11A which further includes the conductive film 107a and the conductive film 107b over the oxide film 104c.

Figure 13B:
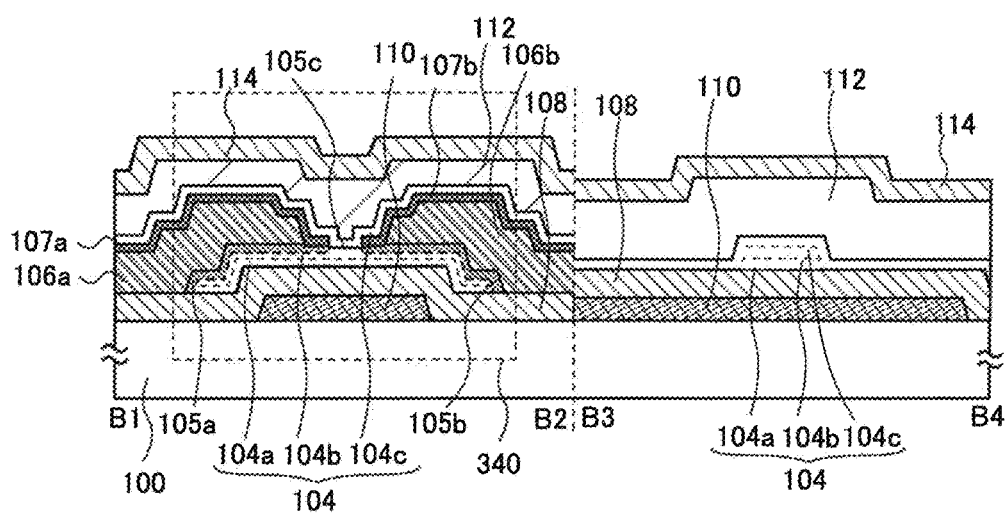

Alternatively, a structure of a transistor 340 illustrated in FIG. 13B may be employed. The transistor 340 is formed by a formation process of the transistor 330 in FIG. 13A in which the formation process of the oxide film 104c and the formation process of the conductive film 107a and the conductive film 107b are reversed.

The above is the description of the transistors of one embodiment of the present invention. The amount of oxygen vacancy in the channel formation region of the oxide semiconductor in the multilayer film in any of the transistors can be reduced and the electrical characteristics of any of the transistors are favorable; therefore, it is possible to provide a highly reliable semiconductor device.

This embodiment can be combined as appropriate with any of the other embodiments in this specification.

Embodiment 4

In this embodiment, a method for manufacturing the transistor 250 described in Embodiment 3 with reference to FIGS. 10A to 10C is described.

Figure 14A:
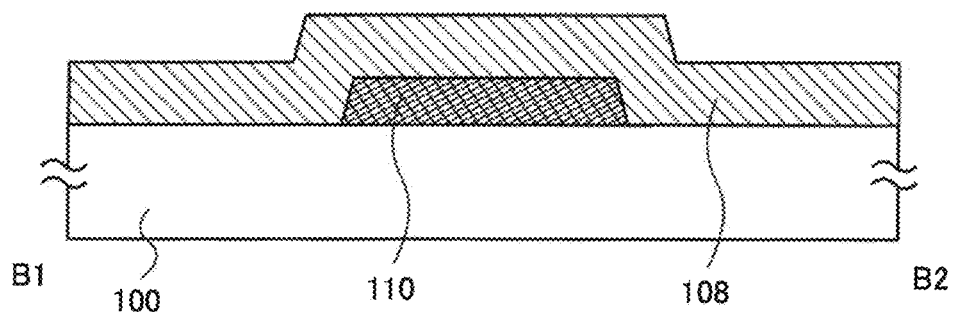
FIGS. 14A to 14C illustrate a method for manufacturing a transistor.

First, the gate electrode 110 is formed over the substrate 100, and the gate insulating film 108 is formed to cover the gate electrode 110 (see FIG. 14A).

The above embodiment can be referred to for the substrate 100, the gate electrode 110, and the gate insulating film 108.

The gate insulating film 108 is preferably an insulating film containing excess oxygen.

A base insulating film may be formed over the substrate 100. The base insulating film 102 in the above embodiment can be referred to for the base insulating film.

Figure 14B:
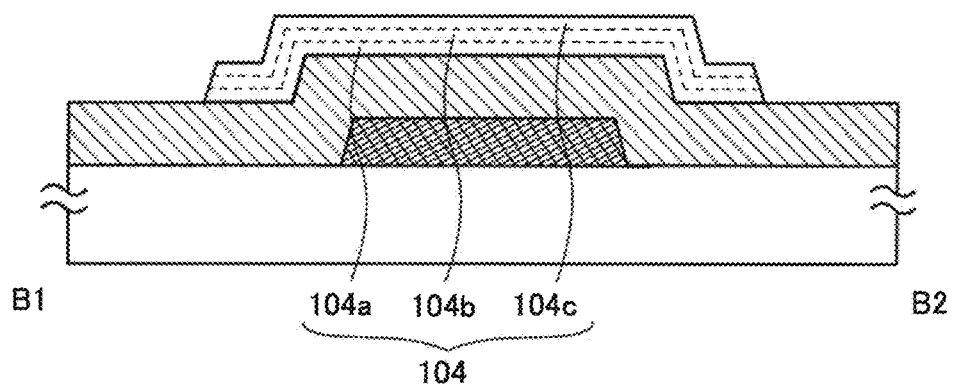

Next, the multilayer film 104 including the oxide film 104a, the oxide semiconductor film 104b, and the oxide film 104c is formed over the gate insulating film 108 (see FIG. 14B).

The above embodiment can be referred to for the multilayer film 104.

Next, first heat treatment is preferably performed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more in order to compensate desorbed oxygen. The first heat treatment can increase the crystallinity of the oxide semiconductor film 104b and remove impurities such as water and hydrogen from the gate insulating film 108, the oxide film 104a, and the oxide film 104c. Note that the first heat treatment may be performed before the etching for forming the multilayer film 104.

Figure 14C:
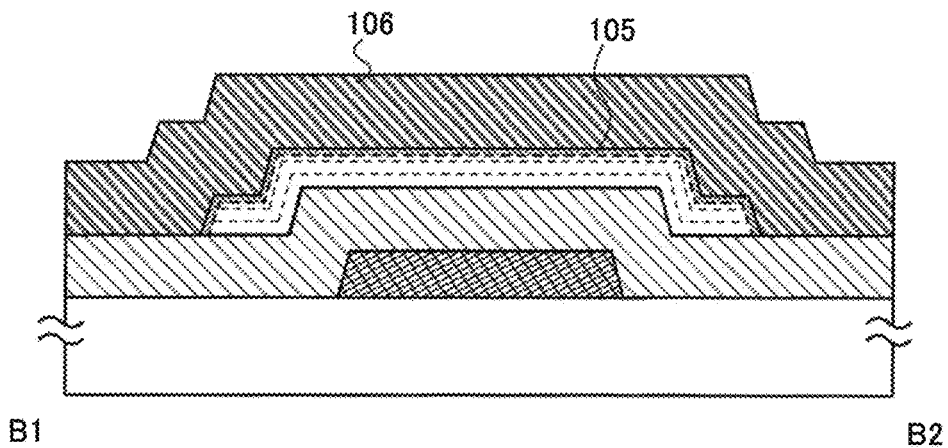

Next, the conductive film 106 to be the source electrode and the drain electrode is formed over the multilayer film 104. In this embodiment, a conductive material which is more likely to be bonded to oxygen than to a metal element contained in the oxide semiconductor film is used as a material of the conductive film 106. Since the material of the conductive film 106 is the conductive material which is likely to be bonded to oxygen, oxygen in the multilayer film 104 is bonded to the conductive material (the conductive film 106). The bonding causes oxygen vacancy in the multilayer film 104 in the vicinity of the interface with the conductive film 106. Further, damage (oxygen vacancy) to the top surface of the multilayer film 104 is caused when the conductive film 106 is formed over the multilayer film 104. By the oxygen vacancy, the low-resistance region 105 is formed (see FIG. 14C). In this embodiment, the low-resistance region 105 exists in a region at a depth of greater than 0 nm and less than or equal to 15 nm, preferably less than 10 nm, further preferably less than 3 nm from the interface between the multilayer film 104 including the oxide semiconductor film and the conductive film 106 in the depth direction of the multilayer film 104.

Although the boundary between the low-resistance region 105 and the multilayer film 104 exists in the oxide film 104c in this embodiment, this embodiment is not limited thereto; the boundary may exist in the oxide film 104a, in the oxide semiconductor film 104b, at the interface between the oxide film 104a and the oxide semiconductor film 104b, or at the interface between the oxide semiconductor film 104b and the oxide film 104c.

The above embodiment can be referred to for the conductive film 106.

When the low-resistance region 105 is formed, contact resistance between the source electrode or the drain electrode to be formed later and the multilayer film 104 can be reduced, so that high speed operation of the transistor 250 can be achieved.

Figure 15A:
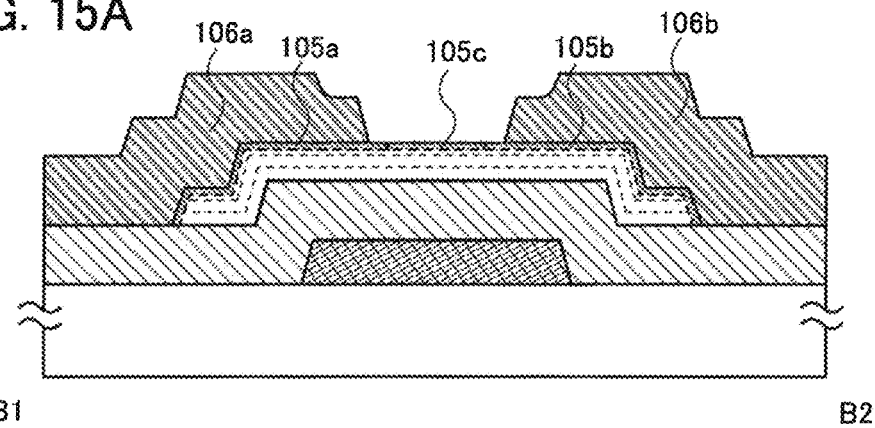
FIGS. 15A to 15C illustrate a method for manufacturing a transistor.

Next, the conductive film 106 is etched so as to be separated over the multilayer film 104, so that the source electrode 106a and the drain electrode 106b are formed (see FIG. 15A). The edge portions of the source electrode 106a and the drain electrode 106b are formed to have a step as shown in the drawings. The end portions can be formed in such a manner that a step of making a resist mask recede by ashing and an etching step are alternately performed plural times.

Note that the low-resistance region 105a and the low-resistance region 105b exist below the source electrode 106a and the drain electrode 106b, respectively, and an oxide film between the low-resistance region 105a and the low-resistance region 105b corresponds to the region 105c.

Further, the step of making the resist mask recede by ashing and the etching step are alternately performed, whereby the edge portions of the source electrode 106a and the drain electrode 106b are provided over the low-resistance region 105a and the low-resistance region 105b.

Therefore, the channel formation region of the transistor 250 corresponds to the region 105c, a region of the low-resistance region 105a which is not in contact with the source electrode 106a, and a region of the low-resistance region 105b which is not in contact with the drain electrode 106b. The channel formation region of the transistor 250 is an n-type region; therefore, it is necessary to reduce the impurity concentration of the multilayer film 104 so that the channel formation region is highly purified to be intrinsic.

Note that at the time of etching the conductive film 106 to be separated over the multilayer film 104, part of the oxide film 104c might be etched and the thickness of the multilayer film in the channel formation region might be reduced.

Figure 15B:
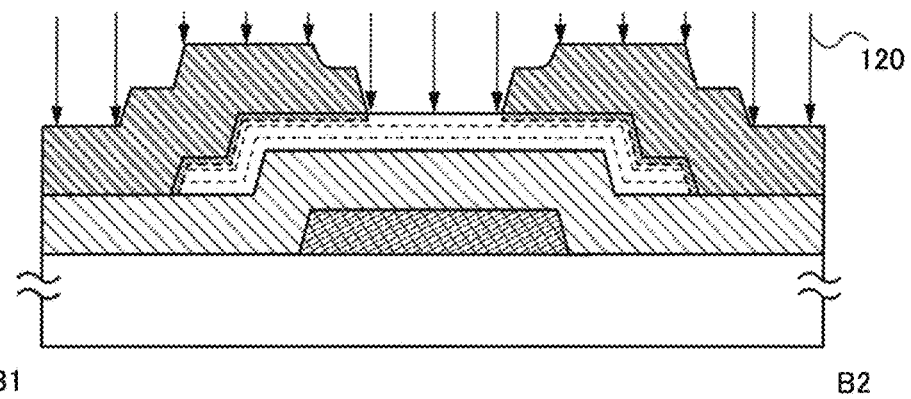

Next, the oxygen 120 is added to the region 105c of the multilayer film 104 (see FIG. 15B)

The above embodiment can be referred to for a method for adding oxygen to the region 105c of the multilayer film 104

The whole low-resistance region 105a does not necessarily overlap with the source electrode 106a and may include a region which extends toward the region 105c and does not overlap with the source electrode 106a. Further, the whole low-resistance region 105b does not necessarily overlap with the drain electrode 106b and may include a region which extends toward the region 105c and does not overlap with the drain electrode 106b. The low-resistance region 105a and the low-resistance region 105b do not necessarily have uniform thickness. For example, the end portion of the low-resistance region 105a which does not overlap with the source electrode 106a may gently spread from the bottom surface toward the surface of the low-resistance region 105a. In a similar manner, for example, the end portion of the low-resistance region 105b which does not overlap with the drain electrode 106b may gently spread from the bottom surface toward the surface of the low-resistance region 105b. A difference between the length between the source electrode 106a and the drain electrode 106b and the length between the low-resistance region 105a and the low-resistance region 105b is less than 30%, preferably less than 10%, further preferably less than 3% of the length between the source electrode 106a and the drain electrode 106b.

In the above structure, the region 105c has higher resistance than the low-resistance region and functions as the channel formation region. Further, the amount of oxygen vacancy in the region 105c can be reduced, a highly purified intrinsic region can be formed. Accordingly, the highly purified intrinsic region and the low-resistance regions can be formed separately at one time. Note that the hydrogen concentration of the region 105c functioning as the channel formation region is lower than or equal to $5 \times 10^{17}$ atoms/cm$^3$, preferably lower than or equal to $1 \times 10^{17}$ atoms/cm$^3$.

Next, second heat treatment is preferably performed. The second heat treatment can be performed in a similar condition to the first heat treatment. By the second heat treatment, impurities such as hydrogen and water can be further removed from the multilayer film 104.

Figure 15C:
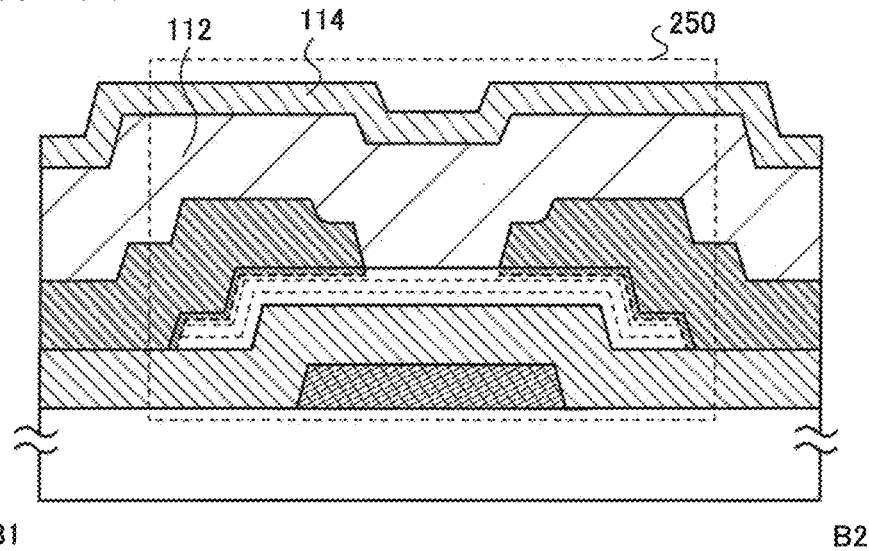

Next, the oxide insulating film 112 is formed over the multilayer film 104, the source electrode 106a, and the drain electrode 106b (see FIG. 15C).

The above embodiment can be referred to for the oxide insulating film 112. Further, the nitride insulating film 114 may be provided over the oxide insulating film 112. The nitride insulating film 114 can prevent oxygen in the oxide insulating film 112 from diffusing to the outside at the time of heat treatment and functions as a barrier film which prevents hydrogen or a compound containing hydrogen (e.g., water) from entering the multilayer film 104 from the outside. Accordingly, the reliability of the transistor can be improved.

Through the above process, the transistor 250 illustrated in FIGS. 10A to 10C can be manufactured.

Next, third heat treatment is preferably performed. The third heat treatment can be performed under a condition similar to that of the first heat treatment. In the case where the gate insulating film 108 and the oxide insulating film 112 contain excess oxygen, the excess oxygen is easily released from the gate insulating film 108 and the oxide insulating film 112 by the third heat treatment, so that oxygen vacancy in the multilayer film 104 can be reduced. Accordingly, the amount of oxygen vacancy in the channel formation region of the multilayer film 104 can be further reduced, so that the channel formation region becomes highly purified intrinsic.

Further, although the treatment for adding the oxygen 120 to the region 105c of the multilayer film 104 is performed just after the source electrode 106a and the drain electrode 106b are formed in this embodiment, this embodiment is not limited thereto; the treatment may be performed after the gate insulating film 108 is formed, whereby oxygen may be supplied from the gate insulating film 108 to the region 105c of the multilayer film 104.

This embodiment can be combined as appropriate with any of the other embodiments in this specification.

Embodiment 5

In this embodiment, an example of a semiconductor device (memory device) which includes a transistor of one embodiment of the present invention, which can retain stored data even when not powered, and which has an unlimited number of write cycles is described with reference to drawings.

Figure 16A:
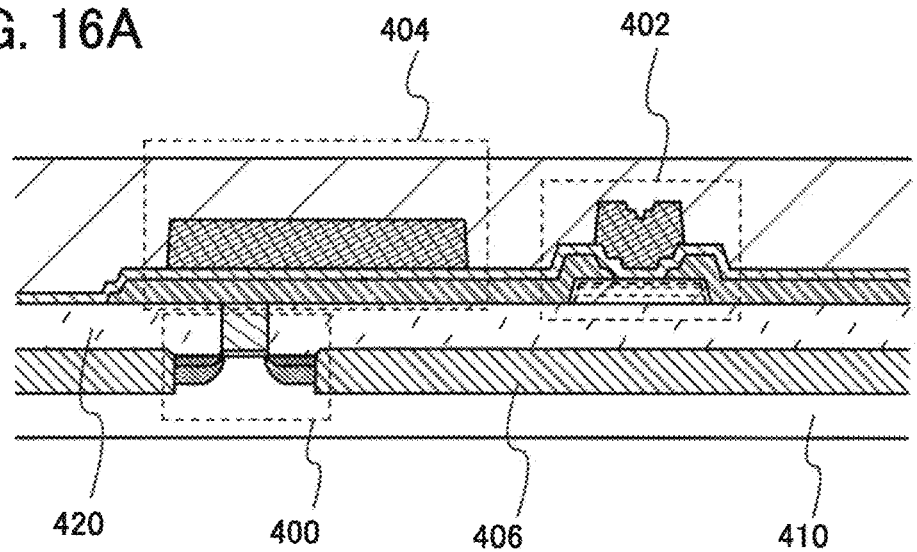
FIGS. 16A to 16C are a cross-sectional view and a circuit diagram of a semiconductor device.
Figure 16B:
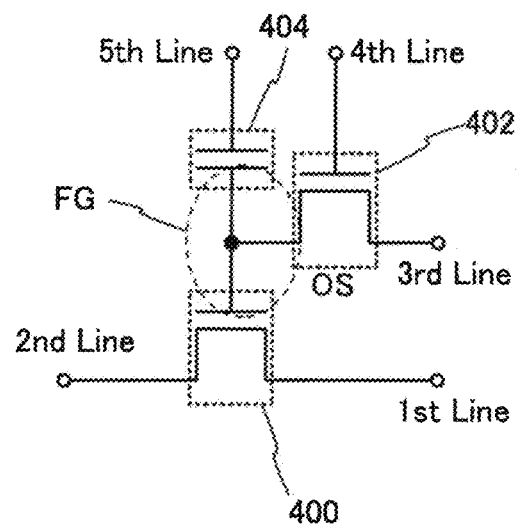

FIG. 16A is a cross-sectional view of the semiconductor device, and FIG. 16B is a circuit diagram of the semiconductor device.

The semiconductor device illustrated in FIGS. 16A and 16B includes a transistor 400 including a first semiconductor material in a lower portion, and a transistor 402 including a second semiconductor material and a capacitor 404 in an upper portion. As the transistor 402, any of the transistors described in the above embodiment can be used, and an example in which the transistor 150 described in Embodiment 1 with reference to FIGS. 1A to 1C is applied to the transistor 402 is described in this embodiment. One electrode of the capacitor 404 is formed using the same material as a gate electrode of the transistor 402, the other electrode of the capacitor 404 is formed using the same material as a source electrode and a drain electrode of the transistor 402, and a dielectric of the capacitor 404 is formed using the same material as a gate insulating film 108 of the transistor 402; thus, the capacitor 404 can be formed at the same time as the transistor 402.

Here, the first semiconductor material and the second semiconductor material are preferably materials having different band gaps. For example, the first semiconductor material may be a semiconductor material (such as silicon) other than an oxide semiconductor, and the second semiconductor material may be the oxide semiconductor described in Embodiment 1. A transistor including a material other than an oxide semiconductor can operate at high speed easily. On the other hand, a transistor including an oxide semiconductor enables charge to be held for a long time owing to its electrical characteristics, that is, the low off-state current.

Although both of the above transistors are n-channel transistors in the following description, it is needless to say that p-channel transistors can be used. The specific structure of the semiconductor device, such as the material used for the semiconductor device and the structure of the semiconductor device, is not necessarily limited to that described here except for the use of the transistor described in the above embodiment, which is formed using an oxide semiconductor for storing data.

The transistor 400 in FIG. 16A includes a channel formation region provided in a substrate 410 including a semiconductor material (such as crystalline silicon), impurity regions provided such that the channel formation region is provided therebetween, intermetallic compound regions provided in contact with the impurity regions, a gate insulating film provided over the channel formation region, and a gate electrode provided over the gate insulating film. Note that a transistor whose source electrode and drain electrode are not illustrated in a drawing may also be referred to as a transistor for the sake of convenience. Further, in such a case, in description of a connection of a transistor, a source region and a source electrode may be collectively referred to as a source electrode, and a drain region and a drain electrode may be collectively referred to as a drain electrode.

That is, for example, in this specification, the term "source electrode" might include a source region.

Further, an element isolation insulating layer 406 is formed on the substrate 410 so as to surround the transistor 400, and an insulating film 420 is formed so as to cover the transistor 400. Note that the element isolation insulating layer 406 can be formed by an element isolation technique such as local oxidation of silicon (LOCOS) or shallow trench isolation (STI).

For example, the transistor 400 formed using a crystalline silicon substrate can operate at high speed. Thus, when the transistor is used as a reading transistor, data can be read at high speed. As treatment prior to formation of the transistor 402 and the capacitor 404, CMP treatment is performed on the insulating film 420 covering the transistor 400, whereby the insulating film 420 is planarized and, at the same time, an upper surface of the gate electrode of the transistor 400 is exposed.

The transistor 402 is provided over the insulating film 420, and one of the source electrode and the drain electrode thereof is extended so as to function as the other electrode of the capacitor 404.

The transistor 402 in FIG. 16A is a top-gate transistor in which a channel is formed in an oxide semiconductor film. Since the off-state current of the transistor 402 is low, stored data can be retained for a long period owing to such a transistor. In other words, refresh operation becomes unnecessary or the frequency of the refresh operation in a semiconductor memory device can be extremely low, which leads to a sufficient reduction in power consumption.

In the transistor 402, low-resistance regions are formed in regions in the vicinity of the interfaces of the multilayer film in contact with the source electrode and the drain electrode, and the channel formation region can be a highly purified intrinsic region by adding oxygen to the multilayer film using the source electrode and the drain electrode as masks. By the addition of oxygen, the highly purified intrinsic region and the low-resistance regions can be formed separately at one time. The amount of oxygen vacancy in the channel formation region in the multilayer film in the transistor can be reduced and the electrical characteristics of the transistor are favorable; therefore, it is possible to provide a highly reliable semiconductor device.

The transistor 400 and the transistor 402 can be formed so as to overlap with each other as illustrated in FIG. 16A, whereby the area occupied by them can be reduced. Accordingly, the degree of integration of the semiconductor device can be increased.

An example of a circuit configuration corresponding to FIG. 16A is illustrated in FIG. 16B.

In FIG. 16B, a first wiring (1st Line) is electrically connected to a source electrode of the transistor 400. A second wiring (2nd Line) is electrically connected to a drain electrode of the transistor 400. A third wiring (3rd Line) is electrically connected to one of the source electrode and the drain electrode of the transistor 402, and a fourth wiring (4th Line) is electrically connected to the gate electrode of the transistor 402. The gate electrode of the transistor 400 and the one of the source electrode and the drain electrode of the transistor 402 are electrically connected to the other electrode of the capacitor 404. A fifth wiring (5th Line) is electrically connected to the other electrode of the capacitor 404.

The semiconductor device in FIG. 16B utilizes a characteristic in which the potential of the gate electrode of the transistor 400 can be held, and thus enables writing, storing, and reading of data as follows.

Writing and storing of data are described. First, the potential of the fourth wiring is set to a potential at which the transistor 402 is turned on, so that the transistor 402 is turned on. Accordingly, the potential of the third wiring is supplied to the gate electrode of the transistor 400 and the capacitor 404. That is, a predetermined charge is supplied to the gate electrode of the transistor 400 (writing). Here, one of two kinds of charges providing different potential levels (hereinafter referred to as a low-level charge and a high-level charge) is supplied. After that, the potential of the fourth wiring is set to a potential at which the transistor 402 is turned off, so that the transistor 402 is turned off. Thus, the charge supplied to the gate electrode of the transistor 400 is held (holding).

Since the off-state current of the transistor 402 is extremely low, the charge of the gate electrode of the transistor 400 is held for a long time.

Next, reading of data is described. By supplying an appropriate potential (a reading potential) to the fifth wiring while supplying a predetermined potential (a constant potential) to the first wiring, the potential of the second wiring varies depending on the amount of charge held in the gate electrode of the transistor 400. This is because in general, when the transistor 400 is an n-channel transistor, an apparent threshold voltage $V_{th\_H}$ in the case where the high-level charge is given to the gate electrode of the transistor 400 is lower than an apparent threshold voltage $V_{th\_L}$ in the case where the low-level charge is given to the gate electrode of the transistor 400. Here, an apparent threshold voltage refers to the potential of the fifth wiring which is needed to turn on the transistor 400. Thus, the potential of the fifth wiring is set to a potential $V_0$ which is between $V_{th\_H}$ and $V_{th\_L}$, whereby charge supplied to the gate electrode of the transistor 400 can be determined. For example, in the case where the high-level charge is supplied in writing, when the potential of the fifth wiring is $V_0$ ($>V_{th\_H}$), the transistor 400 is turned on. In the case where the low-level charge is supplied in writing, even when the potential of the fifth wiring is $V_0$ ($<V_{th\_L}$), the transistor 400 remains off. Therefore, the data stored in the gate electrode can be read by determining the potential of the second wiring.

Note that in the case where memory cells are arrayed, it is necessary that only data of a desired memory cell be able to be read. The fifth wiring in the case where data is not read may be supplied with a potential at which the transistor 400 is turned off regardless of the state of the gate electrode, that is, a potential lower than $V_{th\_H}$. Alternatively, the fifth wiring may be supplied with a potential at which the transistor 400 is turned on regardless of the state of the gate electrode, that is, a potential higher than $V_{th\_L}$.

When including a transistor having a channel formation region formed using an oxide semiconductor and having an extremely low off-state current, the semiconductor device described in this embodiment can retain stored data for an extremely long period. In other words, refresh operation becomes unnecessary or the frequency of the refresh operation can be extremely low, which leads to a sufficient reduction in power consumption. Moreover, stored data can be retained for a long period even when power is not supplied (note that a potential is preferably fixed).

Figure 16C:
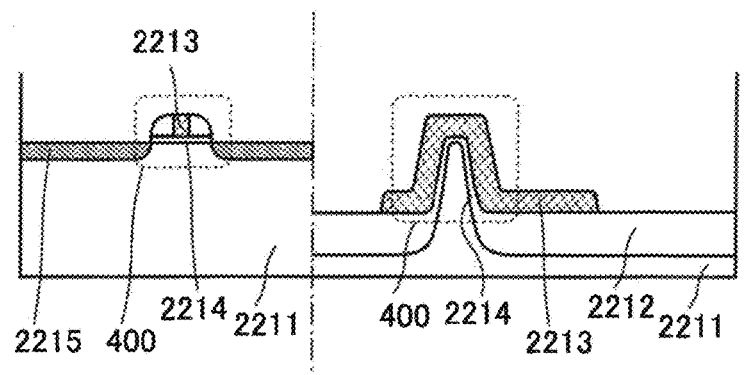

Further, in the semiconductor device described in this embodiment, the transistor 400 can be a transistor of various types as well as a planer type. For example, a fin-type transistor, a tri-gate transistor or the like can be applied. An example of the cross-sectional view of the transistor 400 is illustrated in FIG. 16C. In FIG. 16C, a cross-sectional view along a channel length direction is illustrated on the left side of a dashed-dotted line, and a cross-sectional view along a channel width direction is illustrated on the right side of the dashed-dotted line. An insulating film 2212 is provided over a semiconductor substrate 2211. The semiconductor substrate 2211 includes a protruding portion with a thin tip (also referred to a fin). Note that an insulating film may be provided over the protruding portion. The insulating film functions as a mask for preventing the semiconductor substrate from being etched when the protruding portion is formed. Alternatively, the protruding portion may not have the thin tip; a protruding portion with a cuboid-like protruding portion and a protruding portion with a thick tip are permitted, for example. A gate insulating film 2214 is provided over the protruding portion of the semiconductor substrate 2211, and a gate electrode 2213 is provided over the gate insulating film 2214. Further, a sidewall is provided on a side surface of the gate electrode 2213. Source and drain regions 2215 are formed in the semiconductor substrate 2211. Note that here is provided an example where the semiconductor substrate 2211 includes the protruding portion; however, a semiconductor device according to one embodiment of the present invention is not limited thereto. For example, a semiconductor region having a protruding potion may be formed by processing an SOI substrate.

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating film does not arise at all. That is, the semiconductor device according to the disclosed invention does not have a limitation on the number of times data can be rewritten, which is a problem of a conventional nonvolatile memory, and the reliability thereof is drastically improved. Furthermore, data is written depending on the on state and the off state of the transistor, whereby high-speed operation can be easily achieved.

As described above, a miniaturized and highly-integrated semiconductor device having high electrical characteristics and a fabrication method of the semiconductor device can be provided.

This embodiment can be combined as appropriate with any of the other embodiments in this specification.

Embodiment 6

In this embodiment, a semiconductor device including a transistor of one embodiment of the present invention, which can retain stored data even when not powered, which does not have a limitation on the number of write cycles, and which has a structure different from that described in Embodiment 5, is described.

Figure 17A:
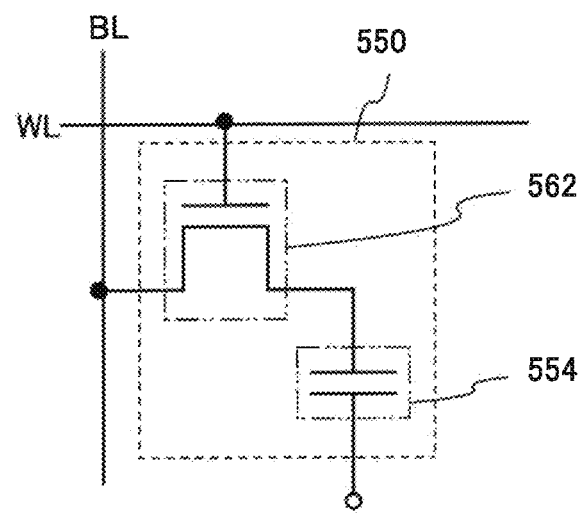
FIGS. 17A and 17B are a circuit diagram and a perspective view of a semiconductor device.
Figure 17B:
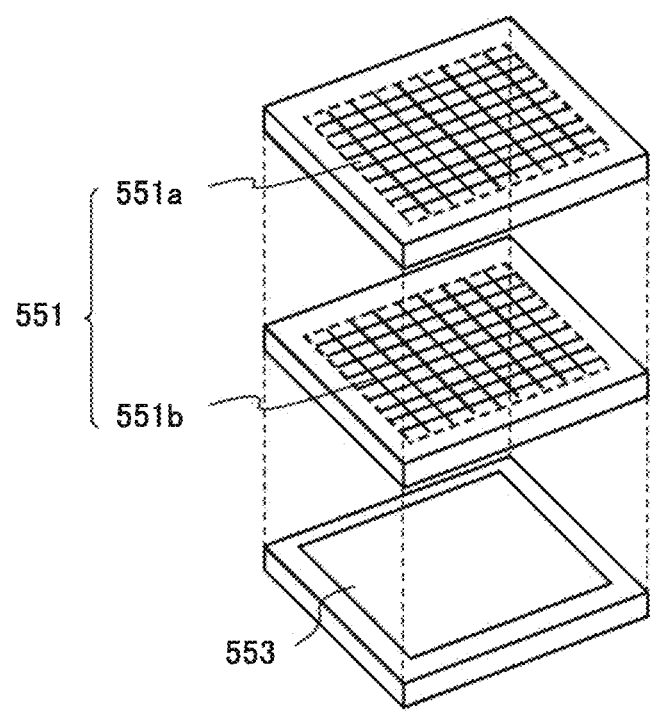

FIG. 17A illustrates an example of a circuit configuration of the semiconductor device, and FIG. 17B is a conceptual diagram illustrating an example of the semiconductor device. As a transistor 562 included in the semiconductor device, any of the transistors described in the above embodiment can be used. A capacitor 554 can be formed through the same process and at the same time as the transistor 562 in a manner similar to that of the capacitor 404 described in Embodiment 5.

In the semiconductor device illustrated in FIG. 17A, a bit line BL is electrically connected to a source electrode of the transistor 562, a word line WL is electrically connected to a gate electrode of the transistor 562, and a drain electrode of the transistor 562 is electrically connected to one terminal of the capacitor 554.

Next, writing and storing of data in the semiconductor device (a memory cell 550) illustrated in FIG. 17A are described.

First, the potential of the word line WL is set to a potential at which the transistor 562 is turned on, and the transistor 562 is turned on. Accordingly, the potential of the bit line BL is supplied to the one terminal of the capacitor 554 (writing). After that, the potential of the word line WL is set to a potential at which the transistor 562 is turned off, so that the transistor 562 is turned off. Thus, the potential of the one terminal of the capacitor 554 is held (holding).

In addition, the transistor 562 including an oxide semiconductor has an extremely low off-state current. For that reason, the potential of the one terminal of the capacitor 554 (or a charge accumulated in the capacitor 554) can be held for an extremely long time by turning off the transistor 562.

Next, reading of data is described. When the transistor 562 is turned on, the bit line BL which is in a floating state and the capacitor 554 are electrically connected to each other, and the charge is redistributed between the bit line BL and the capacitor 554. As a result, the potential of the bit line BL is changed. The amount of change in potential of the bit line BL varies depending on the potential of the one terminal of the capacitor 554 (or the charge accumulated in the capacitor 554).

For example, the potential of the bit line BL after charge redistribution is $(C_B \times V_{B0} + C \times V)/(C_B + C)$, where V is the potential of the one terminal of the capacitor 554, C is the capacitance of the capacitor 554, $C_B$ is the capacitance component of the bit line BL (hereinafter also referred to as bit line capacitance), and $V_{B0}$ is the potential of the bit line BL before the charge redistribution. Therefore, it can be found that assuming that the memory cell 550 is in either of two states in which the potentials of the one terminal of the capacitor 554 are $V_1$ and $V_0$ ($V_1 > V_0$), the potential of the bit line BL in the case of holding the potential $V_1 (=(C_B \times V_{B0} + C \times V_1)/(C_B + C))$ is higher than the potential of the bit line BL in the case of holding the potential $V_0 (=(C_B \times V_{B0} + C \times V_0)/(C_B + C))$.

Then, by comparing the potential of the bit line BL with a predetermined potential, data can be read.

As described above, the semiconductor device illustrated in FIG. 17A can hold charge that is accumulated in the capacitor 554 for a long time because the off-state current of the transistor 562 is extremely low. In other words, refresh operation becomes unnecessary or the frequency of the refresh operation can be extremely low, which leads to a sufficient reduction in power consumption. Moreover, stored data can be retained for a long period even when power is not supplied.

Next, the semiconductor device illustrated in FIG. 17B is described.

The semiconductor device illustrated in FIG. 17B includes a memory cell array 551 (memory cell arrays 551a and 551b) including the plurality of memory cells 550 illustrated in FIG. 17A as memory circuits in the upper portion, and a peripheral circuit 553 in the lower portion, which is necessary for operating the memory cell array 551. Note that the peripheral circuit 553 is electrically connected to the memory cell array 551.

It is preferable that a semiconductor material of the transistor provided in the peripheral circuit 553 be different from that of the transistor 562. For example, silicon, germanium, silicon germanium, silicon carbide, or gallium arsenide can be used, and a single crystal semiconductor is preferably used. Alternatively, an organic semiconductor material or the like may be used. A transistor including such a semiconductor material can operate at sufficiently high speed. Thus, the transistor enables a variety of circuits (e.g., a logic circuit and a driver circuit) which need to operate at high speed to be favorably obtained.

Note that FIG. 17B illustrates, as an example, the semiconductor device in which the memory cell array 551 has a stack of the memory cell array 551a and the memory cell array 551b; however, the number of stacked memory cell arrays is not limited to two. For the memory cell array 551, a stack of three or more memory cell arrays may be used, or only one memory cell array may be used.

The transistor 562 is formed using an oxide semiconductor, and any of the transistors described in the above embodiment can be used as the transistor 562. Since the off-state current of the transistor including an oxide semiconductor is low, stored data can be retained for a long period. In other words, the frequency of refresh operation can be extremely low, which leads to a sufficient reduction in power consumption.

A semiconductor device having a novel feature can be obtained by being provided with both a peripheral circuit which includes the transistor including a material other than an oxide semiconductor (in other words, a transistor capable of operating at sufficiently high speed) and a memory circuit which includes the transistor including an oxide semiconductor (in a broader sense, a transistor whose off-state current is sufficiently low). In addition, with a structure where the peripheral circuit and the memory circuit are stacked, an increase in the degree of integration of the semiconductor device can be achieved.

As described above, a miniaturized and highly-integrated semiconductor device having high electric characteristics can be provided.

This embodiment can be combined as appropriate with any of the other embodiments in this specification.

Embodiment 7

In this embodiment, a model of crystal growth of a CAAC-OS film which can be used for any of the transistors described in the above embodiments is described with reference to FIGS. 18A and 18B, FIGS. 19A to 19C, and FIGS. 20A and 20B.

Figure 18A:
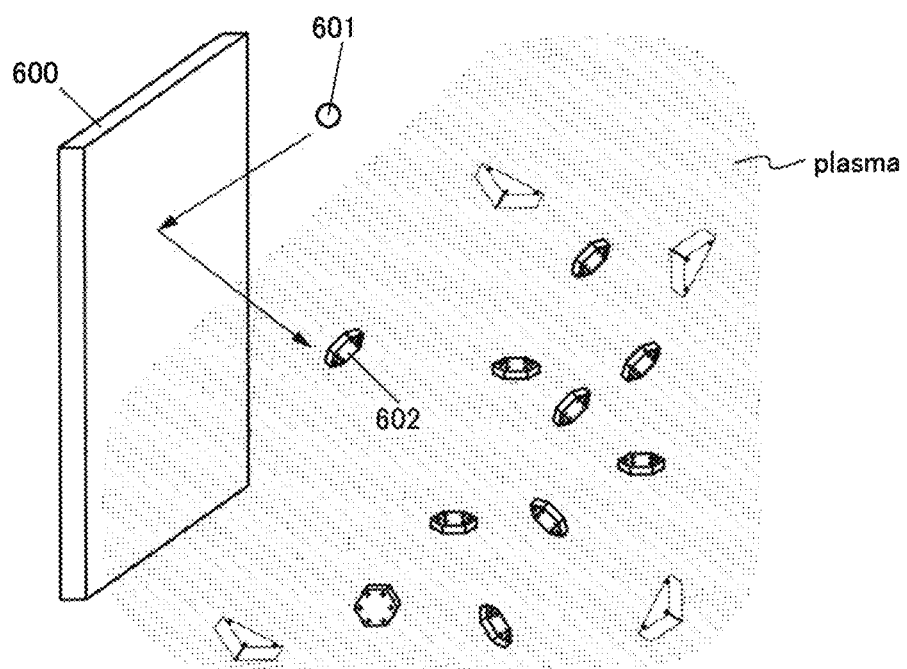
FIGS. 18A and 18B are schematic views illustrating sputtered particles separated from a sputtering target.
Figure 18B:
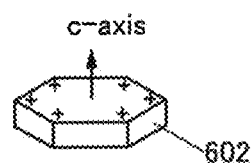

FIG. 18A is a schematic diagram showing how an ion 601 collides with a sputtering target 600 and a sputtered particle 602 is separated. Note that the sputtered particle 602 may have a hexagonal cylinder shape whose hexagonal plane is parallel to the a-b plane or a triangular prism shape. In such a case, a direction perpendicular to the hexagonal plane or the triangular plane is a c-axis direction (see FIG. 18B). The diameter (equivalent circle diameter) of the plane parallel to the a-b plane of the sputtered particle 602, although depending on the kind of oxide, is approximately greater than or equal to 1 nm and less than or equal to 30 nm or greater than or equal to 1 nm and less than or equal to 10 nm. Note that an oxygen cation is used as the ion 601. Further, in addition to the oxygen cation, an argon cation may be used. Instead of the argon cation, a cation of another rare gas may be used.

With the use of the oxygen cation as the ion 601, plasma damage at the deposition can be alleviated. Thus, a reduction in the crystallinity of the sputtering target 600 or a change of the sputtering target 600 into an amorphous state, which is caused when the ion 601 collides with the surface of the sputtering target 600, can be suppressed.

It is preferable that the separated sputtered particle 602 be positively charged. However, there is no particular limitation on the timing at which the sputtered particle 602 is positively charged. Specifically, the sputtered particle 602 is in some cases positively charged by being exposed to plasma. Alternatively, the sputtered particle 602 is in some cases positively charged by receiving an electric charge at the collision of the ion 601. Further alternatively, the sputtered particle 602 is in some cases positively charged in such a manner that the ion 601 which is an oxygen cation is bonded to a side, top, or bottom surface of the sputtered particle 602.

In the sputtered particle 602, the corners of the hexagonal plane are positively charged, whereby positive charges of the hexagonal plane repel each other. Thus, the flat-plate shape of the sputtered particle 602 can be maintained.

It is preferable to use a direct-current (DC) power source to positively charge the corners of the hexagonal plane of the sputtered particle 602. Note that a radio frequency (RF) power source or an alternating-current (AC) power source can be used. Note that it is difficult to use an RF power source for a sputtering apparatus which is capable of deposition to a large substrate. In addition, a DC power source is preferred to an AC power source from the viewpoint below.

Figure 19A:
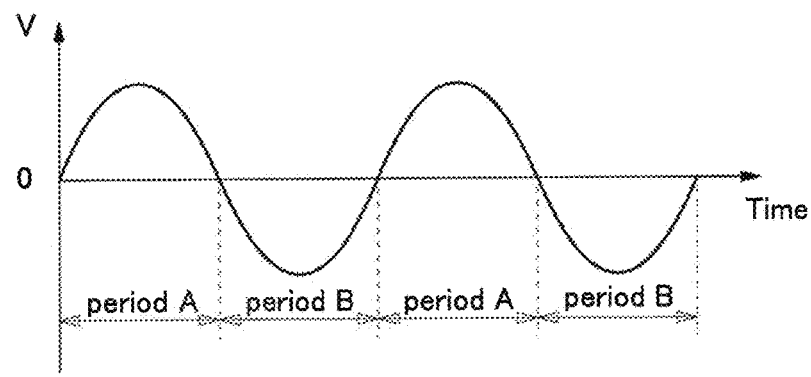
Figure 19A:
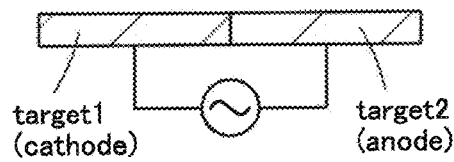
Figure 19A:
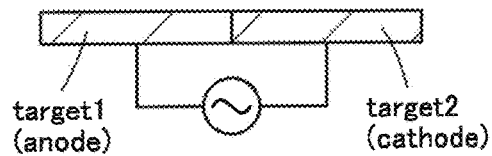
Figure 19C:
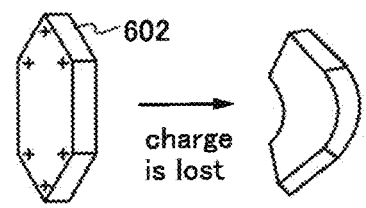

In the case where the AC power source is used, adjacent targets alternately have a cathode potential and an anode potential. In a period A shown in FIG. 19A, a target 1 functions as a cathode and a target 2 functions as an anode as illustrated in FIG. 19B1. In a period B shown in FIG. 19A, the target 1 functions as an anode and the target 2 functions as a cathode as illustrated in FIG. 19B2. The total time of the period A and the period B is 20 μsec to 50 μsec and the period A and the period B are repeated at a constant frequency.

In the case where the sputtered particle 602 is positively charged, positive charges in the sputtered particle 602 repel each other, whereby the flat-plate shape of the sputtered particles 602 can be maintained. However, in the case where the AC power source is used, there is time during which an electric field is not applied instantaneously; thus, some charges of the sputtered particle 602 are lost and the structure of the sputtered particle might be broken (see FIG. 19C). Thus, a DC power source is preferred to an AC power source.

Figure 20A:
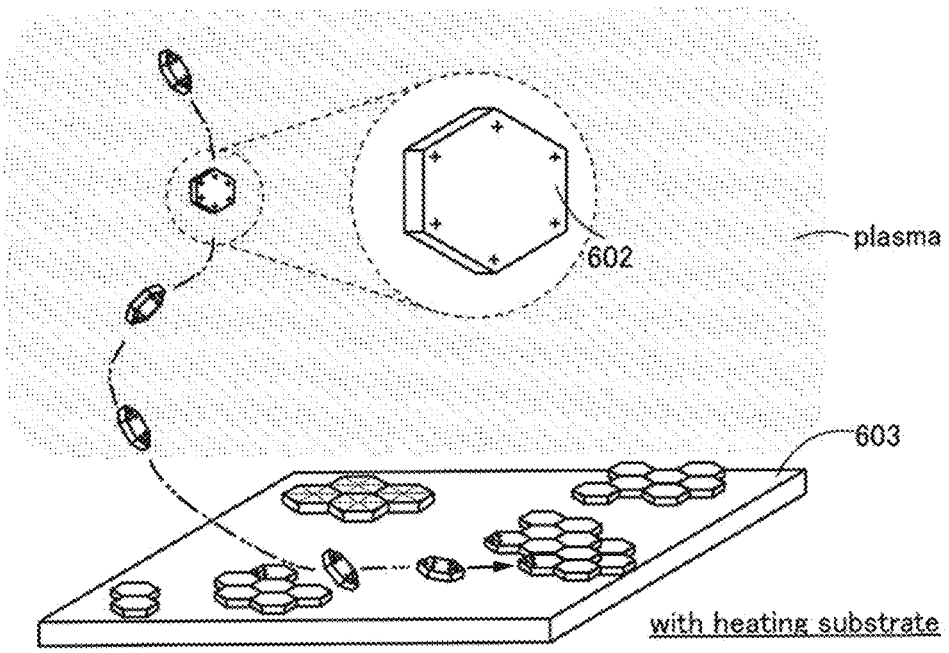
FIGS. 20A and 20B are schematic views illustrating a situation where sputtered particles which are not charged reach a deposition surface.
Figure 20B:
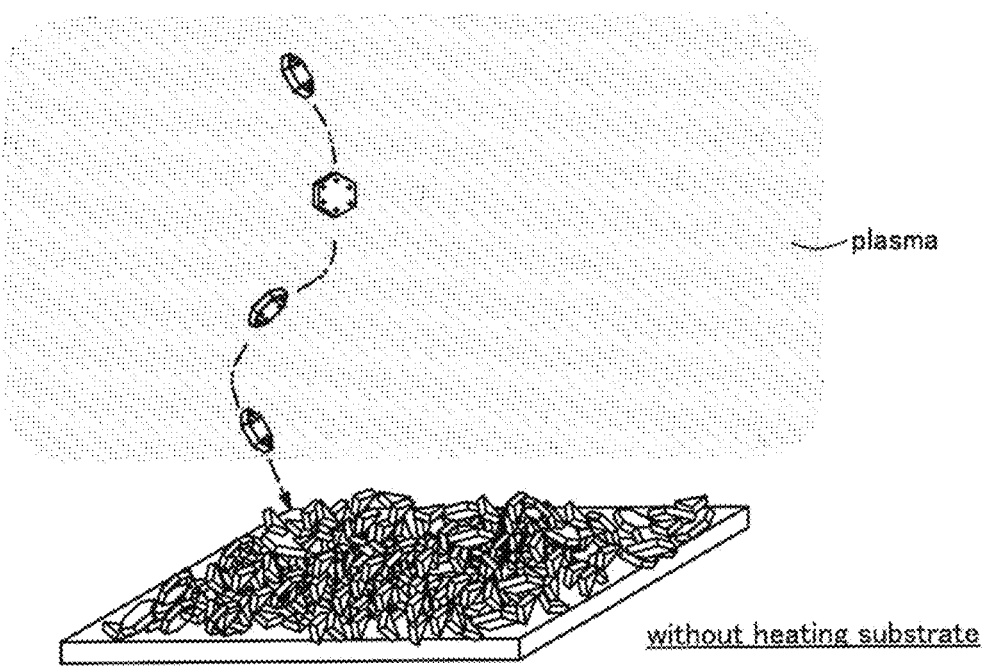

A description on how a sputtered particle is deposited on a deposition surface is given with reference to FIGS. 20A and 20B. FIG. 20A illustrates the case where deposition is performed with substrate heating and FIG. 20B illustrates a case where deposition is performed without substrate heating.

As illustrated in FIG. 20A, in the case where substrate heating is performed, one sputtered particle 602 moves to a region of a deposition surface 603 where other sputtered particles 602 have not been deposited yet, and migration of the sputtered particle 602 occurs, whereby the sputtered particle 602 is bonded to the sides of the sputtered particles which are already deposited.

The CAAC-OS film which is obtained by such a mechanism has high crystallinity even on an amorphous surface, a surface of an amorphous insulating film, a surface of an amorphous oxide film, or the like.

As illustrated in FIG. 20B, in the case where substrate heating is not performed, the sputtered particles 602 fall irregularly to the deposition surface 603. Thus, the sputtered particles 602 are deposited randomly also in a region where other sputtered particles 602 are already deposited. That is, an oxide film which is obtained by the deposition has neither a uniform thickness nor a uniform crystal orientation. The oxide film which is obtained in the above manner is the one which includes a crystal part because the crystallinity of flat plate-like sputtered particles 602 is maintained to some extent.

As described above, the diameter of the plane of the sputtered particle 602 which is parallel to the a-b plane is, for example, approximately greater than or equal to 1 nm and less than or equal to 30 nm or greater than or equal to 1 nm and less than or equal to 10 nm, and a crystal part included in the formed oxide film is smaller than the sputtered particle 602 in some cases. The oxide film includes a crystal part with a size of, for example, 10 nm or less or 5 nm or less in some cases. The oxide film including such a crystal part is referred to as a nanocrystalline (nc) oxide film.

The nanocrystalline oxide film is macroscopically equivalent to a film having disordered atomic arrangement. For this reason, in some cases, a peak indicating an orientation is not observed in X-ray diffraction (XRD) analysis which is performed on a large area of a measurement sample (for example, in which the beam diameter is larger than that of the sputtered particle 602). Further, in some cases, an electron diffraction pattern obtained by using an electron beam with a diameter larger than that of the sputtered particle 602 is a halo pattern. In this case, for example, a nanocrystalline oxide film is measured with an electron beam having a beam diameter much smaller than the sputtered particle 602, whereby a spot (bright spot) can be observed in the obtained nanobeam electron diffraction pattern.

Electron diffraction patterns of nanocrystalline oxide semiconductor films are described with reference to FIGS. 54A to 54D, FIGS. 55A and 55B, FIGS. 56A to 56C, FIG. 57, FIG. 58, FIGS. 59A and 59B, and FIG. 60.

An electron diffraction pattern obtained by electron diffraction with a beam diameter of 10 nmφ or less (nanobeam electron diffraction) of a nanocrystalline oxide semiconductor film is neither a halo pattern indicating an amorphous state nor a pattern with spots having regularity indicating a crystalline state in which crystals are aligned with a specific plane. That is, the nanocrystalline oxide semiconductor film is an oxide semiconductor film whose electron diffraction pattern has spots not having directionality.

Figure 54A:
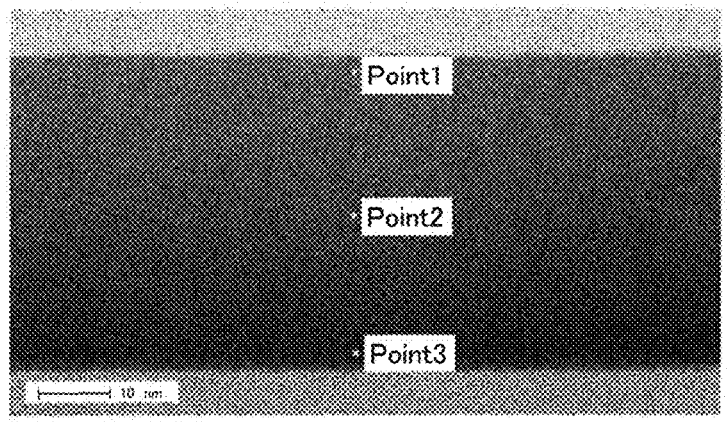
FIGS. 54A to 54D show a cross-sectional TEM image and electron diffraction patterns of a nanocrystalline oxide semiconductor film.
Figure 54B:
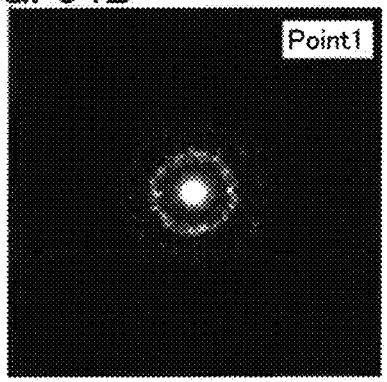
Figure 54C:
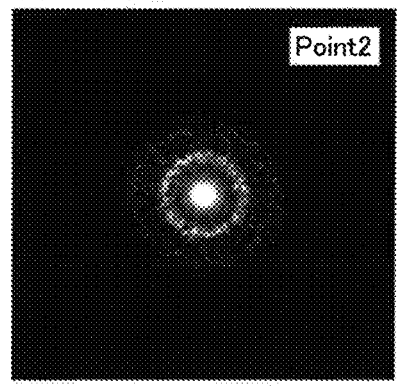
Figure 54D:
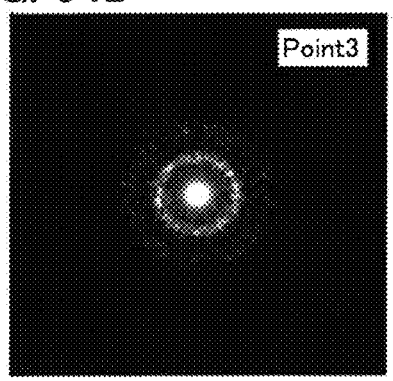

FIG. 54A is a cross-sectional transmission electron microscopy (TEM) image of a nanocrystalline oxide semiconductor film. FIGS. 54B, 54C, and 54D show electron diffraction patterns obtained by nanobeam electron diffraction performed on Points 1, 2, 3 in FIG. 54A, respectively.

A sample in which an In—Ga—Zn-based oxide film was formed, as an example of the nanocrystalline oxide semiconductor film in FIGS. 54A to 54D, over a quartz glass substrate to a thickness of 50 nm was used. The nanocrystalline oxide semiconductor film shown in FIGS. 54A to 54D was formed under the following conditions: an oxide target containing In, Ga, and Zn at an atomic ratio of 1:1:1 was used, the atmosphere was an oxygen atmosphere (flow rate of 45 sccm), the pressure was 0.4 Pa, a direct current (DC) power of 0.5 kW was applied, and the substrate temperature was room temperature. Then, the width of the formed nanocrystalline oxide semiconductor film was reduced to 100 nm or less (e.g., 40 nm±10 nm), and a cross-sectional TEM image and nanobeam electron diffraction patterns were obtained.

FIG. 54A is the cross-sectional TEM image of the nanocrystalline oxide semiconductor film which was taken with a transmission electron microscope ("H-9000NAR" manufactured by Hitachi High-Technologies Corporation) at an acceleration voltage of 300 kV and at a magnification of 2,000,000-fold. FIGS. 54B to 54D show the electron diffraction patterns obtained by nanobeam electron diffraction with a beam diameter of about 1 nmϕ, with a transmission electron microscope ("HF-2000" manufactured by Hitachi High-Technologies Corporation) at an acceleration voltage of 200 kV. Note that the measurement area of the nanobeam electron diffraction with a beam diameter of about 1 nmϕ is greater than or equal to 5 nmϕ and less than or equal to 10 nmϕ.

As shown in FIG. 54B, in the nanobeam electron diffraction pattern of the nanocrystalline oxide semiconductor film, a plurality of circumferentially arranged spots (bright points) are observed. In other words, in the pattern of the nanocrystalline oxide semiconductor film, a plurality of circumferentially (concentrically) distributed spots are observed, or a plurality of circumferentially distributed spots form a plurality of concentric circles.

In FIG. 54C showing the central portion of the nanocrystalline oxide semiconductor film in the thickness direction and in FIG. 54D showing the vicinity of an interface between the nanocrystalline oxide semiconductor film and the quartz glass substrate, a plurality of circumferentially distributed spots are observed as in FIG. 54B. In FIG. 54C, the distance from a main spot to each of the circumferentially distributed spots is in the range from 3.88/nm to 4.93/nm, or from 0.203 nm to 0.257 nm when converted into interplanar spacing.

Figure 55A:
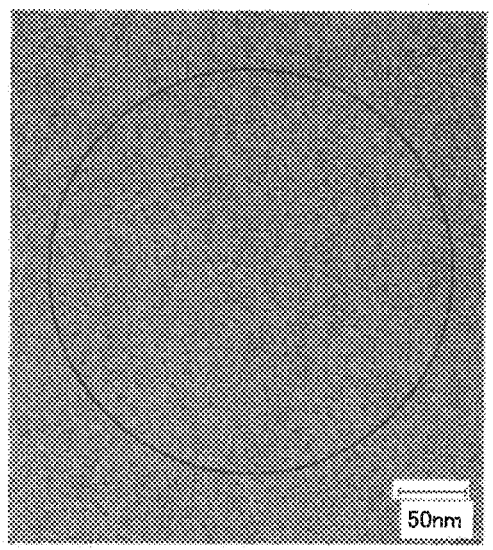
FIGS. 55A and 55B are a TEM image and electron diffraction patterns of a nanocrystalline oxide semiconductor film.
Figure 55B:
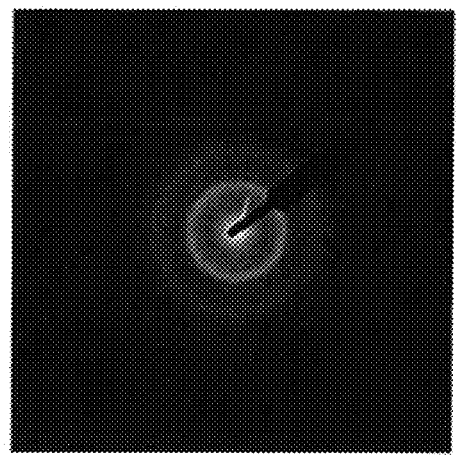

The nanobeam electron diffraction patterns shown in FIGS. 54B to 54D indicate that the nanocrystalline oxide semiconductor film includes a plurality of crystal parts whose surface orientations are random and whose sizes are different from each other FIG. 55A is a plane TEM image of a nanocrystalline oxide semiconductor film. FIG. 55B shows an electron diffraction pattern obtained by selected-area electron diffraction performed on a region surrounded by a circle in FIG. 55A.

A sample in which an In—Ga—Zn-based oxide film was formed, as an example of the nanocrystalline oxide semiconductor film shown in FIGS. 55A and 55B, over a quartz glass substrate to a thickness of 30 nm was used. The nanocrystalline oxide semiconductor film shown in FIGS. 55A and 55B was formed under the following conditions: an oxide target containing In, Ga, and Zn at an atomic ratio of 1:1:1 was used, the atmosphere was an oxygen atmosphere (flow rate of 45 sccm), the pressure was 0.4 Pa, a direct current (DC) power of 0.5 kW was applied, and the substrate temperature was room temperature. Then, the sample was thinned, and the plane TEM image and the selected-area electron diffraction pattern of the nanocrystalline oxide semiconductor film were obtained.

FIG. 55A is the plane TEM image of the nanocrystalline oxide semiconductor film which was taken with a transmission electron microscope ("H-9000NAR" manufactured by Hitachi High-Technologies Corporation) at an acceleration voltage of 300 kV and at a magnification of 500,000-fold. FIG. 55B is the electron diffraction pattern obtained by electron diffraction with a selected area of 300 nmϕ. Note that the measurement area in FIG. 55B is greater than or equal to 300 nmϕ in consideration of electron beam expansion (about several nanometers).

As shown in FIG. 55B, the electron diffraction pattern of the nanocrystalline oxide semiconductor film which was obtained by selected-area electron diffraction the measurement area of which is wider than that of the nanobeam electron diffraction is a halo pattern, in which the plurality of spots observed by the nanobeam electron diffraction are not observed.

Figure 56A:
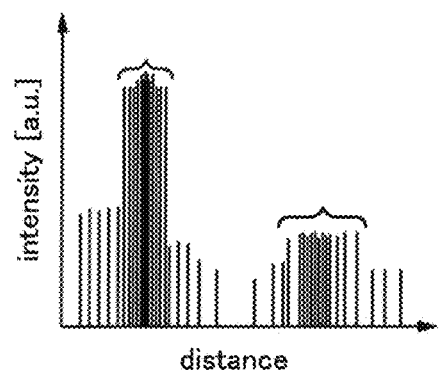
FIGS. 56A to 56C are conceptual diagrams of electron diffraction intensity distribution.
Figure 56B:
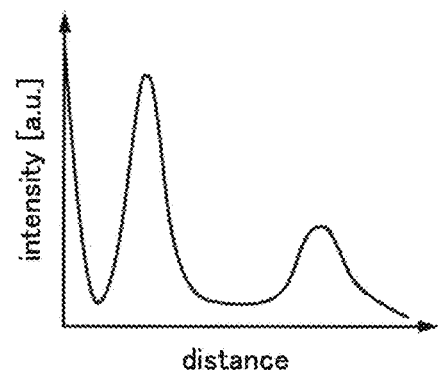
Figure 56C:
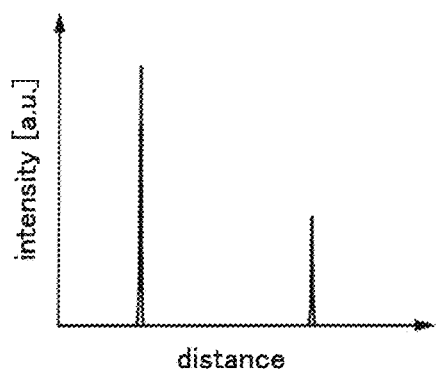

FIGS. 56A to 56C conceptually show diffraction intensity distribution in the electron diffraction patterns shown in FIGS. 54B to 54D and FIG. 55B. FIG. 56A is a conceptual diagram showing diffraction intensity distribution in the nanobeam electron diffraction patterns shown in FIGS. 54B to 54D. FIG. 56B is a conceptual diagram showing diffraction intensity distribution in the selected-area electron diffraction pattern shown in FIG. 55B. FIG. 56C is a conceptual diagram showing diffraction intensity distribution in an electron diffraction pattern of a single crystal structure or a polycrystalline structure.

In each of FIGS. 56A to 56C, the vertical axis represents the electron diffraction intensity (arbitrary unit) indicating distribution of spots or the like and the horizontal axis represents the distance from a main spot.

In FIG. 56C for the single crystal structure or the polycrystalline structure, peaks are each observed at a specific distance from the main spot, which is based on interplanar spacing (d value) between planes with which crystal parts are aligned.

As shown in each of FIGS. 54B to 54D, a circumferential region formed by the plurality of spots observed in the nanobeam electron diffraction pattern of the nanocrystalline oxide semiconductor film has a relatively large width. Thus, FIG. 56A shows discrete distribution. Further, in the nanobeam electron diffraction pattern, a region with high luminance formed by spots which are not clear is observed in a region between concentric circles.

Further, the electron diffraction intensity distribution in the selected-area electron diffraction pattern of the nanocrystalline oxide semiconductor film is continuous as shown in FIG. 56B. Since FIG. 56B can approximate a result obtained by widely observing the electron diffraction intensity distribution shown in FIG. 56A, the continuous intensity distribution can be considered to result from the overlapping and connection of the plurality of spots.

FIGS. 56A to 56C indicate that the nanocrystalline oxide semiconductor film includes a plurality of crystal parts whose surface orientations are random and whose sizes are different from each other and that the crystal parts are so minute that spots are not observed in the selected-area electron diffraction pattern.

In FIGS. 54B to 54D in which the plurality of spots are observed, the width of the nanocrystalline oxide semiconductor film is 50 nm or less. Further, since the diameter of the electron beam was reduced to 1 nmϕ, the measurement area is greater than or equal to 5 nm and less than or equal to 10 nm. Thus, it is assumed that the diameter of the crystal part included in the nanocrystalline oxide semiconductor film is 50 nm or less, for example, 10 nm or less or 5 nm or less.

Figure 57:
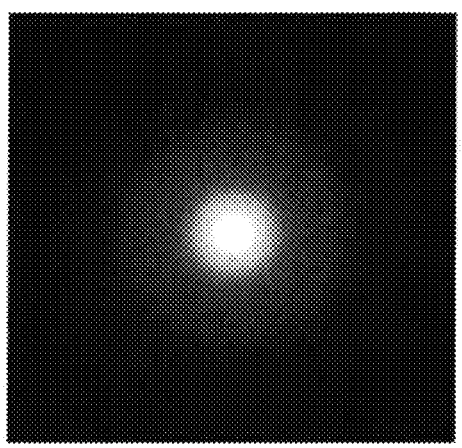
FIG. 57 shows a nanobeam electron diffraction pattern of a quartz glass substrate.

FIG. 57 shows a nanobeam electron diffraction pattern of a quartz glass substrate. The measurement conditions for FIG. 57 were similar to those for FIGS. 54B to 54D.

As shown in FIG. 57, the nanobeam electron diffraction pattern of the quartz glass substrate having an amorphous structure is a halo pattern without specific spots in which the luminance is gradually changed form a main spot. This means that a plurality of circumferentially distributed spots like those observed in the pattern of the nanocrystalline oxide semiconductor film are not observed in the pattern of a film having an amorphous structure even when electron diffraction is performed on a minute region. This indicates that the plurality of circumferentially distributed spots observed in FIGS. 54B to 54D are peculiar to the nanocrystalline oxide semiconductor film.

Figure 58:
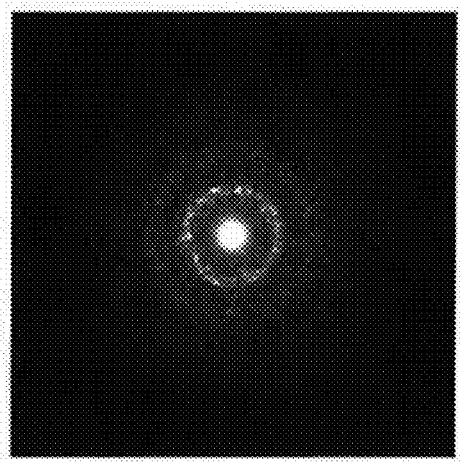
FIG. 58 shows an electron diffraction pattern of a nanocrystalline oxide semiconductor film.

FIG. 58 shows an electron diffraction pattern obtained after one-minute irradiation of Point 2 in FIG. 54A with an electron beam whose diameter was reduced to about 1 nmϕ.

As in the electron diffraction pattern shown in FIG. 54C, a plurality of circumferentially distributed spots are observed in the electron diffraction pattern shown in FIG. 58, and there is no significant difference from FIG. 54C. This means that the crystal part observed in the electron diffraction pattern shown in FIG. 54C existed at the time of the formation of the nanocrystalline oxide semiconductor film and did not result from irradiation with the electron beam with the reduced diameter.

Figure 59A:
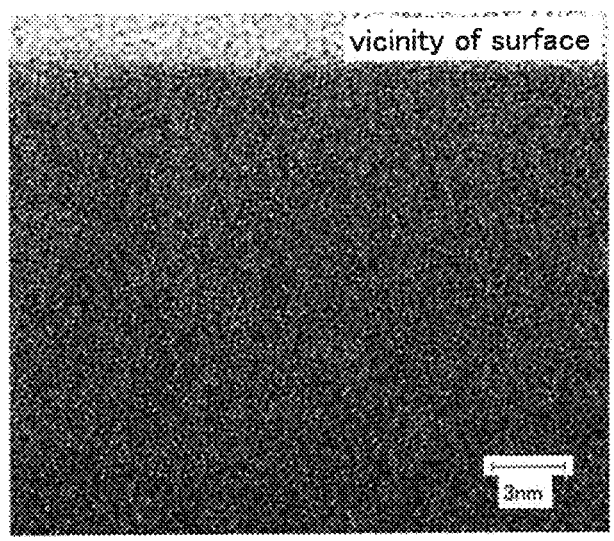
FIGS. 59A and 59B each show a cross-sectional TEM image of a nanocrystalline oxide semiconductor film.
Figure 59B:
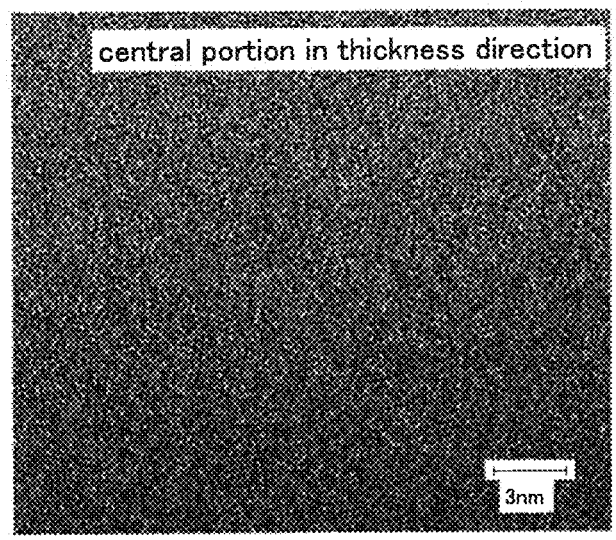

FIGS. 59A and 59B are enlarged images of portions in the cross-sectional TEM image of FIG. 54A. FIG. 59A is a cross-sectional TEM image of the vicinity of Point 1 (the surface of the nanocrystalline oxide semiconductor film) in FIG. 54A, which was observed at a magnification of 8,000,000-fold. FIG. 59B is a cross-sectional TEM image of the vicinity of Point 2 (the central portion of the nanocrystalline oxide semiconductor film in the thickness direction) in FIG. 54A, which was observed at a magnification of 8,000,000-fold.

According to each of the TEM images of FIGS. 59A and 59B, a crystalline structure cannot be clearly observed in the nanocrystalline oxide semiconductor film.

Figure 60:
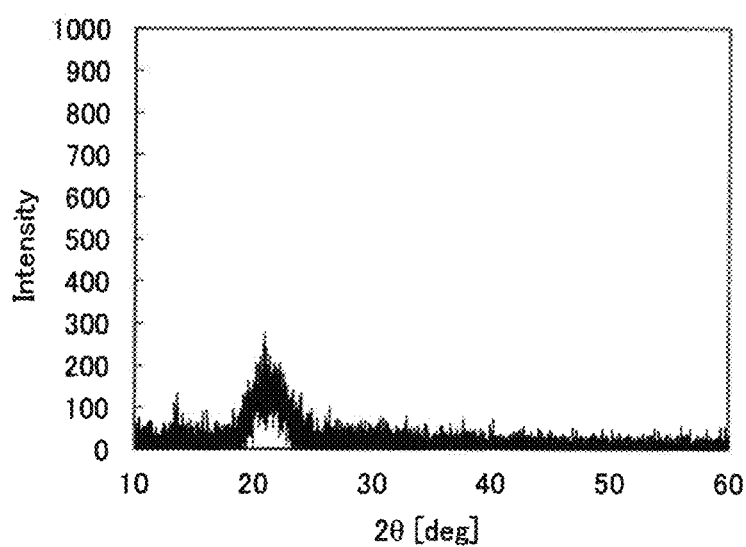
FIG. 60 shows X-ray diffraction analysis results of a metal oxide film of a nanocrystalline oxide semiconductor film.

The samples in each of which the nanocrystalline oxide semiconductor film of this embodiment was formed over the quartz glass substrate, which were used for FIGS. 54A to 54D and FIGS. 55A and 55B, were analyzed by X-ray diffraction (XRD). FIG. 60 shows an XRD spectrum of the samples measured by an out-of-plane method.

In FIG. 60, the vertical axis represents the X-ray diffraction intensity (arbitrary unit) and the horizontal axis represents the diffraction angle 2θ (degree). Note that the XRD spectrum was measured with an X-ray diffractometer, D8 ADVANCE manufactured by Bruker AXS.

As shown in FIG. 60, a peak corresponding to quartz is observed at around 2θ=20° to 23°; however, a peak corresponding to the crystal part included in the nanocrystalline oxide semiconductor film cannot be observed.

The results in FIGS. 59A and 59B and FIG. 60 also indicate that the crystal part included in the nanocrystalline oxide semiconductor film is minute.

As described above, in the case of the nanocrystalline oxide semiconductor film of this embodiment, a peak indicating an orientation was not observed by X-ray diffraction (XRD) analysis the measurement area of which is wide and the electron diffraction pattern obtained by selected-area electron diffraction the measurement area of which is wide is a halo pattern. This indicates that the nanocrystalline oxide semiconductor film of this embodiment is macroscopically equivalent to a film having disordered atomic arrangement. However, spots (bright points) can be observed in the nanobeam electron diffraction pattern of the nanocrystalline oxide semiconductor film which was obtained by nanobeam electron diffraction in which the diameter of an electron beam is sufficiently small (e.g., 10 nmϕ or less). Thus, it can be assumed that the nanocrystalline oxide semiconductor film of this embodiment is a film in which minute crystal parts having random surface orientations (e.g., crystal parts each with a diameter of 10 nm or less, 5 nm or less, or 3 nm or less) cohere. A nanocrystal region including the minute crystal parts is included in the entire region of the nanocrystalline oxide semiconductor film in the thickness direction.

Note that the deposition surface 603 is preferably an insulating surface. When the deposition surface 603 is an insulating surface, the sputtered particles 602 which are deposited on the deposition surface 603 are unlikely to loose positive charges. However, in the case where the deposition rate of the sputtered particles 602 is lower than the rate at which a positive charge is lost, the deposition surface 603 may have conductivity. The deposition surface 603 is preferably an amorphous surface or an amorphous insulating surface.

With the use of a sputtering target in the way described above, an oxide film having a uniform thickness and a uniform crystal orientation can be formed.

This embodiment can be combined as appropriate with any of the other embodiments in this specification.

Embodiment 8

In this embodiment, a sputtering target of one embodiment of the present invention is described.

The relative density of the sputtering target is higher than or equal to 90%, higher than or equal to 95%, or higher than or equal to 99%.

The sputtering target includes a polycrystalline oxide containing a plurality of crystal grains whose average grain size is less than or equal to 3 μm, preferably less than or equal to 2.5 μm, further preferably less than or equal to 2 μm.

Alternatively, the sputtering target includes a polycrystalline oxide containing a plurality of crystal grains, in which the proportion of crystal grains whose grain size is greater than or equal to 0.4 μm and less than or equal to 1 μm is higher than or equal to 8%, preferably higher than or equal to 15%, further preferably higher than or equal to 25%.

Note that the grain size of the crystal grain can be measured by electron backscatter diffraction (EBSD). The grain size of the crystal grain described here is calculated from a cross-sectional area of one crystal grain measured from a crystal grain map obtained by EBSD, assuming that the cross section of the crystal grain is a perfect circle. Specifically, when the cross-sectional area of the crystal grain is denoted by S and the radius of the cross section of the crystal grain is denoted by r, the radius r is calculated from a relation, $S=\pi r^2$ to obtain the grain size which can be represented by 2r (twice the radius r).

Further, the plurality of crystal grains included in the sputtering target have cleavage planes. The cleavage plane is a plane parallel to an a-b plane, for example.

When the plurality of crystal grains have a small gain size, a sputtered particle is separated from the cleavage plane by collision of an ion with the sputtering target. The separated sputtered particle has a flat-plate-like shape with upper and lower surfaces parallel to the cleavage plane. Further, owing to small grain sizes of the plurality of crystal grains, distortion in crystal is caused and a sputtered particle becomes easily separated from the cleavage plane.

Note that when the plurality of crystal grains included in the sputtering target are hexagonal crystals, flat-plate-like sputtered particles each have the shape of a hexagonal cylinder whose top and bottom surfaces are approximately equilateral hexagons each having interior angles of 120°.

Although sputtered particles are ideally single crystals, part of the sputtered particles may be changed into an amorphous state due to the impact of ion collision.

As such a polycrystalline oxide included in the sputtering target, an oxide containing In, M (M is Ga, Sn, Hf, Al, La, Ce, Pr, Nd, Sm, Eu, Gd, Tb, Dy, Ho, Er, Tm, Yb, or Lu), and Zn is used. The oxide containing In, M, and Zn is also referred to as In-M-Zn oxide.

Moreover, the atomic ratio of In to M and Zn contained in the In-M-Zn oxide is preferably close to the stoichiometric composition. When the atomic ratio of In, M, and Zn contained in the In-M-Zn oxide becomes close to the stoichiometric composition ratio, the crystallinity of the In-M-Zn oxide can be increased.

In the In-M-Zn oxide, a cleavage plane is, in many cases, a plane parallel to an a-b plane in which M and Zn are mixed.

A method for forming the above sputtering target is described with reference to FIGS. 21A and 21B.

Figure 21A:
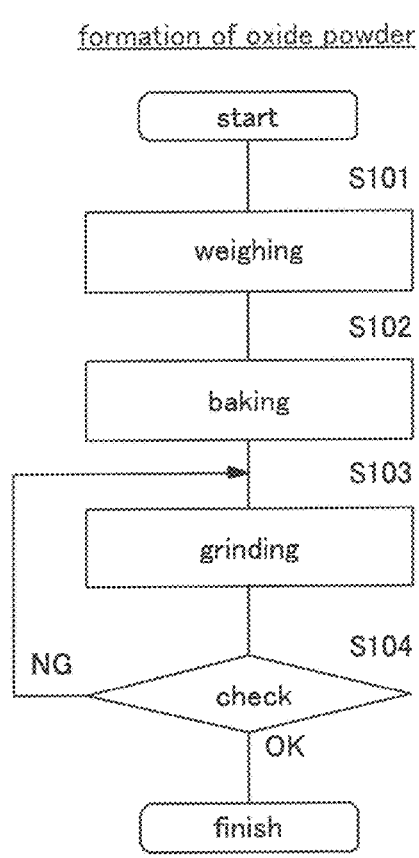
FIGS. 21A and 21B are flow charts showing an example of a method for manufacturing a sputtering target.

FIG. 21A shows formation of an oxide powder containing a plurality of metal elements to be a sputtering target. First, the oxide powder is weighed in Step S101.

Here, description is given on the case where an oxide powder containing In, M, and Zn (also referred to as an In-M-Zn oxide powder) is obtained as the oxide powder containing a plurality of metal elements. Specifically, an $InO_X$ oxide powder, an $MO_Y$ oxide powder, and a $ZnO_Z$ oxide powder are prepared as a raw material. Note that X, Y, and Z are each a given positive number; for example, X, Y, and Z are 1.5, 1.5, and 1, respectively. It is needless to say that the above oxide powders are an example, and oxide powders can be selected as appropriate in order to obtain a desired composition. Note that M refers to Ga, Sn, Hf, Al, La, Ce, Pr, Nd, Sm, Eu, Gd, Tb, Dy, Ho, Er, Tm, Yb, or Lu. Although the case where three kinds of oxide powders are used is shown as an example in this embodiment, one embodiment of the present invention is not limited thereto. For example, this embodiment may be applied to the case where four or more kinds of oxide powders are used or the case where one or two kinds of oxide powders are used.

Next, the $InO_X$ oxide powder, the $MO_Y$ oxide powder, and the $ZnO_Z$ oxide powder are mixed in a predetermined molar ratio.

For example, the predetermined molar ratio of the $InO_X$ oxide powder, the $MO_Y$ oxide powder, and the $ZnO_Z$ oxide powder is 2:2:1, 8:4:3, 3:1:1, 1:1:1, 4:2:3, 1:1:2, 3:1:4, 1:3:2, 1:3:4, 1:3:6, 1:3:8, 1:3:10, 1:3:12, 1:6:4, 1:6:6, 1:6:8, 1:6:10, 1:6:12, 1:6:14, 1:6:16, 1:6:20, or 3:1:2. With such a molar ratio, a sputtering target including a polycrystalline oxide with high crystallinity can be obtained easily later.

Next, in Step S102, an In-M-Zn oxide is obtained by performing first baking on the $InO_X$ oxide powder, the $MO_Y$ oxide powder, and the $ZnO_Z$ oxide powder which are mixed in a predetermined molar ratio.

Note that the first baking is performed in an inert atmosphere, an oxidation atmosphere, or a reduced-pressure atmosphere at a temperature higher than or equal to 400° C. and lower than or equal to 1700° C., preferably higher than or equal to 900° C. and lower than or equal to 1500° C. The first baking is performed for longer than or equal to 3 minutes and shorter than or equal to 24 hours, preferably longer than or equal to 30 minutes and shorter than or equal to 17 hours, more preferably longer than or equal to 30 minutes and shorter than or equal to 5 hours, for example. When the first baking is performed under the above conditions, secondary reactions other than the main reaction can be suppressed, and the concentration of impurities in the In-M-Zn oxide powder can be reduced. Accordingly, the crystallinity of the In-M-Zn oxide powder can be increased.

The first baking may be performed plural times at different temperatures and/or in different atmospheres. For example, the In-M-Zn oxide powder may be first held at a first temperature in a first atmosphere and then at a second temperature in a second atmosphere. Specifically, it is preferable that the first atmosphere be an inert atmosphere or a reduced-pressure atmosphere and the second atmosphere be an oxidation atmosphere. This is because oxygen vacancy is generated in the In-M-Zn oxide when impurities contained in the In-M-Zn oxide powder are reduced in the first atmosphere. Therefore, it is preferable that oxygen vacancy in the obtained In-M-Zn oxide be reduced in the second atmosphere. The concentration of impurities contained in the In-M-Zn oxide is decreased and oxygen vacancy is reduced, whereby the crystallinity of the In-M-Zn oxide powder can be increased.

Next, the In-M-Zn oxide powder is obtained by grinding the In-M-Zn oxide in Step S103.

The In-M-Zn oxide has many surface structures of planes parallel to the a-b plane. Therefore, the obtained In-M-Zn oxide powder includes many flat plate-like crystal grains whose top and bottom surfaces are parallel to the a-b plane. Moreover, the crystal of the In-M-Zn oxide is in many cases a hexagonal crystal; therefore, in many cases, the above flat plate-like crystal grains each have the shape of a hexagonal cylinder whose top and bottom surfaces are approximately equilateral hexagons each having internal angles of 120°.

Next, the grain size of the obtained In-M-Zn oxide powder is checked in Step S104. Here, the average grain size of the In-M-Zn oxide powder is checked to be less than or equal to 3 μm, preferably less than or equal to 2.5 μm, further preferably less than or equal to 2 μm. Note that Step S104 may be skipped and only the In-M-Zn oxide powder whose grain size is less than or equal to 3 μm, preferably less than or equal to 2.5 μm, further preferably less than or equal to 2 μm may be sifted using a grain size filter. The average grain size of the In-M-Zn oxide powder can be certainly less than or equal to 3 μm, preferably less than or equal to 2.5 μm, further preferably less than or equal to 2 μm by sifting the In-M-Zn oxide powder to have the grain size which is less than or equal to 3 μm, preferably less than or equal to 2.5 μm, further preferably less than or equal to 2 μm.

In the case where the average grain size of the In-M-Zn oxide powder exceeds a predetermined size in Step S104, the procedure returns to Step S103 and the In-M-Zn oxide powder is ground again.

In the above manner, the In-M-Zn oxide powder whose average grain size is less than or equal to 3 μm, preferably less than or equal to 2.5 μm, further preferably less than or equal to 2 μm can be obtained. Note that the average grain size of the obtained In-M-Zn oxide powder is less than or equal to 3 μm, preferably less than or equal to 2.5 μm, further preferably less than or equal to 2 μm, which enables the grain size of a crystal grain included in a sputtering target that is to be formed later to be reduced.

Figure 21B:
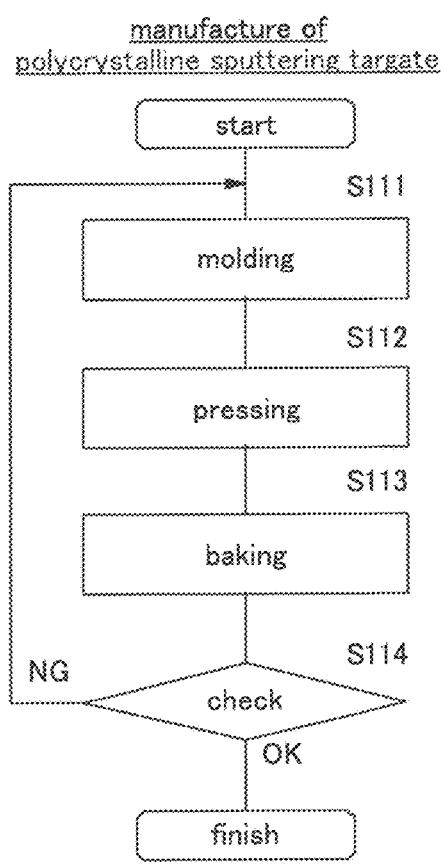

Next, FIG. 21B shows a method for manufacturing a sputtering target using the In-M-Zn oxide powder obtained as shown in the flow chart in FIG. 21A.

In Step S111, the In-M-Zn oxide powder is molded. Here, molding refers to spreading powder or the like over a mold to obtain a uniform thickness. Specifically, the In-M-Zn oxide powder is introduced to the mold, and then vibration is externally applied so that the In-M-Zn oxide powder is molded. Alternatively, the In-M-Zn oxide powder is introduced to the mold, and then molding is performed using a roller or the like so as to obtain a uniform thickness. Note that in Step S111, slurry in which the In-M-Zn oxide powder is mixed with water, a dispersant, and a binder may be molded. In that case, the slurry is poured into the mold and then molded by sucking the slurry from the bottom of the mold. After that, drying treatment is performed on a molded body after the slurry is sucked. The drying treatment is preferably natural drying because the molded body is less likely to be cracked. After that, the molded body is subjected to heat treatment at a temperature higher than or equal to 300° C. and lower than or equal to 700° C., so that residual moisture or the like which cannot be taken out by natural drying is removed.

When the In-M-Zn oxide powder including many flat plate-like crystal grains whose top and bottom surfaces are parallel to the a-b plane is molded, the crystal grains are arranged with the planes which are parallel to the a-b plane thereof facing upward. Therefore, the proportion of the surface structures of planes parallel to the a-b plane can be increased in such a manner that the obtained In-M-Zn oxide powder is molded. Note that the mold may be formed of a metal or an oxide and the upper shape thereof is rectangular or rounded.

Next, first pressure treatment is performed on the In-M-Zn oxide powder in Step S112. After that, in Step S113, second baking is performed to obtain a plate-like In-M-Zn oxide. The second baking is performed under conditions similar to those of the first baking. The crystallinity of the In-M-Zn oxide can be increased by performing the second baking.

Note that the first pressure treatment may be performed in any manner as long as the In-M-Zn oxide powder can be pressed. For example, a weight which is formed of the same kind of material as the mold can be used. Alternatively, the In-M-Zn oxide powder may be pressed under high pressure using compressed air. Besides, the first pressure treatment can be performed using a variety of techniques. Note that the first pressure treatment may be performed at the same time as the second baking.

Planarization treatment may be performed after the first pressure treatment. As the planarization treatment, chemical mechanical polishing (CMP) treatment or the like can be employed.

The plate-like In-M-Zn oxide thus obtained becomes a polycrystalline oxide with high crystallinity.

Next, the thickness of the obtained plate-like In-M-Zn oxide is checked in Step S114. When the thickness of the plate-like In-M-Zn oxide is less than a desired thickness, the procedure returns to Step S111 and the In-M-Zn oxide powder is made to spread over the plate-like In-M-Zn oxide and molded. When the plate-like In-M-Zn oxide has a desired thickness, the plate-like In-M-Zn oxide is used as a sputtering target. The case where the thickness of the plate-like In-M-Zn oxide is less than a desired thickness is described below.

Then, in Step S112, second pressure treatment is performed on the plate-like In-M-Zn oxide and the In-M-Zn oxide powder over the plate-like In-M-Zn oxide. After that, in Step S113, third baking is performed, whereby a plate-like In-M-Zn oxide whose thickness is increased by the thickness of the In-M-Zn oxide powder is obtained. A plate-like In-M-Zn oxide with an increased thickness is obtained through crystal growth with the use of the plate-like In-M-Zn oxide as a seed crystal; therefore, the plate-like In-M-Zn oxide is a polycrystalline oxide with high crystallinity.

Note that the third baking may be performed under conditions similar to those of the second baking. The second pressure treatment may be performed under conditions similar to those of the first pressure treatment. The second pressure treatment may be performed at the same time as the third baking.

The thickness of the obtained plate-like In-M-Zn oxide is checked again in Step S114.

Through the above steps, the thickness of the plate-like In-M-Zn oxide can be gradually increased while the crystal alignment is improved.

By repeating these steps of increasing the thickness of the plate-like In-M-Zn oxide n (n is a natural number) times, the plate-like In-M-Zn oxide having a desired thickness (t), for example, greater than or equal to 2 mm and less than or equal to 20 mm, preferably greater than or equal to 3 mm and less than or equal to 20 mm can be obtained. The plate-like In-M-Zn oxide is used as a sputtering target.

After that, planarization treatment may be performed.

Note that fourth baking may be performed on the obtained sputtering target. The fourth baking is performed under conditions similar to those of the first baking. A sputtering target including a polycrystalline oxide with much higher crystallinity can be obtained by performing the fourth baking.

In the above manner, the sputtering target which includes a polycrystalline oxide containing a plurality of crystal grains having cleavage planes parallel to the a-b plane and a small average grain size can be formed.

Note that the sputtering target formed in such a manner can have high density. When the density of the sputtering target is increased, the density of a film to be deposited can also be increased. Specifically, the relative density of the sputtering target can be set higher than or equal to 90%, preferably higher than or equal to 95%, further preferably higher than or equal to 99%.

This embodiment can be combined as appropriate with any of the other embodiments in this specification.

Embodiment 9

In this embodiment, observation results of electron diffraction patterns of a CAAC-OS film which can be used for one embodiment of the present invention are described.

The CAAC-OS film used in this embodiment is an In—Ga—Zn-based oxide film which is formed by a sputtering method using a sputtering gas containing oxygen and a target of an In—Ga—Zn oxide (having an atomic ratio of In:Ga:Zn=1:1:1). The above embodiment can be referred to for detailed description of a manufacturing method and the like of the CAAC-OS film.

Figure 45:
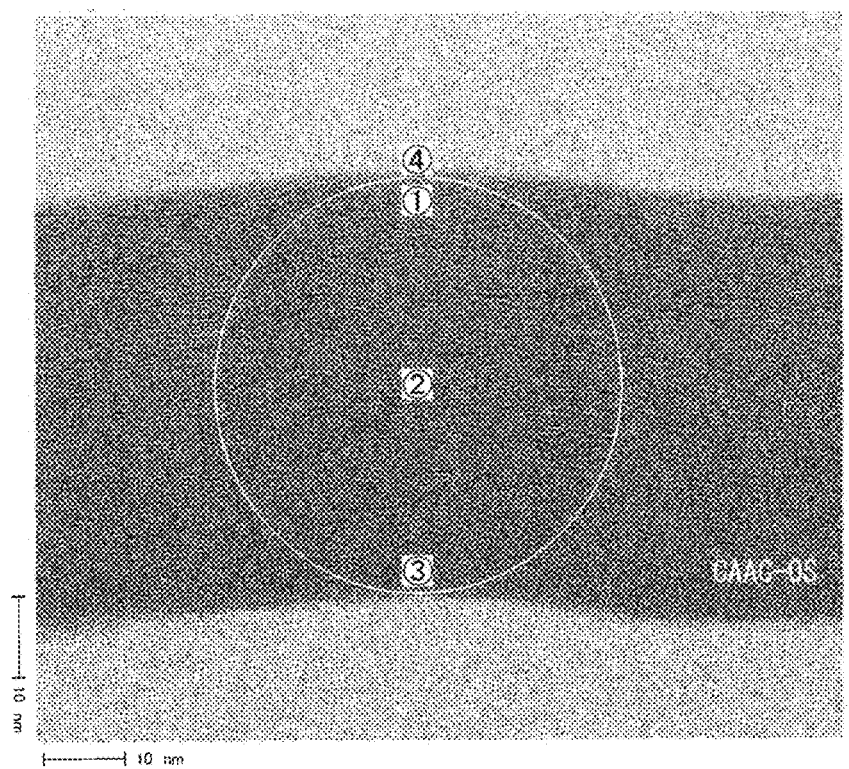
FIG. 45 shows a cross-sectional TEM image of a CAAC-OS film.

FIG. 45 is a cross-sectional transmission electron microscopy (TEM) image of the CAAC-OS film. FIGS. 46A to 46D show electron diffraction patterns which were obtained by measurement of Points 1 to 4 in FIG. 45 using electron diffraction.

The cross-sectional TEM image shown in FIG. 45 was taken with a transmission electron microscope ("H-9000NAR" manufactured by Hitachi High-Technologies Corporation) at an acceleration voltage of 300 kV and a magnification of 2,000,000-fold. The electron diffraction patterns shown in FIGS. 46A to 46D were obtained with a transmission electron microscope ("HF-2000" manufactured by Hitachi High-Technologies Corporation) at an acceleration voltage of 200 kV and beam diameters of about 1 nmϕ and about 50 nmϕ. Note that electron diffraction with a beam diameter of 10 nmϕ is particularly referred to as nanobeam electron diffraction in some cases. Further, a measurement area of the electron diffraction with a beam diameter of about 1 nmϕ is greater than or equal to 5 nmϕ and less than or equal to 10 nmϕ.

Figure 46A:
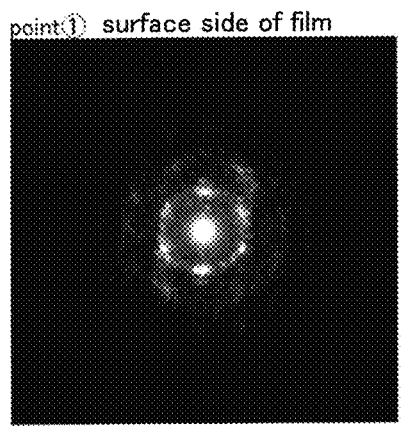
FIGS. 46A to 46D each show a nanobeam electron diffraction patterns of a CAAC-OS film.
Figure 46B:
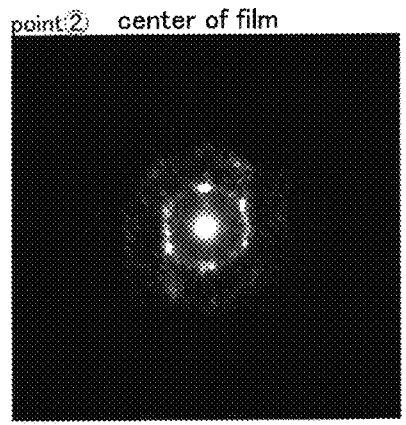
Figure 46C:
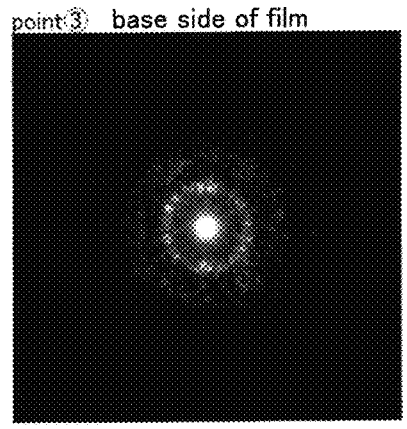
Figure 46D:
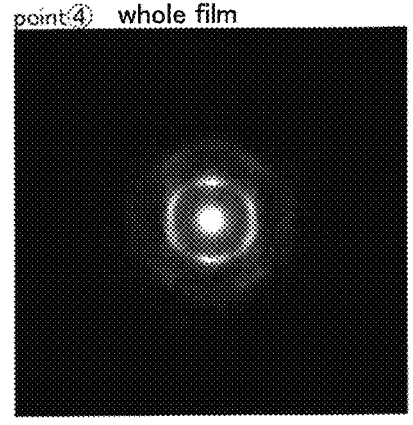

Electron diffraction patterns of Point 1 (the surface side of the film), Point 2 (the center of the film), and Point 3 (the base side of the film) shown in FIG. 45 correspond to FIGS. 46A, 46B, and 46C, respectively and are obtained with an electron-beam diameter of about 1 nmϕ. An electron diffraction pattern in Point 4 (the whole film) shown in FIG. 45 corresponds to FIG. 46D and is obtained with an electron-beam diameter of about 50 nmϕ.

A pattern formed by spots (bright points) is observed in each of the electron diffraction patterns of Point 1 (on the surface side of the film) and Point 2 (the center of the film), and a slightly broken pattern is observed in Point 3 (on the base side of the film). This indicates that the crystal state varies in the thickness direction in the CAAC-OS film. Note that a pattern formed by spots (bright points) is observed in Point 4 (the whole film), which indicates that the whole film is a CAAC-OS film or a film including a CAAC-OS film.

Figure 47:
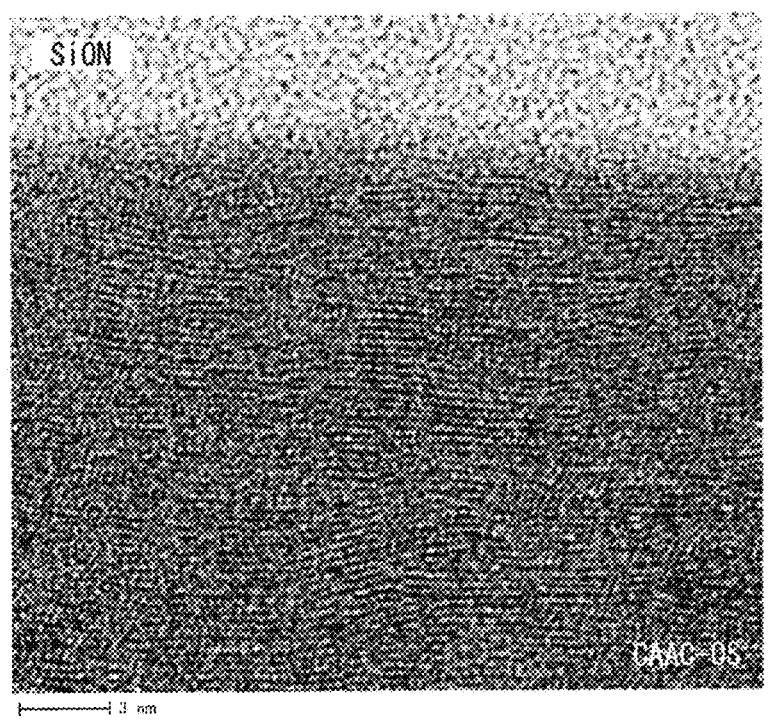
FIG. 47 shows a cross-sectional TEM image of a CAAC-OS film.

FIG. 47 is an enlarged view of a portion in the vicinity of Point 1 (on the surface side of the film) in FIG. 45. In FIG. 47, a clear lattice image which shows alignment of the CAAC-OS film extends to the interface with an SiON film that is an interlayer insulating film.

Figure 48A:
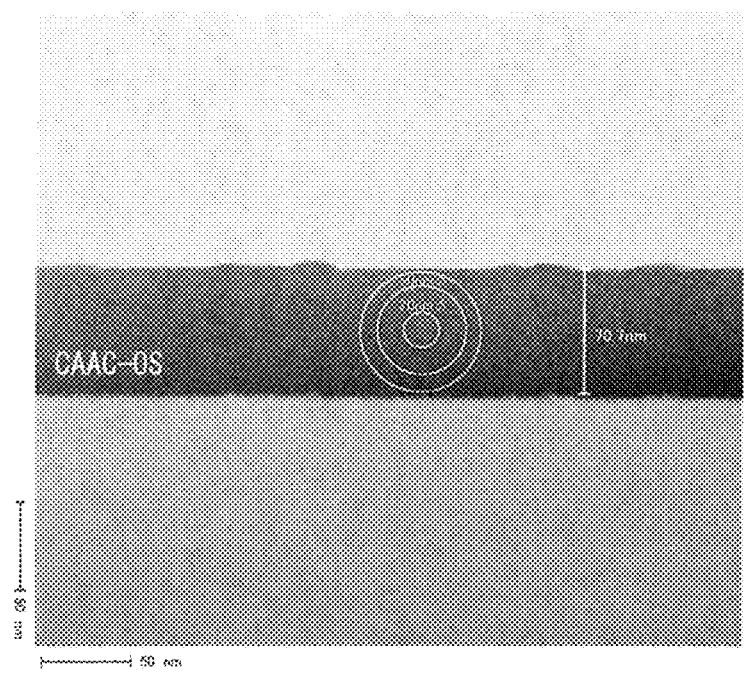
FIGS. 48A and 48B are a cross-sectional TEM image and an X-ray diffraction spectrum of a CAAC-OS film.
Figure 48B:
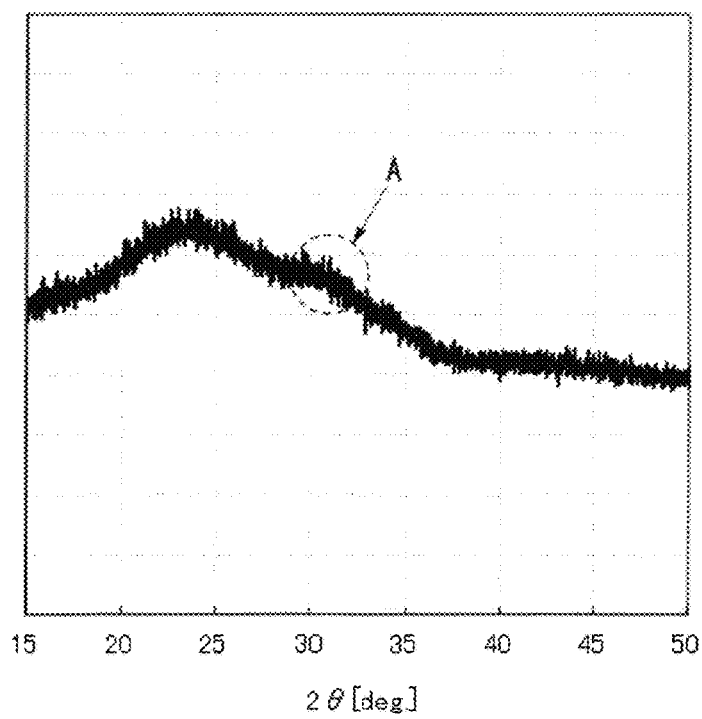
Figure 49A:
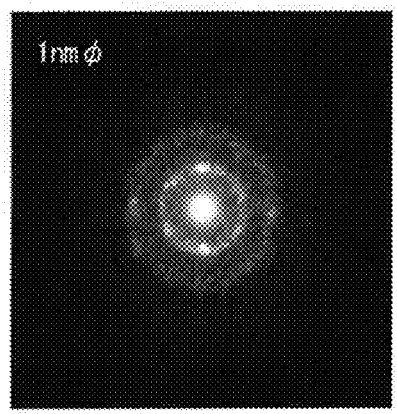
FIGS. 49A to 49D each show an electron diffraction pattern of a CAAC-OS film.
Figure 49B:
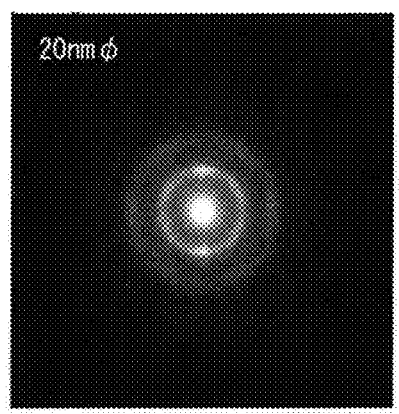
Figure 49C:
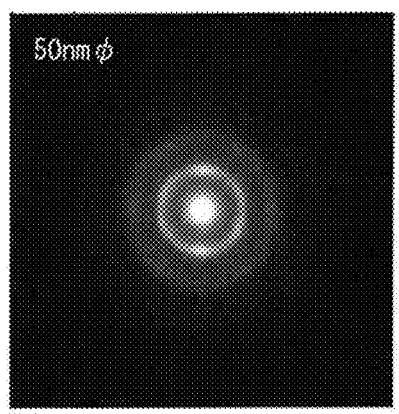
Figure 49D:
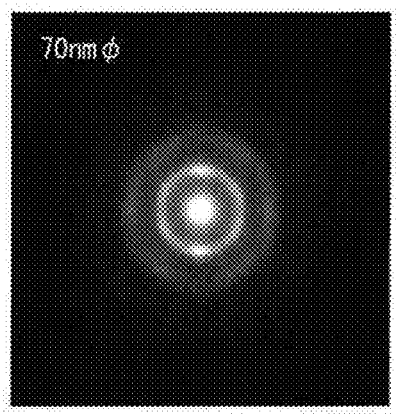

FIGS. 48A and 48B are a cross-sectional TEM photograph and an X-ray diffraction spectrum of a CAAC-OS film different from the CAAC-OS film used for the cross-sectional TEM image in FIG. 45. A CAAC-OS film may have a variety of forms, and Peak A which indicates a crystal component appears around 2θ=31° as shown in FIG. 48B, but the peak does not appear clearly in some cases.

FIGS. 49A to 49D show results of electron diffraction in regions in the CAAC-OS film with electron-beam diameters of 1 nmϕ, 20 nmϕ, 50 nmϕ, and 70 nmϕ. The regions are indicated by concentric circles in FIG. 48A. In the case of an electron-beam diameter of 1 nmϕ, a pattern formed by clear spots (bright points) can be observed as in FIGS. 46A and 46B. As the electron-beam diameter is increased, the spots (bright points) become unclear but a diffraction pattern can be observed; therefore, it can be said that the whole film is a CAAC-OS film or a film including a CAAC-OS film.

Figure 50A:
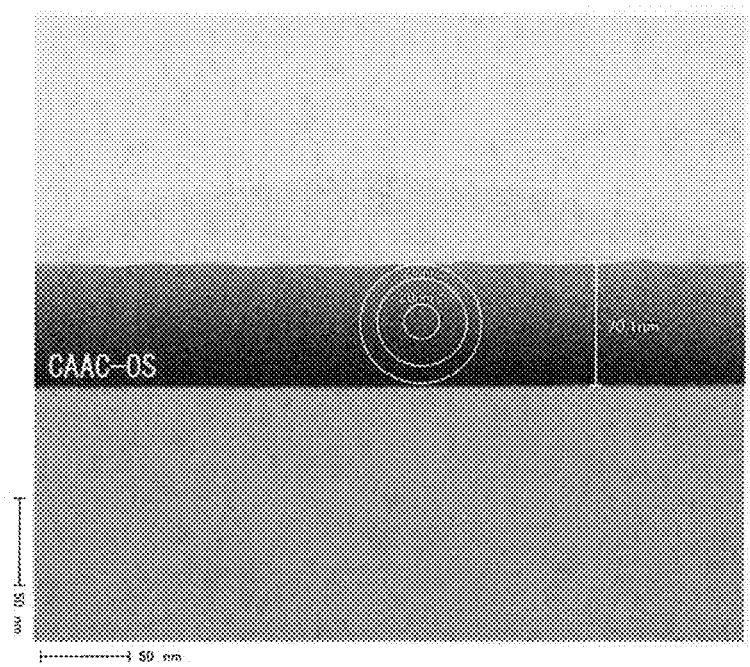
FIGS. 50A and 50B are a cross-sectional TEM image and an X-ray diffraction spectrum of a CAAC-OS film.
Figure 50B:
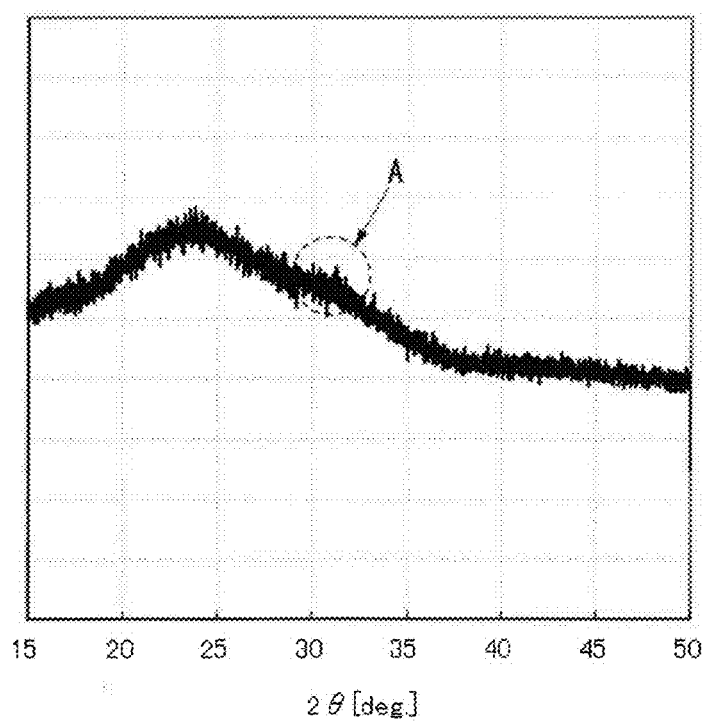
Figure 51A:
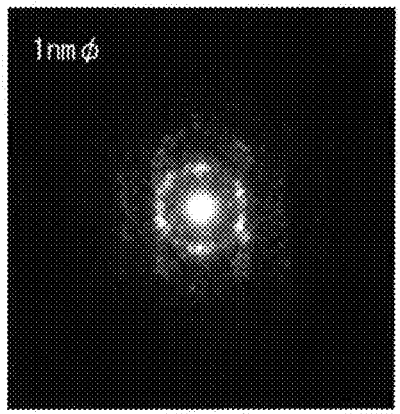
FIGS. 51A to 51D each show an electron diffraction pattern of a CAAC-OS film.
Figure 51B:
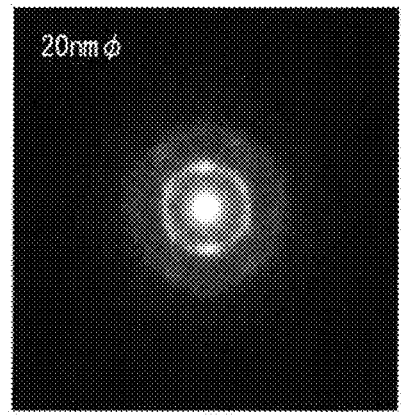
Figure 51C:
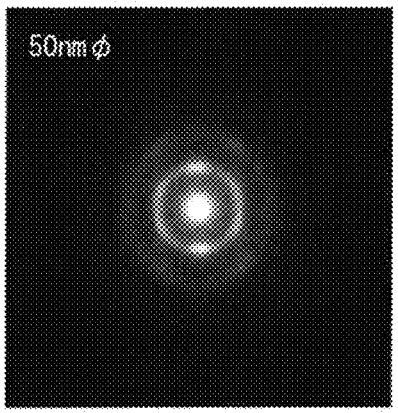
Figure 51D:
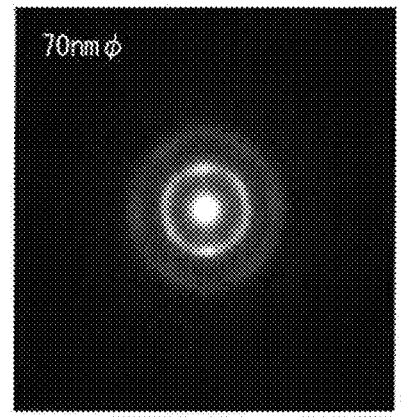

FIGS. 50A and 50B are a cross-sectional TEM image and an X-ray diffraction spectrum of the CAAC-OS film used for the cross-sectional TEM observation in FIG. 48A, which are obtained after annealing at 450° C.

FIGS. 51A to 51D show results of electron diffraction in regions in the CAAC-OS film with electron-beam diameters of 1 nmϕ, 20 nmϕ, 50 nmϕ, and 70 nmϕ. The regions are indicated by concentric circles in FIG. 50A. In the case of an electron-beam diameter of 1 nmϕ, a pattern formed by clear spots (bright points) can be observed as in the results shown in FIGS. 49A to 49D. As the electron-beam diameter is increased, the spots (bright points) become unclear but a diffraction pattern can be observed; therefore, it can be said that the whole film is a CAAC-OS film or a film including a CAAC-OS film.

Figure 52A:
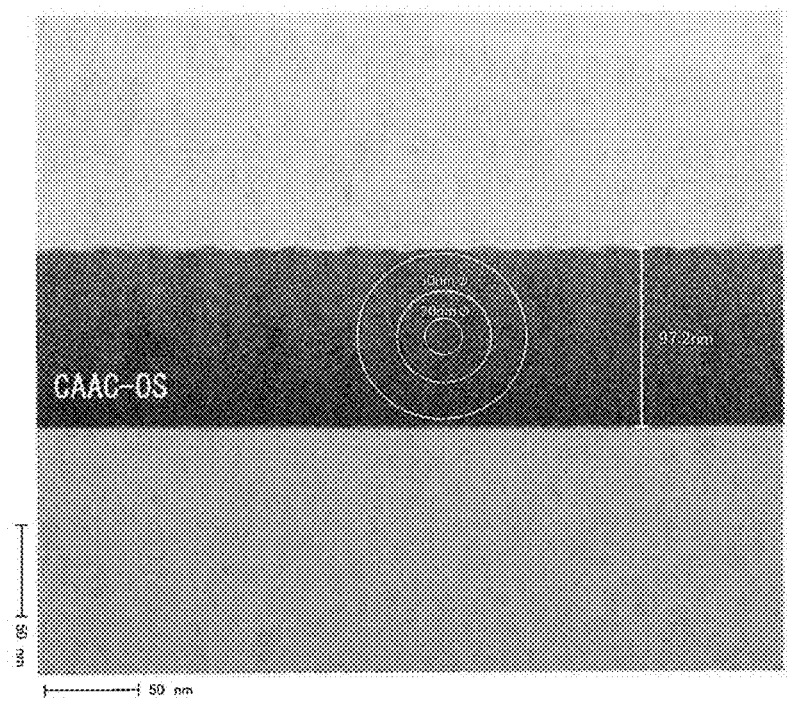
FIGS. 52A and 52B are a cross-sectional TEM image and an X-ray diffraction spectrum of a CAAC-OS film.
Figure 52B:
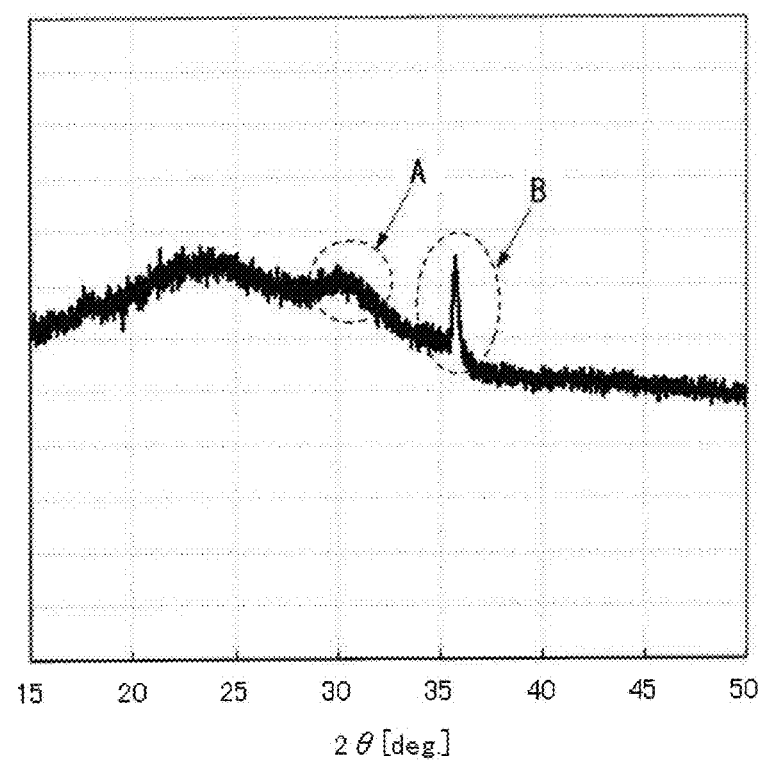
Figure 53A:
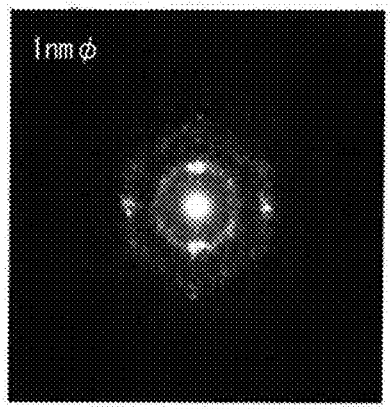
FIGS. 53A to 53D each show an electron diffraction pattern of a CAAC-OS film.
Figure 53B:
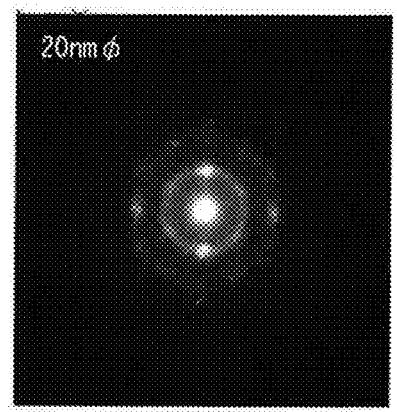
Figure 53C:
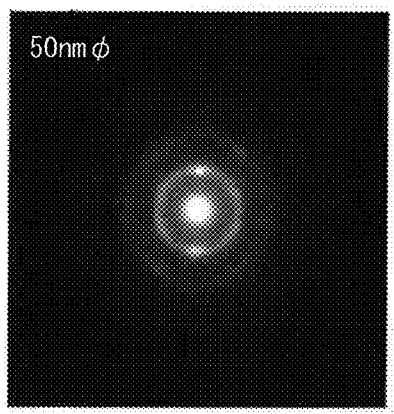
Figure 53D:
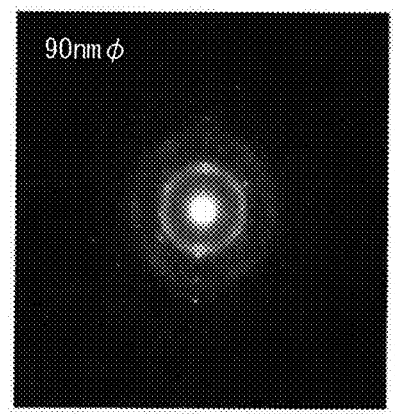

FIGS. 52A and 52B are a cross-sectional TEM image and an X-ray diffraction spectrum of a CAAC-OS film different from the CAAC-OS film used for the cross-sectional TEM image of FIG. 45 and the cross-sectional TEM observation of FIG. 48A. The CAAC-OS film has a variety of forms, and as shown in FIG. 52B, as well as Peak A indicating a crystal component around 2θ=31°, Peak B which is derived from a spinel crystal structure appears in some cases.

FIGS. 53A to 53D show results of electron diffraction in regions in the CAAC-OS film with electron-beam diameters of 1 nmϕ, 20 nmϕ, 50 nmϕ, and 90 nmϕ. The regions are indicated by concentric circles in FIG. 52A. In the case of an electron-beam diameter of 1 nmϕ, a pattern formed by clear spots (bright points) can be observed. As the electron-beam diameter is increased, the spots (bright points) become unclear but a diffraction pattern can be observed. Further, in the case of a beam diameter of 90 nmϕ, clearer spots (bright points) can be observed. Accordingly, the whole film is a CAAC-OS film or a film including a CAAC-OS film.

This embodiment can be combined as appropriate with any of the other embodiments in this specification.

Embodiment 10

In this embodiment, an example of a semiconductor device (display device) including the transistor described in the above embodiment is described.

<Structure of Semiconductor Device>

Figure 26A:
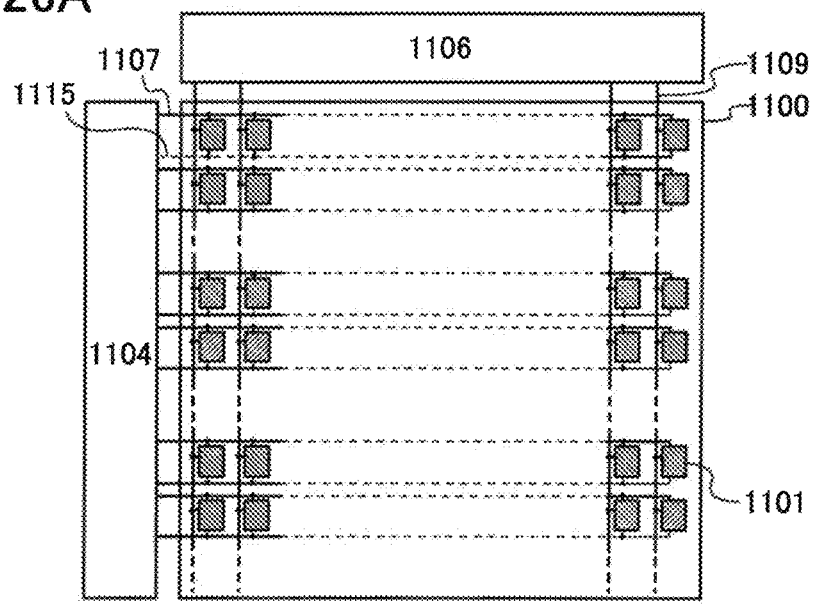
FIG. 26A illustrates a semiconductor device and FIGS. 26B and 26C are each a circuit diagram illustrating a pixel.

FIG. 26A illustrates an example of a semiconductor device. The semiconductor device in FIG. 26A includes a pixel portion 1100, a scan line driver circuit 1104, a signal line driver circuit 1106, m scan lines 1107 which are arranged in parallel or substantially in parallel and whose potentials are controlled by the scan line driver circuit 1104, and n signal lines 1109 which are arranged in parallel or substantially in parallel and whose potentials are controlled by the signal line driver circuit 1106. Further, the pixel portion 1100 includes a plurality of pixels 1101 arranged in a matrix. Furthermore, capacitor lines 1115 arranged in parallel or substantially in parallel are provided along the scan lines 1107. Note that the capacitor lines 1115 may be arranged in parallel or substantially in parallel along the signal lines 1109.

Each scan line 1107 is electrically connected to the n pixels 1101 in the corresponding row among the pixels 1101 arranged in m rows and n columns in the pixel portion 1100. Each signal line 1109 is electrically connected to the m pixels 1101 in the corresponding column among the pixels 1101 arranged in m rows and n columns. Note that m and n are each an integer of 1 or more. Each capacitor line 1115 is electrically connected to then pixels 1101 in the corresponding row among the pixels 1101 arranged in m rows and n columns. Note that in the case where the capacitor lines 1115 are arranged in parallel or substantially in parallel along the signal lines 1109, each capacitor line 1115 is electrically connected to the m pixels 1101 in the corresponding column among the pixels 1101 arranged in m rows and n columns.

Figure 26B:
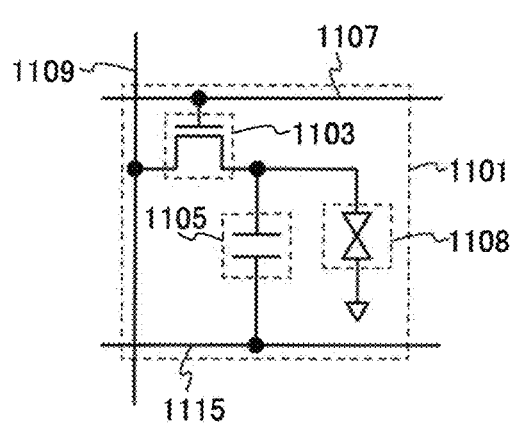

FIG. 26B is an example of a circuit diagram of the pixel 1101 included in the semiconductor device illustrated in FIG. 26A. The pixel 1101 in FIG. 26B includes a transistor 1103 which is electrically connected to the scan line 1107 and the signal line 1109, a capacitor 1105 one electrode of which is electrically connected to a drain electrode of the transistor 1103 and the other electrode of which is electrically connected to the capacitor line 1115 which supplies a constant potential, and a liquid crystal element 1108. A pixel electrode of the liquid crystal element 1108 is electrically connected to the drain electrode of the transistor 1103 and the one electrode of the capacitor 1105, and an electrode (counter electrode) facing the pixel electrode is electrically connected to a wiring which supplies a counter potential.

The liquid crystal element 1108 is an element which controls transmission of light by an optical modulation action of liquid crystal which is sandwiched between a substrate provided with the transistor 1103 and the pixel electrode and a substrate provided with the counter electrode. The optical modulation action of liquid crystal is controlled by an electric field applied to the liquid crystal (including a vertical electric field and a diagonal electric field). Note that in the case where a counter electrode (also referred to as a common electrode) is provided over a substrate where a pixel electrode is provided, an electric field applied to liquid crystal is a transverse electric field.

Figure 27:
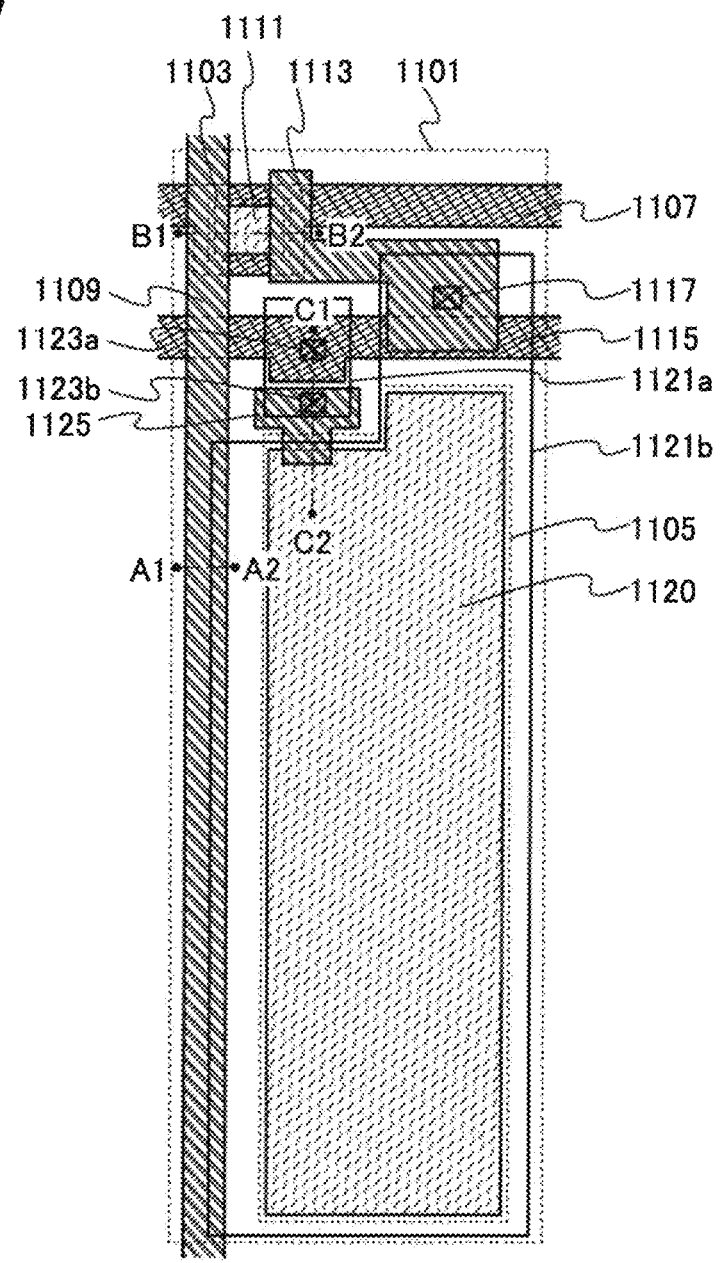
FIG. 27 is a top view illustrating the semiconductor device.

Next, a specific example of the pixel 1101 of the liquid crystal display device is described. FIG. 27 is a top view of the pixel 1101. Note that in FIG. 27, the counter electrode and the liquid crystal element are omitted.

In FIG. 27, the scan line 1107 is provided so as to extend in the direction perpendicular or substantially perpendicular to the signal line 1109 (in the horizontal direction in the drawing). The signal line 1109 is provided so as to extend in the direction perpendicular or substantially perpendicular to the scan line 1107 (in the vertical direction in the drawing). The capacitor line 1115 is provided so as to extend in the direction parallel to the scan line 1107. Note that the scan line 1107 and the capacitor line 1115 are electrically connected to the scan line driver circuit 1104 (see FIG. 26A), and the signal line 1109 is electrically connected to the signal line driver circuit 1106 (see FIG. 26A).

The transistor 1103 is provided in a region where the scan line 1107 and the signal line 1109 cross each other. The transistor 1103 includes at least a semiconductor film 1111 including a channel formation region, a gate electrode, a gate insulating film (not illustrated in FIG. 27), a source electrode, and a drain electrode. A portion of the scan line 1107 which overlaps with the semiconductor film 1111 functions as the gate electrode of the transistor 1103. A portion of the signal line 1109 which overlaps with the semiconductor film 1111 functions as the source electrode of the transistor 1103. A portion of a conductive film 1113 which overlaps with the semiconductor film 1111 functions as the drain electrode of the transistor 1103. Thus, the gate electrode, the source electrode, and the drain electrode may be referred to as the scan line 1107, the signal line 1109, and the conductive film 1113, respectively. Further, in FIG. 27, an edge of the scan line 1107 is on the outer side of an edge of the semiconductor film when seen from above. Thus, the scan line 1107 functions as a light-blocking film for blocking light from a light source such as a backlight. For this reason, the semiconductor film 1111 included in the transistor is not irradiated with light, so that variations in the electrical characteristics of the transistor can be suppressed.

The conductive film 1113 is electrically connected to a pixel electrode 1121b formed using a light-transmitting conductive film, through an opening 1117. In FIG. 27, the hatch pattern of the pixel electrode 1121b is not shown.

The capacitor 1105 is provided in a region which is in the pixel 1101 and surrounded by capacitor lines 1115 and signal lines 1109. The capacitor 1105 is electrically connected to the capacitor line 1115 through an electrode 1121a and a conductive film 1125 provided in and over an opening 1123a and an opening 1123b. The capacitor 1105 includes light-transmitting a conductive film 1120 formed of a light-transmitting oxide semiconductor film with increased conductivity, the light-transmitting pixel electrode 1121b, and a light-transmitting insulating film (not illustrated in FIG. 27) which serves as a dielectric film and is included in the transistor 1103. In other words, the capacitor 1105 transmits light.

Thanks to the light-transmitting property of the conductive film 1120, the capacitor 1105 can be formed large (covers a large area) in the pixel 1101. Thus, a semiconductor device having increased charge capacity while improving the aperture ratio, to typically 55% or more, preferably 60% or more can be obtained. For example, in a semiconductor device with a high resolution such as a liquid crystal display device, the area of a pixel is small and thus the area of a capacitor is also small. For this reason, the charge capacity of the capacitor is small in a semiconductor device with a high resolution. However, since the capacitor 105 of this embodiment transmits light, when it is provided in a pixel, enough charge capacity can be obtained in the pixel and the aperture ratio can be improved. Typically, the capacitor 105 can be favorably used in a high-resolution semiconductor device with a pixel density of 200 ppi or more, or furthermore, 300 ppi or more. Further, according to an embodiment of the present invention, the aperture ratio can be improved even in a display device with a high resolution, which makes it possible to use light from a light source such as a backlight efficiently, so that power consumption of the display device can be reduced.

Figure 28:
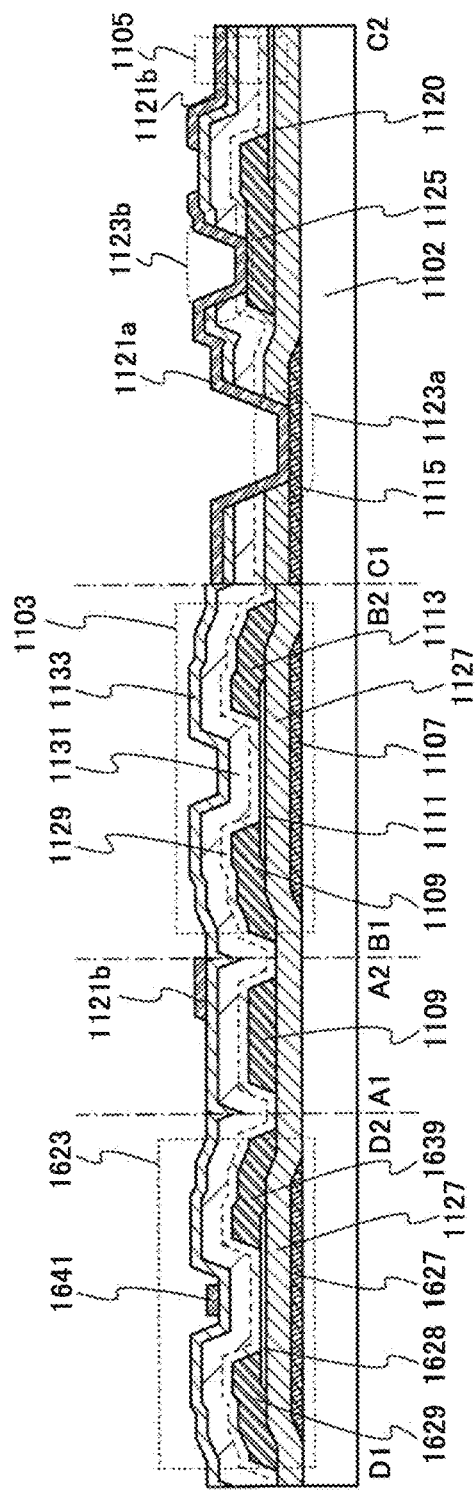
FIG. 28 is a cross-sectional view illustrating a semiconductor device.

Next, FIG. 28 illustrates a cross-sectional view of a transistor provided in the scan line driver circuit 1104 (see FIG. 26A) and cross-sectional views taken along dashed-dotted line A1-A2, dashed-dotted line B1-B2, and dashed-dotted line C1-C2 in FIG. 27. Here, atop view of the scan line driver circuit 1104 is omitted, and a cross-sectional view of the scan line driver circuit 1104 corresponds to a cross section along D1-D2. The cross-sectional view of the transistor provided in the scan line driver circuit 1104 is illustrated here, and the transistor can be provided in the signal line driver circuit 1106.

First, structures of the pixel 1101 taken along dashed-dotted line A1-A2, dashed-dotted line B1-B2, and dashed-dotted line C1-C2 are described. The scan line 1107 including a gate electrode of the transistor 1103 and the capacitor line 1115 on the same surface as the scan line 1107 are provided over a substrate 1102. A gate insulating film 1127 is provided over the scan line 1107 and the capacitor line 1115. The semiconductor film 1111 is provided over a portion of the gate insulating film 1127 which overlaps with the scan line 1107, and the conductive film 1120 is provided over the gate insulating film 1127. The signal line 1109 including a source electrode of the transistor 1103 and the conductive film 1113 including a drain electrode of the transistor 1103 are provided over the semiconductor film 1111 and the gate insulating film 1127. The conductive film 1125 is provided over the conductive film 1120. An insulating film 1129, an insulating film 1131, and an insulating film 1133 functioning as protective insulating films of the transistor 1103 are provided over the gate insulating film 1127, the signal line 1109, the semiconductor film 1111, the conductive films 1113 and 1125, and the conductive film 1120. The opening 1123a reaching the capacitor line 1115 is provided in the gate insulating film 1127, the insulating films 1129, 1131, and 1133, the opening 1123b reaching the conductive film 1125 is provided in the insulating films 1129, 1131, and 1133, and the electrode 1121a is provided in the opening 1123a and the opening 1123b and over the capacitor line 1115, the conductive film 1125 and the insulating film 1133. Note that the opening 1117 (see FIG. 27) reaching the conductive film 1113 is formed in the insulating film 1129, the insulating film 1131, and the insulating film 1133, and the pixel electrode 1121b is provided in the opening 1117 and over an insulating film 1133.

In the capacitor 1105 described in this embodiment, the conductive film 1120 formed in the same process as the semiconductor film 1111 serves as one of a pair of electrodes, the pixel electrode 1121b serves as the other of the pair of electrodes, and the insulating films 1129, 1131, and 1133 serve as a dielectric film provided between the pair of electrodes.

Next, the structure of the transistor provided in the scan line driver circuit 1104 is described. A gate electrode 1627 of a transistor 1623 is provided over the substrate 1102. The gate insulating film 1127 is provided over the gate electrode 1627. A semiconductor film 1628 is provided over a region of the gate insulating film 1127 which overlaps with the gate electrode 1627. A source electrode 1629 and a drain electrode 1639 of the transistor 1623 are provided over the semiconductor film 1628 and the gate insulating film 1127. Further, the insulating films 1129, 1131, and 1133 serving as protective insulating films of the transistor 1623 are provided over the gate insulating film 1127, the source electrode 1629, the semiconductor film 1628, and the drain electrode 1639. A conductive film 1641 is provided over the insulating film 1133.

Note that a base insulating film may be provided between the substrate 1102, and the scan line 1107, the capacitor line 1115, the gate electrode 1627, and the gate insulating film 1127.

In the transistor 1623, the conductive film 1641 overlapping with the gate electrode 1627 with the semiconductor film 1628 provided therebetween is provided, whereby variations in gate voltage at which an on-current rises at different drain voltages can be reduced. Further, a current flowing between the source electrode 1629 and the drain electrode 1639 at a surface of the semiconductor film 1628 facing the conductive film 1641 can be controlled and thus variations in electrical characteristics between different transistors can be reduced. Further, when the conductive film 1641 is provided, an influence of a change in ambient electric field on the semiconductor film 1628 can be reduced, leading to an improvement in reliability of the transistor. Further, when the potential of the conductive film 1641 is the same or substantially the same as the minimum potential (Vss; for example, the potential of the source electrode 1629 in the case where the potential of the source electrode 1629 is a reference potential), variations in threshold voltage of the transistor can be reduced and the reliability of the transistor can be improved.

The insulating films 1129 and 1131 can be formed to have a single-layer structure or a layered structure using, for example, any of oxide insulating materials such as silicon oxide, silicon oxynitride, aluminum oxide, hafnium oxide, gallium oxide, and a Ga—Zn-based metal oxide.

The insulating film 1129 can have a thickness of greater than or equal to 5 nm and less than or equal to 150 nm, preferably greater than or equal to 5 nm and less than or equal to 50 nm, more preferably greater than or equal to 10 nm and less than or equal to 30 nm. The insulating film 1131 can have a thickness of greater than or equal to 30 nm and less than or equal to 500 nm, preferably greater than or equal to 150 nm and less than or equal to 400 nm.

Further, the insulating film 1133 can be formed using a nitride insulating material such as silicon nitride oxide, silicon nitride, aluminum nitride, aluminum nitride oxide, and the like to have a single-layer structure or a stacked structure.

As the insulating film 1133, a nitride insulating film where the hydrogen content is low may be provided. The nitride insulating film is as follows, for example: the number of hydrogen released from the nitride insulating film is less than $5.0 \times 10^{21}$ atoms/cm$^3$, preferably less than $3.0 \times 10^{21}$ atoms/cm$^3$, more preferably less than $1.0 \times 10^{21}$ atoms/cm$^3$ when measured by TDS spectroscopy.

The insulating film 1133 has a thickness large enough to prevent entry of impurities such as hydrogen and water from the outside. For example, the thickness can become greater than or equal to 50 nm and less than or equal to 200 nm, preferably greater than or equal to 50 nm and less than or equal to 150 nm, and further preferably greater than or equal to 50 nm and less than or equal to 100 nm.

Next, connection of the components included in the pixel 1101 described in this embodiment is described with reference to the circuit diagram in FIG. 26C and the cross-sectional view in FIG. 28.

Figure 26C:
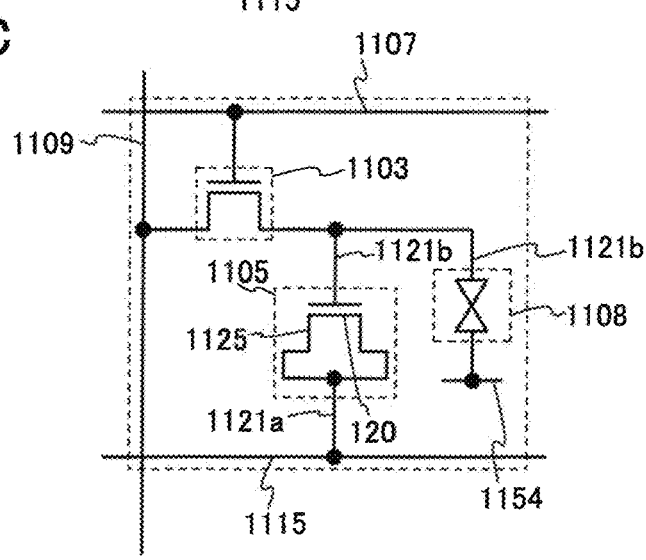

FIG. 26C is an example of a detailed circuit diagram of the pixel 1101 included in the semiconductor device illustrated in FIG. 26A. As illustrated in FIG. 26C and FIG. 28, the transistor 1103 includes the scan line 1107 including the gate electrode, the signal line 1109 including the source electrode, and the conductive film 1113 including the drain electrode.

The conductive film 1120 which is electrically connected to the capacitor line 1115 through the electrode 1121a and the conductive film 1125 serves as one electrode of the capacitor 1105. Further, the pixel electrode 1121b which is electrically connected to the conductive film 1113 including the drain electrode serves as the other electrode of the capacitor 1105. The insulating films 1129, 1131, and 1133 provided between the conductive film 1120 and the pixel electrode 1121b serve as a dielectric film.

The liquid crystal element 1108 includes the pixel electrode 1121b, the counter electrode 1154, and the liquid crystal layer provided between the pixel electrode 1121b and the counter electrode 1154.

The conductive film 1120 in the capacitor 1105, which has the same structure as the semiconductor film 1111, is doped with a dopant to function as the electrode of the capacitor 1105. This is because the pixel electrode 1121b can function as a gate electrode, the insulating films 1129, 1131, and 1133 can function as gate insulating films, and the capacitor line 1115 can function as a source electrode or a drain electrode, so that the capacitor 1105 can be operated in a manner similar to that of a transistor and the conductive film 1120 can be made to be in a conductive state. In other words, the capacitor 1105 can be a metal oxide semiconductor (MOS) capacitor. A MOS capacitor is charged when a voltage higher than the threshold voltage (Vth) is applied to one electrode of the MOS capacitor (the pixel electrode 1121b of the capacitor 1105). Further, the conductive film 1120 can be made to be in a conductive state so that the conductive film 1120 can function as one electrode of the capacitor by controlling a potential to be supplied to the capacitor line 1115. In this case, the potential to be supplied to the capacitor line 1115 is set as follows. The potential of the pixel electrode 1121b is changed in the positive direction and the negative direction relative to the center potential of a video signal in order to operate the liquid crystal element 1108 (see FIG. 26C). The potential of the capacitor line 1115 needs to be constantly lower than the potential to be supplied to the pixel electrode 1121b by the threshold voltage (Vth) of the capacitor 1105 (MOS capacitor) or more in order that the capacitor 1105 (MOS capacitor) be constantly in a conductive state. However, in the capacitor 1105, the conductive film 1120 serving as one electrode is n-type and has high conductivity, so that the threshold voltage is shifted in the negative direction. The potential of the conductive film 1120 (in other words, the potential of the capacitor line 1115) can be raised in accordance with the shift amount of the threshold voltage of the capacitor 1105 in the negative direction, from the lowest potential of the pixel electrode 1121b. Therefore, in the case where the threshold voltage of the capacitor 1105 is a larger negative value, the potential of the capacitor line 1115 can be higher than the potential of the pixel electrode 1121b. In such a manner, the conductive film 1120 can be made to be constantly in a conductive state; thus, the capacitor 1105 (MOS capacitor) can be made to be in a conductive state.

When an oxide insulating film that oxygen permeates and which has a low interface state density at the interfaces with the semiconductor films 1111 and 1628 is used as the insulating film 1129 over the semiconductor films 1111 and 1628 and an oxide insulating film which includes an oxygen excess region or an oxide insulating film in which the oxygen content is higher than that in the stoichiometric composition is used as the insulating film 1131, oxygen can be easily supplied to the oxide semiconductor films that are the semiconductor films 1111 and 1628, the release of oxygen from the semiconductor films can be prevented, and the oxygen contained in the insulating film 1131 can be transferred to the oxide semiconductor films to fill oxygen vacancies in the oxide semiconductor films. Thus, the transistor 1103 can be prevented from being normally on and a potential to be supplied to the capacitor line 1115 can be controlled so that the capacitor 1105 (MOS capacitor) can be constantly in a conductive state; thus, the semiconductor device can have favorable electrical characteristics and high reliability.

The use of a nitride insulating film as the insulating film 1133 over the insulating film 1131 can prevent entry of impurities such as hydrogen and water into the semiconductor film 1111 and the conductive film 1120 from the outside. Moreover, the use of a nitride insulating film with a low hydrogen content as the insulating film 1133 can minimize variations in electrical characteristics of the transistor and the capacitor 1105 (MOS capacitor).

Further, the capacitor 1105 can be formed large (in a large area) in the pixel 1101. For this reason, the semiconductor device can have charge capacity increased while improving the aperture ratio. Accordingly, the semiconductor device can have excellent display quality.

This embodiment can be combined as appropriate with any of the other embodiments in this specification.

Embodiment 11

In this embodiment, examples of an electronic appliances which can use any of the transistors described in the above embodiments are described.

The transistors described in the above embodiments can be applied to a variety of electronic appliances (including game machines) and electric appliances. Examples of the electronic appliances and electric appliances include display devices of televisions, monitors, and the like, lighting devices, desktop personal computers and laptop personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, mobile phones, car phones, portable game machines, calculators, portable information terminals, electronic notebooks, e-book readers, electronic dictionary, electronic translators, audio input devices, still cameras, video cameras, electric shavers, IC chips, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, radiation counters, and medical equipment such as dialyzers. In addition, the examples include alarm devices such as smoke detectors, gas alarm devices, and security alarm devices. Further, the examples also include industrial equipment such as guide lights, traffic lights, belt conveyors, elevators, escalators, industrial robots, and power storage systems. In addition, moving objects and the like driven by oil engines and electric motors using power from non-aqueous secondary batteries, for example, electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like can be given. Specific examples of these electronic appliances are illustrated in FIG. 22, FIG. 23, FIGS. 24A to 24C, and FIGS. 25A to 25C.

First, as an example of the alarm device, a structure of a fire alarm is described. A fire alarm in this specification refers to any device which raises an alarm over fire occurrence instantly, and for example, a residential fire alarm, an automatic fire alarm system, and a fire detector used for the automatic fire alarm system are included in its category.

Figure 22:
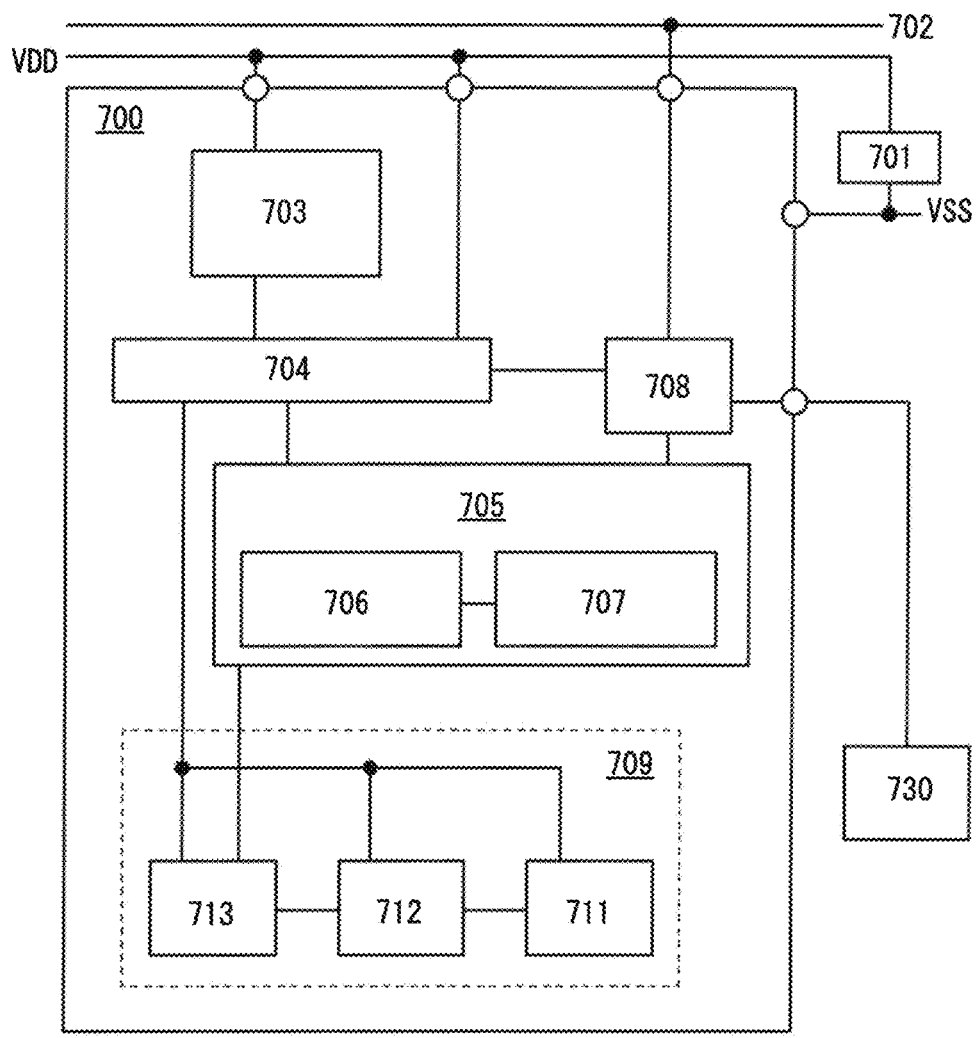
FIG. 22 is a block diagram of a semiconductor device.

An alarm device illustrated in FIG. 22 includes at least a microcomputer 700. Here, the microcomputer 700 is provided in the alarm device. The microcomputer 700 includes a power gate controller 703 electrically connected to a high potential power supply line VDD, a power gate 704 electrically connected to the high potential power supply line VDD and the power gate controller 703, a CPU (central processing unit) 705 electrically connected to the power gate 704, and a sensor portion 709 electrically connected to the power gate 704 and the CPU 705. Further, the CPU 705 includes a volatile memory portion 706 and a nonvolatile memory portion 707.

The CPU 705 is electrically connected to a bus line 702 through an interface 708. The interface 708 as well as the CPU 705 is electrically connected to the power gate 704. As a bus standard of the interface 708, an I²C bus can be used, for example. A light-emitting element 730 electrically connected to the power gate 704 through the interface 708 is provided in the alarm device described in this embodiment.

The light-emitting element 730 is preferably an element which emits light with high directivity, and for example, an organic EL element, an inorganic EL element, or a light-emitting diode (LED) can be used.

The power gate controller 703 includes a timer and controls the power gate 704 with the use of the timer. The power gate 704 allows or stops supply of power from the high potential power supply line VDD to the CPU 705, the sensor portion 709, and the interface 708, in accordance with the control by the power gate controller 703. Here, as an example of the power gate 704, a switching element such as a transistor can be given.

With the use of the power gate controller 703 and the power gate 704, power is supplied to the sensor portion 709, the CPU 705, and the interface 708 in a period during which the amount of light is measured, and supply of power to the sensor portion 709, the CPU 705, and the interface 708 can be stopped during an interval between measurement periods. The alarm device operates in such a manner, whereby a reduction in power consumption of the alarm device can be achieved compared with that of the case where power is continuously supplied to the above structures.

In the case where a transistor is used as the power gate 704, it is preferable to use a transistor which has an extremely low off-state current and is used for the nonvolatile memory portion 707, for example, a transistor including an oxide semiconductor. With the use of such a transistor, a leakage current can be reduced when supply of power is stopped by the power gate 704, so that a reduction in power consumption of the alarm device can be achieved.

A direct-current power source 701 may be provided in the alarm device described in this embodiment so that power is supplied from the direct-current power source 701 to the high potential power supply line VDD. An electrode of the direct-current power source 701 on a high potential side is electrically connected to the high potential power supply line VDD, and an electrode of the direct-current power source 701 on a low potential side is electrically connected to a low potential power supply line VSS. The low potential power supply line VSS is electrically connected to the microcomputer 700. Here, the high potential power supply line VDD is supplied with a high potential H. The low potential power supply line VSS is supplied with a low potential L, for example, a ground potential (GND).

In the case where a battery is used as the direct-current power source 701, for example, a battery case including an electrode electrically connected to the high potential power supply line VDD, an electrode electrically connected to the low potential power supply line VSS, and a housing which can hold the battery is provided in a housing. Note that the alarm device described in this embodiment does not necessarily include the direct-current power source 701 and may have, for example, a structure in which power is supplied from an alternate-current power source provided outside the alarm device through a wiring.

As the above battery, a secondary battery such as a lithium ion secondary battery (also called a lithium ion storage battery or a lithium ion battery) can be used. Further, a solar battery is preferably provided so that the secondary battery can be charged.

The sensor portion 709 measures a physical quantity relating to an abnormal situation and transmits a measurement value to the CPU 705. A physical quantity relating to an abnormal situation depends on the usage of the alarm device, and in an alarm device functioning as a fire alarm, a physical quantity relating to a fire is measured. Accordingly, the sensor portion 709 measures the amount of light as a physical quantity relating to a fire and senses smoke.

The sensor portion 709 includes an optical sensor 711 electrically connected to the power gate 704, an amplifier 712 electrically connected to the power gate 704, and an AD converter 713 electrically connected to the power gate 704 and the CPU 705. The optical sensor 711, the amplifier 712, and the AD converter 713 which are provided in the sensor portion 709, and the light-emitting element 730 operate when the power gate 704 allows supply of power to the sensor portion 709.

Figure 23:
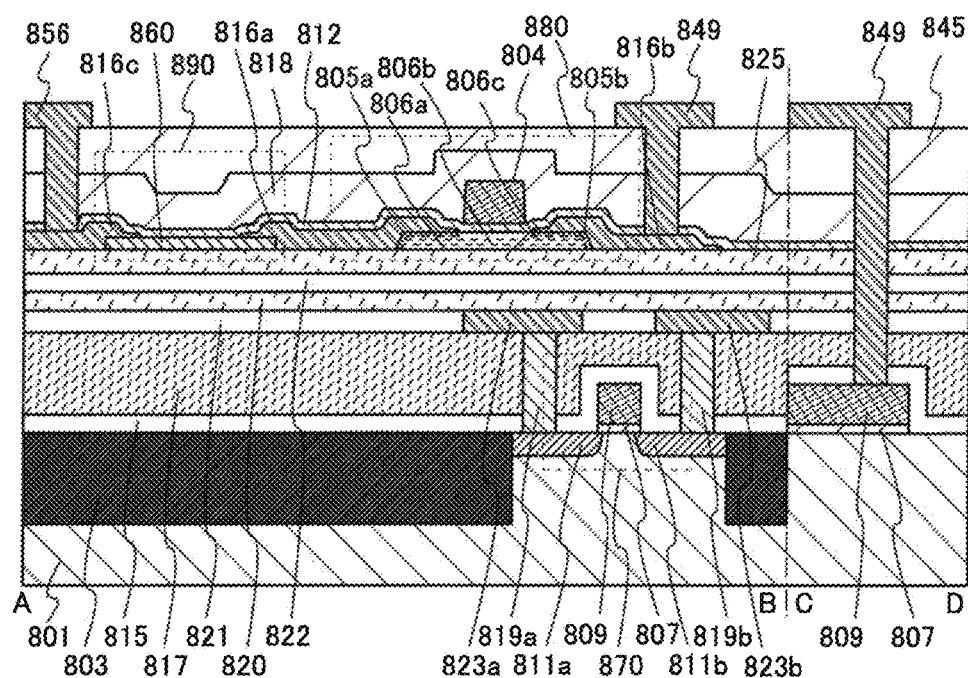
FIG. 23 is a cross-sectional view of a semiconductor device.

FIG. 23 illustrates part of the cross section of the alarm device. In the alarm device, element isolation regions 803 are formed in a p-type semiconductor substrate 801, and an re-channel transistor 870 including a gate insulating film 807, a gate electrode 809, n-type impurity regions 811*a* and 811*b*, an insulating film 815, and an insulating film 817 is formed. Here, the n-channel transistor 870 is formed using a semiconductor other than an oxide semiconductor, such as single crystal silicon, so that the n-channel transistor 870 can operate at sufficiently high speed. Accordingly, a volatile memory portion of a CPU that can achieve high-speed access can be formed.

In addition, contact plugs 819*a* and 819*b* are formed in openings which are formed by partly etching the insulating films 815 and 817, and an insulating film 821 having groove portions is formed over the insulating film 817 and the contact plugs 819*a* and 819*b*.

Wirings 823*a* and 823*b* are formed in the groove portions of the insulating film 821, and an insulating film 820 formed by a sputtering method, a CVD method, or the like is provided over the insulating film 821 and the wirings 823*a* and 823*b*. An insulating film 822 is formed over the insulating film.

An insulating film 825 formed by a sputtering method, a CVD method, or the like is provided over the insulating film 822, and a second transistor 880 and a photoelectric conversion element 890 are provided over the insulating film 825.

The second transistor 880 includes an oxide film 806*a*; an oxide semiconductor film 806*b*; an oxide film 806*c*; a low-resistance region 805*a* and a low-resistance region 805*b* which are in contact with the oxide film 806*a*, the oxide semiconductor film 806*b*, and the oxide film 806*c*; a source electrode 816*a* and a drain electrode 816*b* which are in contact with the low-resistance region 805*a* and the low-resistance region 805*b*; a gate insulating film 812; a gate electrode 804; and an oxide insulating film 818. Moreover, an insulating film 845 covering the photoelectric conversion element 890 and the second transistor 880 is provided, and a wiring 849 in contact with the drain electrode 816*b* is formed over the insulating film 845. The wiring 849 functions as a node which electrically connects the drain electrode of the second transistor 880 to the gate electrode 809 of the n-channel transistor 870. Note that a cross section C-D in the drawing shows a cross section in the depth direction of the transistor 870 in the cross section A-B.

Here, any of the transistors described in the above embodiments can be used as the second transistor 880, and the oxide film 806*a*, the oxide semiconductor film 806*b*, and the oxide film 806*c* correspond to the oxide film 104*a*, the oxide semiconductor film 104*b*, and the oxide film 104*c* described in Embodiment 1, respectively. Moreover, the source electrode 816*a* and the drain electrode 816*b* correspond to the source electrode 106*a* and the drain electrode 106*b* described in Embodiment 1, respectively.

In the transistor 880, low-resistance regions are formed in regions in the vicinity of the interfaces of the multilayer film in contact with the source electrode and the drain electrode in a self-aligned manner, and the channel formation region can be a highly purified intrinsic region by adding oxygen to the multilayer film using the source electrode and the drain electrode as masks. By the addition of oxygen, the highly purified intrinsic region and the low-resistance regions can be formed in a self-aligned manner. The amount of oxygen vacancy in the channel formation region in the multilayer film in the transistor can be reduced and the electrical characteristics of the transistor are favorable; therefore, it is possible to provide a highly reliable semiconductor device.

The optical sensor 711 includes the photoelectric conversion element 890, a capacitor, a first transistor, the second transistor 880, a third transistor, and the n-channel transistor 870. As the photoelectric conversion element 890, a photodiode can be used here, for example.

One of terminals of the photoelectric conversion element 890 is electrically connected to the low potential power supply line VSS, and the other of the terminals thereof is electrically connected to one of the source electrode 816*a* and the drain electrode 816*b* of the second transistor 880.

The gate electrode 804 of the second transistor 880 is supplied with an electric charge accumulation control signal Tx, and the other of the source electrode 816*a* and the drain electrode 816*b* of the second transistor 880 is electrically connected to one of a pair of electrodes of the capacitor, one of a source electrode and a drain electrode of the first transistor, and the gate electrode of the n-channel transistor 870 (hereinafter the node is referred to as a node FD in some cases).

The other of the pair of electrodes of the capacitor is electrically connected to the low potential power supply line VSS. A gate electrode of the first transistor is supplied with a reset signal Res, and the other of the source electrode and the drain electrode thereof is electrically connected to the high potential power supply line VDD.

One of a source electrode and a drain electrode of the n-channel transistor 870 is electrically connected to one of a source electrode and a drain electrode of the third transistor and the amplifier 712. The other of the source electrode and the drain electrode of the n-channel transistor 870 is electrically connected to the high potential power supply line VDD. A gate electrode of the third transistor is supplied with a bias signal Bias, and the other of the source electrode and the drain electrode thereof is electrically connected to the low potential power supply line VSS.

Note that the capacitor is not necessarily provided. For example, in the case where parasitic capacitance of the n-channel transistor 870 or the like is sufficiently large, a structure without the capacitor may be employed.

Further, as each of the first transistor and the second transistor 880, a transistor having an extremely low off-state current is preferably used. As the transistor having an extremely low off-state current, a transistor including an oxide semiconductor is preferably used. With such a structure, the potential of the node FD can be held for a long time.

In the structure in FIG. 23, the photoelectric conversion element 890 is electrically connected to the second transistor 880 and is provided over the insulating film 825.

The photoelectric conversion element 890 includes a semiconductor film 860 provided over the insulating film 825, and the source electrode 816*a* and an electrode 816*c* which are in contact with a top surface of the semiconductor film 860. The source electrode 816*a* is an electrode functioning as the source electrode or the drain electrode of the second transistor 880 and electrically connects the photoelectric conversion element 890 to the second transistor 880.

Over the semiconductor film 860, the source electrode 816*a*, and the electrode 816*c*, the gate insulating film 812, the oxide insulating film 818, and the insulating film 845 are provided. Further, a wiring 856 is formed over the insulating film 845 and is in contact with the electrode 816*c* through an opening provided in the gate insulating film 812, the oxide insulating film 818, and the insulating film 845.

The electrode 816*c* can be formed in steps similar to those of the source electrode 816*a* and the drain electrode 816*b*, and the wiring 856 can be formed in steps similar to those of the wiring 849.

As the semiconductor film 860, a semiconductor film which can perform photoelectric conversion is provided, and for example, silicon or germanium can be used. In the case of using silicon, the semiconductor film 860 functions as an optical sensor which senses visible light. Further, there is a difference, between silicon and germanium, in wavelengths of electromagnetic waves that can be absorbed. When the semiconductor film 860 includes germanium, a sensor which mainly senses an infrared ray can be obtained.

In the above manner, the sensor portion 709 including the optical sensor 711 can be incorporated into the microcomputer 700, so that the number of components can be reduced and the size of the housing of the alarm device can be reduced. Note that in the case where the place of the optical sensor or the photoelectric conversion element needs a high degree of freedom, the optical sensor or the photoelectric conversion element may be externally provided so as to be electrically connected to the microcomputer 700.

In the alarm device including the above-described IC chip, the CPU 705 in which a plurality of circuits including any of the transistors described in the above embodiments are combined and mounted on one IC chip is used.

Figure 24A:
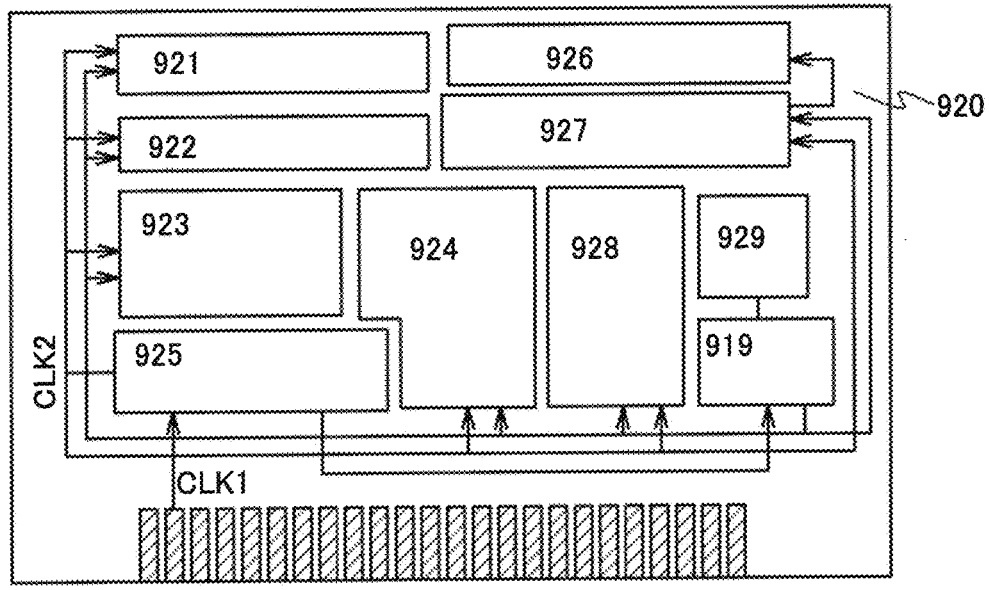
FIGS. 24A to 24C are block diagrams of a semiconductor device.
Figure 24B:
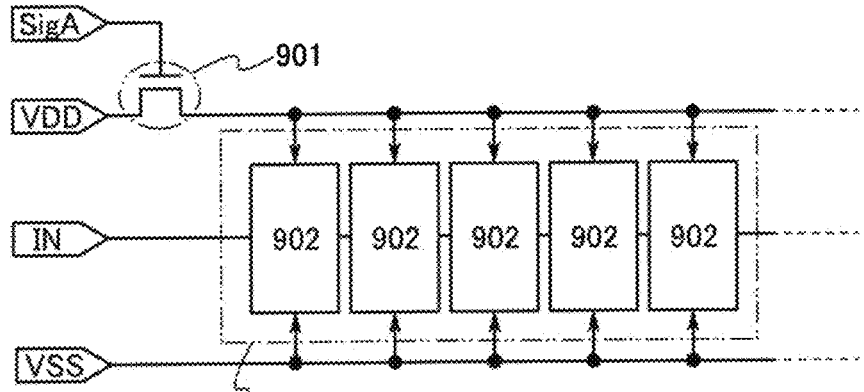
Figure 24C:
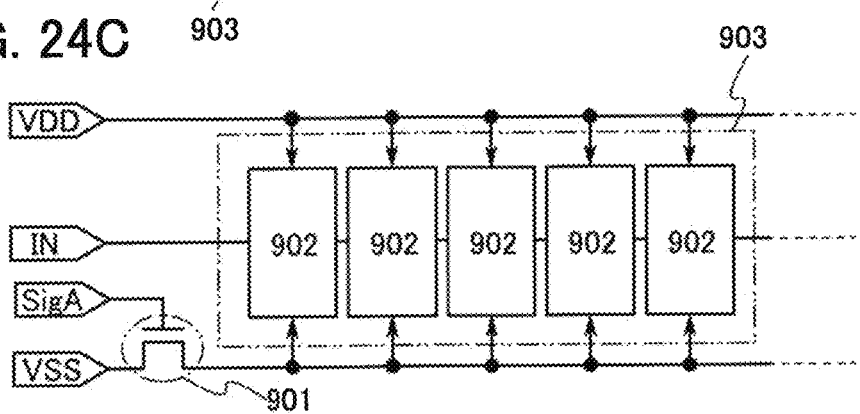

FIGS. 24A to 24C are block diagrams illustrating a specific configuration of a CPU at least partly including any of the transistors described in the above embodiments.

The CPU illustrated in FIG. 24A includes an arithmetic logic unit (ALU) 921, an ALU controller 922, an instruction decoder 923, an interrupt controller 924, a timing controller 925, a register 926, a register controller 927, a bus interface (Bus I/F) 928, a rewritable ROM 929, and an ROM interface (ROM I/F) 919 over a substrate 920. A semiconductor substrate, an SOI substrate, a glass substrate, or the like is used as the substrate 920. The ROM 929 and the ROM interface 919 may be provided over a separate chip. Needless to say, the CPU in FIG. 24A is just an example in which the configuration has been simplified, and an actual CPU may have various configurations depending on the application.

An instruction that is input to the CPU through the bus interface 928 is input to the instruction decoder 923 and decoded therein, and then, input to the ALU controller 922, the interrupt controller 924, the register controller 927, and the timing controller 925.

The ALU controller 922, the interrupt controller 924, the register controller 927, and the timing controller 925 conduct various controls in accordance with the decoded instruction. Specifically, the ALU controller 922 generates signals for controlling the operation of the ALU 921. While the CPU is executing a program, the interrupt controller 924 determines an interrupt request from an external input/output device or a peripheral circuit on the basis of its priority or a mask state, and processes the request. The register controller 927 generates an address of the register 926, and reads/writes data from/to the register 926 in accordance with the state of the CPU.

The timing controller 925 generates signals for controlling operation timings of the ALU 921, the ALU controller 922, the instruction decoder 923, the interrupt controller 924, and the register controller 927. For example, the timing controller 925 includes an internal clock generator for generating an internal clock signal CLK2 based on a reference clock signal CLK1, and supplies the internal clock signal CLK2 to the above circuits.

In the CPU illustrated in FIG. 24A, a memory cell is provided in the register 926. As the memory cell of the register 926, any of the transistors described in the above embodiments can be used.

In the CPU illustrated in FIG. 24A, the register controller 927 selects operation of storing data in the register 926 in accordance with an instruction from the ALU 921. That is, the register controller 927 selects whether data is stored by a flip-flop or by a capacitor in the memory cell included in the register 926. When data storing by the flip-flop is selected, a power supply voltage is supplied to the memory cell in the register 926. When data storing by the capacitor is selected, the data is rewritten in the capacitor, and supply of power supply voltage to the memory cell in the register 926 can be stopped.

The power supply can be stopped by a switching element provided between a memory cell group and a node to which a power supply potential VDD or a power supply potential VS S is supplied, as illustrated in FIG. 24B or FIG. 24C. Circuits illustrated in FIGS. 24B and 24C are described below.

FIGS. 24B and 24C each illustrate an example of the configuration of a memory circuit in which any of the transistors described in the above embodiments is used as a switching element which controls supply of a power supply potential to a memory cell.

The memory device illustrated in FIG. 24B includes a switching element 901 and a memory cell group 903 including a plurality of memory cells 902. Specifically, as each of the memory cells 902, any of the transistors described in the above embodiments can be used. Each of the memory cells 902 included in the memory cell group 903 is supplied with the high-level power supply potential VDD via the switching element 901. Further, each of the memory cells 902 included in the memory cell group 903 is supplied with a potential of a signal IN and the low-level power supply potential VSS.

In FIG. 24B, any of the transistors described in the above embodiments is used as the switching element 901, and the switching of the transistor is controlled by a signal SigA supplied to a gate electrode thereof.

Note that FIG. 24B illustrates the configuration in which the switching element 901 includes only one transistor; however, without particular limitation thereon, the switching element 901 may include a plurality of transistors. In the case where the switching element 901 includes a plurality of transistors which function as switching elements, the plurality of transistors may be connected to each other in parallel, in series, or in combination of parallel connection and series connection.

Although the switching element 901 controls the supply of the high-level power supply potential VDD to each of the memory cells 902 included in the memory cell group 903 in FIG. 24B, the switching element 901 may control the supply of the low-level power supply potential VSS.

In FIG. 24C, an example of a memory device in which each of the memory cells 902 included in the memory cell group 903 is supplied with the low-level power supply potential VSS via the switching element 901 is illustrated. The supply of the low-level power supply potential VSS to each of the memory cells 902 included in the memory cell group 903 can be controlled by the switching element 901.

When a switching element is provided between a memory cell group and a node to which the power supply potential VDD or the power supply potential VSS is supplied, data can be stored even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example here, the transistor can also be applied to an LSI such as a digital signal processor (DSP), a custom LSI, or a field programmable gate array (FPGA).

Figure 25A:
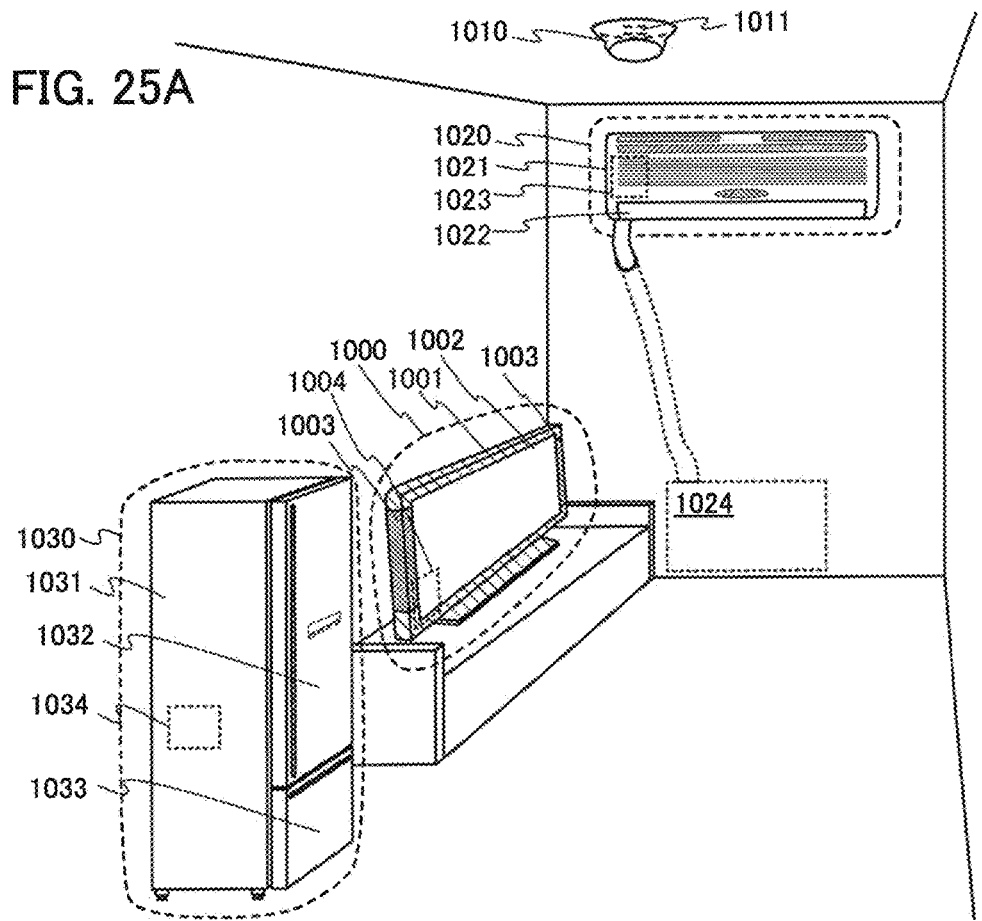
FIGS. 25A to 25C illustrate electronic appliances to which semiconductor devices can be applied.

In FIG. 25A, a display device 1000 is an example of an electric appliance including the CPU in which any of the transistors described in the above embodiments is used. Specifically, the display device 1000 corresponds to a display device for TV broadcast reception and includes a housing 1001, a display portion 1002, speaker portions 1003, a CPU 1004, and the like. The CPU 1004 is provided in the housing 1001. The display device 1000 can receive electric power from a commercial power supply. Alternatively, the display device 1000 can use electric power stored in a power storage device. When any of the transistors described in the above embodiments is used as the CPU in the display device 1000, a reduction in power consumption of the display device 1000 can be achieved.

A semiconductor display device such as a liquid crystal display device, a light-emitting device in which a light-emitting element such as an organic EL element is provided in each pixel, an electrophoresis display device, a digital micromirror device (DMD), a plasma display panel (PDP), a field emission display (FED), and the like can be used for the display portion 1002.

Note that the display device includes, in its category, all of information display devices for personal computers, advertisement displays, and the like other than TV broadcast reception.

In FIG. 25A, an alarm device 1010 is a residential fire alarm, which includes a sensor portion and a microcomputer 1011. Note that the microcomputer 1011 is an example of an electric appliance including the CPU in which any of the transistors described in the above embodiments is used.

In FIG. 25A, an air conditioner which includes an indoor unit 1020 and an outdoor unit 1024 is an example of an electric appliance including the CPU in which any of the transistors described in the above embodiments is used. Specifically, the indoor unit 1020 includes a housing 1021, an air outlet 1022, a CPU 1023, and the like. Although the CPU 1023 is provided in the indoor unit 1020 in FIG. 25A, the CPU 1023 may be provided in the outdoor unit 1024. Alternatively, the CPU 1023 may be provided in both the indoor unit 1020 and the outdoor unit 1024. By using any of the transistors described in the above embodiments for the CPU in the air conditioner, a reduction in power consumption of the air conditioner can be achieved.

In FIG. 25A, an electric refrigerator-freezer 1030 is an example of an electric appliance including the CPU in which any of the transistors described in the above embodiments is used. Specifically, the electric refrigerator-freezer 1030 includes a housing 1031, a door for a refrigerator 1032, a door for a freezer 1033, a CPU 1034, and the like. In FIG. 25A, the CPU 1034 is provided in the housing 1031. When any of the transistors described in the above embodiments is used as the CPU 1034 of the electric refrigerator-freezer 1030, a reduction in power consumption of the electric refrigerator-freezer 1030 can be achieved.

Figure 25B:
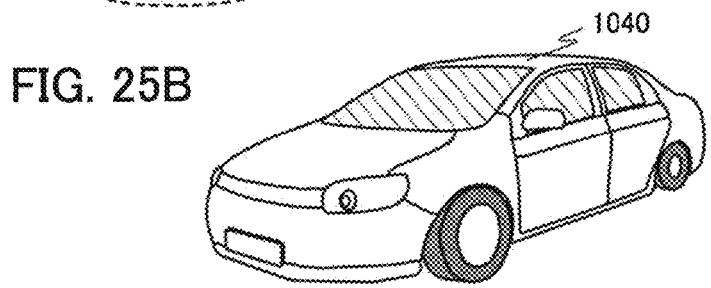
Figure 25C:
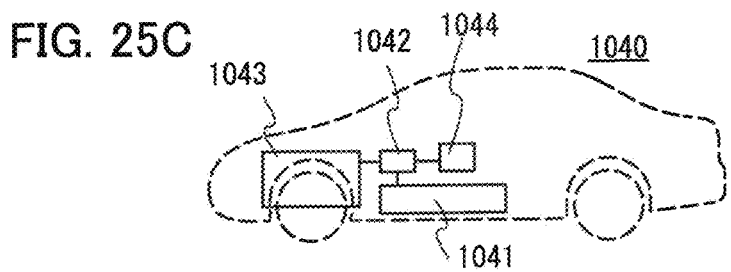

FIG. 25B illustrates an example of an electric vehicle which is an example of an electric appliance. An electric vehicle 1040 is equipped with a secondary battery 1041. The output of the electric power of the secondary battery 1041 is adjusted by a control circuit 1042 and the electric power is supplied to a driving device 1043. The control circuit 1042 is controlled by a processing unit 1044 including a ROM, a RAM, a CPU, or the like which is not illustrated. When any of the transistors described in the above embodiments is used as the CPU in the electric vehicle 1040, a reduction in power consumption of the electric vehicle 1040 can be achieved.

The driving device 1043 includes a DC motor or an AC motor either alone or in combination with an internal-combustion engine. The processing unit 1044 outputs a control signal to the control circuit 1042 based on input data such as data of operation (e.g., acceleration, deceleration, or stop) by a driver or data during driving (e.g., data on an upgrade or a downgrade, or data on a load on a driving wheel) of the electric vehicle 1040. The control circuit 1042 adjusts the electric energy supplied from the secondary battery 1041 in accordance with the control signal of the processing unit 1044 to control the output of the driving device 1043. In the case where the AC motor is mounted, although not illustrated, an inverter which converts a direct current into an alternate current is also incorporated.

This embodiment can be combined as appropriate with any of the other embodiments in this specification.

Example 1

In this example, cross-sectional observation results and thermal desorption spectroscopy (TDS) analysis results of a nitride insulating film are described. First, a method for forming a sample used for the cross-sectional observation of the nitride insulating film is described.

A thermal oxidation film was deposited over a silicon wafer. The thermal oxidation film was formed to a thickness of 100 nm at 950° C. in an oxygen atmosphere containing HCl at 3%. Next, a 300-nm-thick silicon nitride film was deposited over the thermal oxidation film by a sputtering method. The silicon nitride film was deposited under the following conditions: silicon was used as a sputtering target, argon and nitrogen were supplied to a treatment chamber of a sputtering apparatus as a sputtering gas at flow rates of 5 sccm and 20 sccm, respectively, the pressure in the treatment chamber was controlled to 0.2 Pa, and an RF power of 3.0 kW was supplied. Note that the substrate temperature in the deposition of the silicon nitride film was 350° C.

Figure 29:
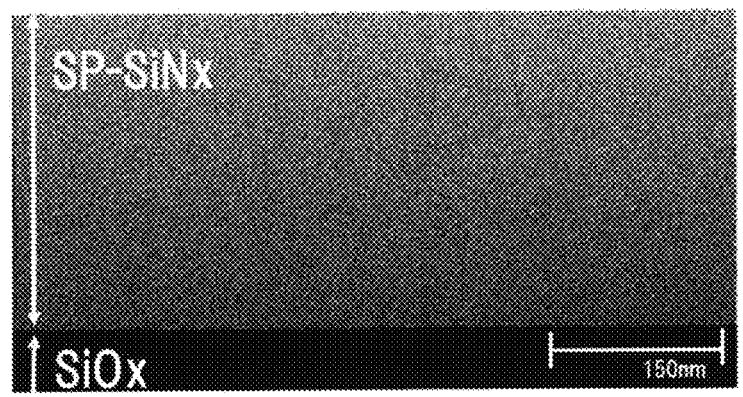
FIG. 29 shows a cross-sectional STEM image of a sample formed in an example.

A cross section of the example sample was observed by scanning transmission electron microscopy (STEM). FIG. 29 shows a STEM image of the example sample.

As shown in FIG. 29, generation of a void portion was not observed in the nitride insulating film.

Next, evaluation obtained by TDS analysis of the nitride insulating film is described.

A example sample was formed as follows. A thermal oxidation film was formed over a silicon wafer. The thermal oxidation film was formed to a thickness of 100 nm at 950° C. in an oxygen atmosphere containing HCl at 3%. Next, by a sputtering method, a 300-nm-thick first silicon nitride film was deposited over the thermal oxidation film and a 50-nm-thick second silicon nitride film was deposited over the first silicon nitride film. The first silicon nitride film was formed by a plasma CVD method under the following conditions: silane with a flow rate of 60 sccm, nitrogen with a flow rate of 1000 sccm, and ammonia with a flow rate of 480 sccm were used as the source gas; the pressure in a reaction chamber was 300 Pa; the substrate temperature was 350° C.; and a high-frequency power of 350 W was supplied to parallel plate electrodes. The second silicon nitride film was formed under the following conditions: silicon was used as a sputtering target, argon and nitrogen were supplied to a treatment chamber of a sputtering apparatus as a sputtering gas at flow rates of 5 sccm and 20 sccm, respectively, the pressure in the treatment chamber was controlled to 0.2 Pa, and an RF power of 3.0 kW was supplied. Note that the substrate temperature in the deposition of the silicon nitride film was 350° C. For comparison, a comparative example sample in which an thermal oxide film and the first silicon nitride film were formed over a silicon wafer was prepared.

Figure 30:
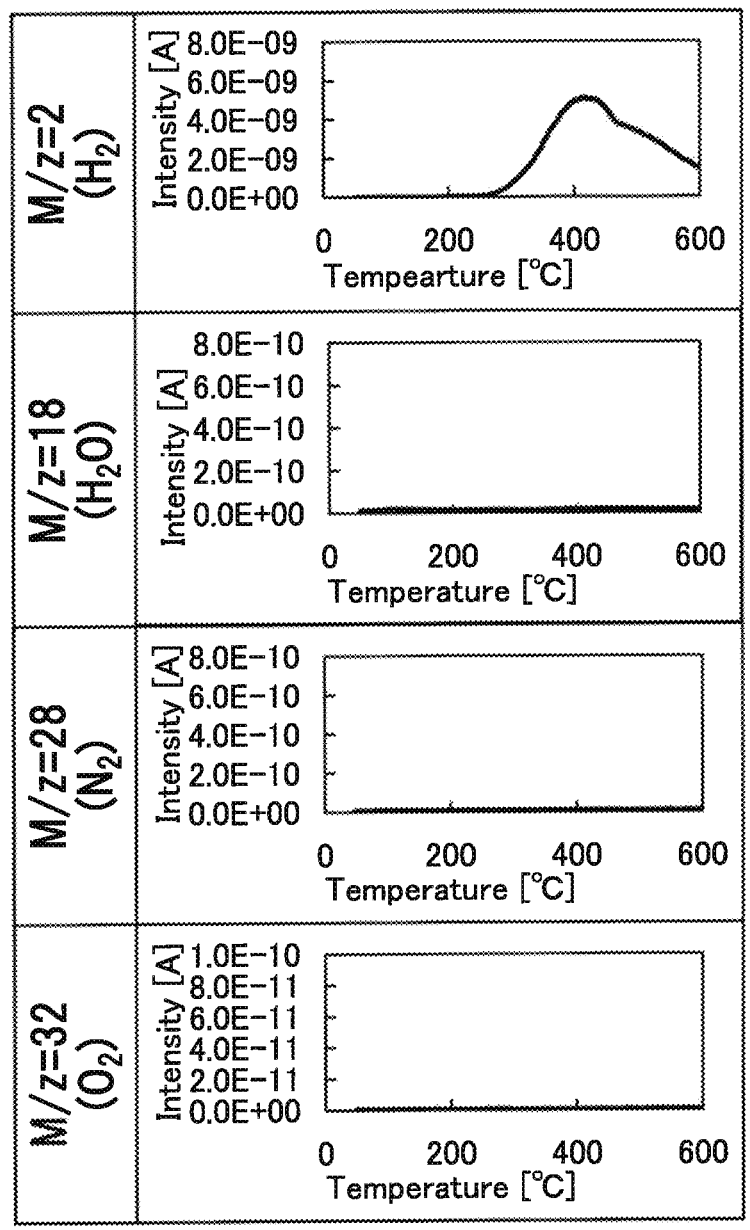
FIG. 30 shows TDS measurement results of a sample formed in an example.
Figure 31:
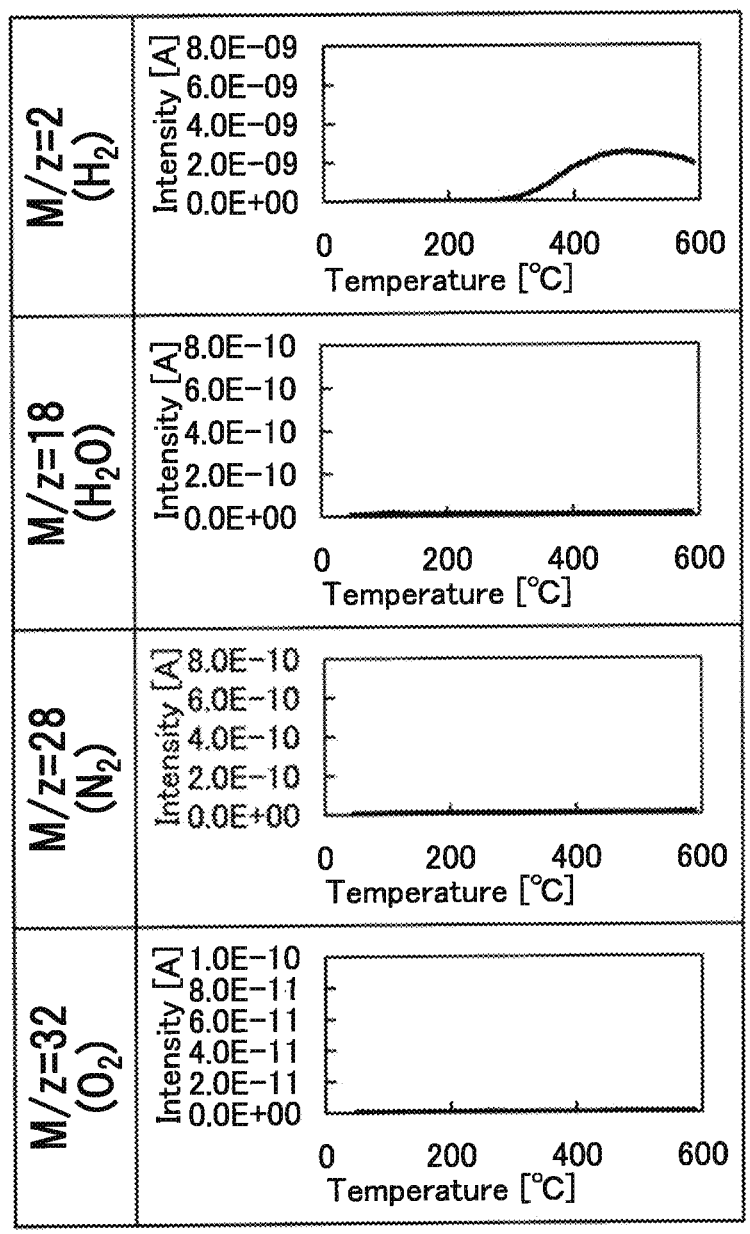
FIG. 31 shows TDS measurement results of a sample formed in an example.
Figure 33:
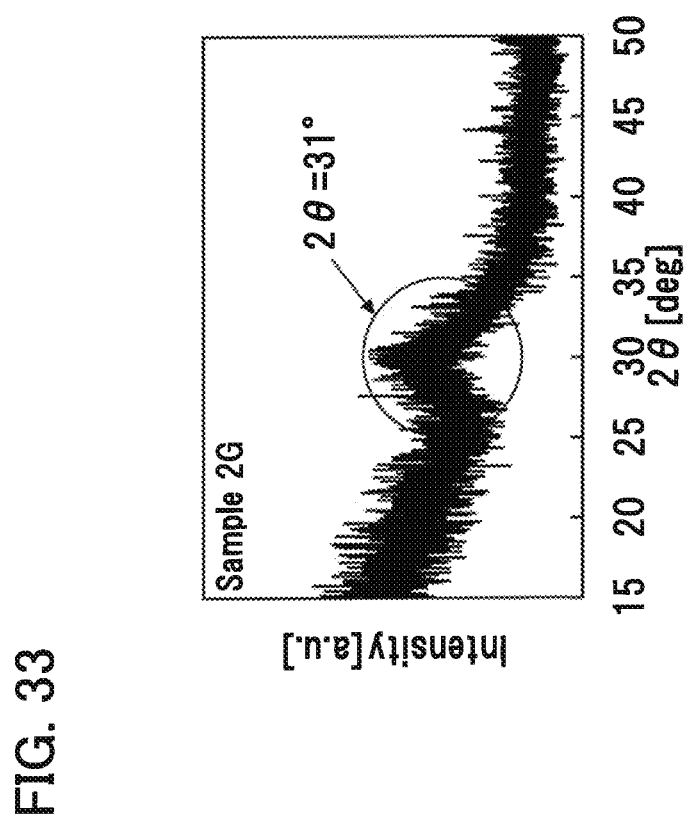
FIG. 33 shows measurement results of an XRD spectra of a sample formed in an example.

Each sample was subjected to TDS analysis. FIG. 30 shows the TDS results of M/z=2 ($H_2$), M/z=18 ($H_2O$), M/z=28 ($N_2$), and M/z=32 ($O_2$) measured in the comparative example sample. FIG. 31 shows the TDS results of M/z=2 ($H_2$), M/z=18 ($H_2O$), M/z=28 ($N_2$), and M/z=32 ($O_2$) measured in the example sample.

According to FIG. 30 and FIG. 31, when the heating temperature is lower than or equal to 400° C., the intensity of hydrogen ($H_2$) is reduced owing to the second silicon nitride film.

This results show that the second silicon nitride film formed by a sputtering method has a high barrier property against hydrogen.

Example 2

In this example, the crystal state of an oxide semiconductor film was measured by X-ray diffraction (XRD). Methods for forming Samples 2A to 2G used for the measurement are described.

First, a thermal oxidation film was formed over a silicon wafer. The thermal oxidation film was formed to a thickness of 100 nm at 950° C. in an oxygen atmosphere containing HCl at 3%. Next, a 300-nm-thick silicon oxide film was deposited over the thermal oxidation film by a sputtering method. The silicon oxide film was formed in the following manner: silicon oxide was used as a sputtering target, oxygen was supplied to a treatment chamber of a sputtering apparatus as a sputtering gas at a flow rate of 50 sccm, the pressure in the treatment chamber was controlled to 0.4 Pa, and an RF power of 1.5 kW was supplied. Note that the substrate temperature in the deposition of the silicon oxide film was 100° C.

Next, a multilayer film was deposited over the silicon oxide film. The multilayer film included three layers and was formed in the following manner. First, a 5-nm-thick In—Ga—Zn oxide film having an atomic ratio of In:Ga:Zn=1:3:2 was deposited as a first oxide film over a silicon oxide film. The In—Ga—Zn oxide film was formed under the following conditions: a sputtering target having an atomic ratio of In:Ga:Zn=1:3:2 was used; argon and oxygen were supplied to a treatment chamber of a sputtering apparatus as a sputtering gas at flow rates of 15 sccm and 30 sccm, respectively; the pressure in the treatment chamber was controlled to 0.4 Pa; and a DC power of 0.5 kW was supplied. Note that the substrate temperature in the deposition of the In—Ga—Zn oxide film was 200° C.

Next, a 15-nm-thick In—Ga—Zn oxide film having an atomic ratio of In:Ga:Zn=1:1:1 was deposited as an oxide semiconductor film over the first oxide film. The In—Ga—Zn oxide film was formed under the following conditions: a sputtering target having an atomic ratio of In:Ga:Zn=1:1:1 was used; argon and oxygen were supplied to a treatment chamber of a sputtering apparatus as a sputtering gas at flow rates of 30 sccm and 15 sccm, respectively; the pressure in the treatment chamber was controlled to 0.4 Pa; and a DC power of 0.5 kW was supplied. Note that the substrate temperature in the deposition of the In—Ga—Zn oxide film was 400° C.

Next, an In—Ga—Zn oxide film having an atomic ratio of In:Ga:Zn=1:3:2 was deposited as a second oxide film over the oxide semiconductor film. The In—Ga—Zn oxide film was formed under the following conditions: a sputtering target having an atomic ratio of In:Ga:Zn=1:3:2 was used; argon and oxygen were supplied to a treatment chamber of a sputtering apparatus as a sputtering gas at flow rates of 30 sccm and 15 sccm, respectively; the pressure in the treatment chamber was controlled to 0.4 Pa; and a DC power of 0.5 kW was supplied. Note that the substrate temperature in the deposition of the In—Ga—Zn oxide film was set at 200° C. Note that the thickness of the third oxide semiconductor film was 5 nm, 10 nm, and 15 nm.

Next, oxygen ($O_2^+$) was added to the IGZO film by an ion implantation method. Note that the conditions of the addition were as follows: an acceleration voltage of 5 kV and a dosage of $5.0 \times 10^{15}$ ions/cm$^2$.

Through the above process, Sample 2A in which the thickness of the second oxide film was 5 nm, Sample 2B in which the thickness of the second oxide film was 10 nm, and Sample 2C in which the thickness of the second oxide film was 20 nm were formed.

Samples 2D to 2F are described. Just after the second oxide film was formed, a 20-nm-thick silicon oxynitride film was formed over the second oxide film. The silicon oxynitride film was formed under the following conditions: silane and dinitrogen monoxide were supplied to a reaction chamber of a plasma CVD apparatus at flow rates of 1 sccm and 800 sccm, respectively, the pressure in the reaction chamber was controlled to 40 Pa, and a power of 100 W was supplied with the use of a 27.12 MHz high-frequency power source. Note that the silicon oxynitride was formed at a substrate temperature of 350° C.

Next, oxygen ($^{16}O_2^+$) was added to the silicon oxynitride film by an ion implantation method. Note that the conditions of the addition were as follows: an acceleration voltage of 5 kV and a dosage of $5.0 \times 10^{15}$ ions/cm$^2$.

Through the above process, Sample 2D in which the thickness of the second oxide film was 5 nm, Sample 2E in which the thickness of the second oxide film was 10 nm, and Sample 2F in which the thickness of the second oxide film was 20 nm were formed.

Sample 2G which is Sample 2A formed without addition of oxygen was formed as a comparative example.

Then, FIGS. 32A to 32F and FIG. 33 show results of measurement of XRD spectra of Sample 2A to Sample 2G by an out-of-plane method. In FIGS. 32A to 32F and FIG. 33, the vertical axis represents the X-ray diffraction intensity (given unit) and the horizontal axis represents the diffraction angle 2θ (deg.). Note that the XRD spectra were measured with the use of an X-ray diffractometer D8 ADVANCE manufactured by Bruker AXS.

As shown in the XRD spectra in FIGS. 32A to 32C, in the case where oxygen was directly added to the second oxide film, a peak around 2θ=31° which was derived from a crystal became small as the thickness of the second oxide film was reduced. Further, as shown in FIGS. 32D to 32F, in the case where oxygen was added to the second oxide film through the silicon oxynitride film, a peak derived from a crystal was observed around 2θ=31° regardless of the thickness of the second oxide film, which showed that a crystalline oxide semiconductor film was formed. Further, there was no difference in peak around 2θ=31° derived from a crystal between the XRD spectra of FIGS. 32D to 32F and the XRD spectra of FIG. 33, which showed that the crystalline oxide semiconductor film was protected by the silicon oxynitride film.

Example 3

In this example, a conductive film was formed over an oxide film which is formed over an oxide semiconductor film and then the conductive film was removed. After that, the sheet resistance of the oxide film was measured. Methods for forming Samples 3A to 3H which were used for the measurement are described.

First, a thermal oxidation film was formed over a silicon wafer. The thermal oxidation film was deposited to a thickness of 100 nm at 950° C. in an oxygen atmosphere containing HCl at 3%. Next, a 300-nm-thick silicon oxide film was deposited over the thermal oxidation film by a sputtering method. The silicon oxide film was formed in the following manner: silicon oxide was used as a sputtering target, oxygen was supplied to a treatment chamber of a sputtering apparatus as a sputtering gas at a flow rate of 50 sccm, the pressure in the treatment chamber was controlled to 0.4 Pa, and an RF power of 1.5 kW was supplied. Note that the substrate temperature in the deposition of the silicon oxide film was 100° C.

Next, a multilayer film was deposited over the silicon oxide film. The multilayer film included three layers and was formed in the following manner. First, a 20-nm-thick In—Ga—Zn oxide film having an atomic ratio of In:Ga:Zn=1:3:2 was deposited as a first oxide film over a silicon oxide film. The In—Ga—Zn oxide film was formed under the following conditions: a sputtering target having an atomic ratio of In:Ga:Zn=1:3:2 was used; argon and oxygen were supplied to a treatment chamber of a sputtering apparatus as a sputtering gas at flow rates of 15 sccm and 30 sccm, respectively; the pressure in the treatment chamber was controlled to 0.4 Pa; and a DC power of 0.5 kW was supplied. Note that the substrate temperature in the deposition of the In—Ga—Zn oxide film was 200° C.

Next, a 15-nm-thick In—Ga—Zn oxide film having an atomic ratio of In:Ga:Zn=1:1:1 was deposited as an oxide semiconductor film over the first oxide film. The In—Ga—Zn oxide film was formed under the following conditions: a sputtering target having an atomic ratio of In:Ga:Zn=1:1:1 was used; argon and oxygen were supplied to a treatment chamber of a sputtering apparatus as a sputtering gas at flow rates of 30 sccm and 15 sccm, respectively; the pressure in the treatment chamber was controlled to 0.4 Pa; and a DC power of 0.5 kW was supplied. Note that the substrate temperature in the deposition of the In—Ga—Zn oxide film was 300° C.

Next, an In—Ga—Zn oxide film having an atomic ratio of In:Ga:Zn=1:3:2 was deposited as a second oxide film over the oxide semiconductor film. The In—Ga—Zn oxide film was formed under the following conditions: a sputtering target having an atomic ratio of In:Ga:Zn=1:3:2 was used; argon and oxygen were supplied to a treatment chamber of a sputtering apparatus as a sputtering gas at flow rates of 30 sccm and 15 sccm, respectively; the pressure in the treatment chamber was controlled to 0.4 Pa; and a DC power of 0.5 kW was supplied. Note that the substrate temperature in the deposition of the In—Ga—Zn oxide film was set at 200° C. Note that the thickness of the third oxide semiconductor film was 0 nm, 5 nm, 10 nm, and 15 nm.

Next, first heat treatment was performed. The first heat treatment was performed at 450° C. in a nitrogen atmosphere for one hour, and then performed at 450° C. in an oxygen atmosphere for one hour.

Next, a 100-nm-thick tungsten film was deposited as a conductive film over the second oxide film. The tungsten film was formed under the following conditions: a sputtering target of tungsten was used; argon and heated argon were supplied to a treatment chamber of a sputtering apparatus as a sputtering gas at flow rates of 80 sccm and 10 sccm, respectively; the pressure in the treatment chamber was controlled to 0.8 Pa; and a DC power of 1.0 kW was supplied.

Next, second heat treatment was performed. The second treatment was performed at 400° C. in an oxygen atmosphere for one hour.

Through the above process, Sample 3A in which the thickness of the second oxide film was 0 nm, Sample 3B in which the thickness of the second oxide film was 5 nm, Sample 3C in which the thickness of the second oxide film was 10 nm, and Sample 3D in which the thickness of the second oxide film was 20 nm were formed.

For comparison, samples which was not subjected to the second heat treatment was formed. Sample 3E in which the thickness of the second oxide film was 0 nm, Sample 3F in which the thickness of the second oxide film was 5 nm, Sample 3G in which the thickness of the second oxide film was 10 nm, and Sample 3H in which the thickness of the second oxide film was 20 nm were formed.

Next, the tungsten film was dry-etched. The etching was performed under the following conditions: $Cl_2$ with a flow rate of 45 sccm, $CH_4$ with a flow rate of 55 sccm, and $O_2$ with a flow rate of 55 sccm were used as an etching gas, the bias power was 110 W, the power of the ICP power source was 3000 W, and the pressure was 0.67 Pa. Note that the substrate temperature at the time of the dry etching of the tungsten film was 40° C.

Next, oxygen ($^{18}O_2$) was added to the second oxide film by an ion implantation method. Note that the conditions of the addition were as follows: an acceleration voltage of 5 kV and a dosage of $5.0 \times 10^{15}$ ions/cm$^2$.

Further, for comparison, samples to which an oxygen ion was not added were also formed.

Next, the second oxide film was etched and a sheet resistance value with respect to the etching depth was measured. A mixed solution of hydrogen peroxide water and ammonia (hydrogen peroxide water:ammonia water:water=5:2:5) was used for the etching. The remaining thickness of the second oxide film after the etching was measured using spectroscopic ellipsometry before and after the etching in order to obtain the depth to which the second oxide film was etched.

Figure 34:
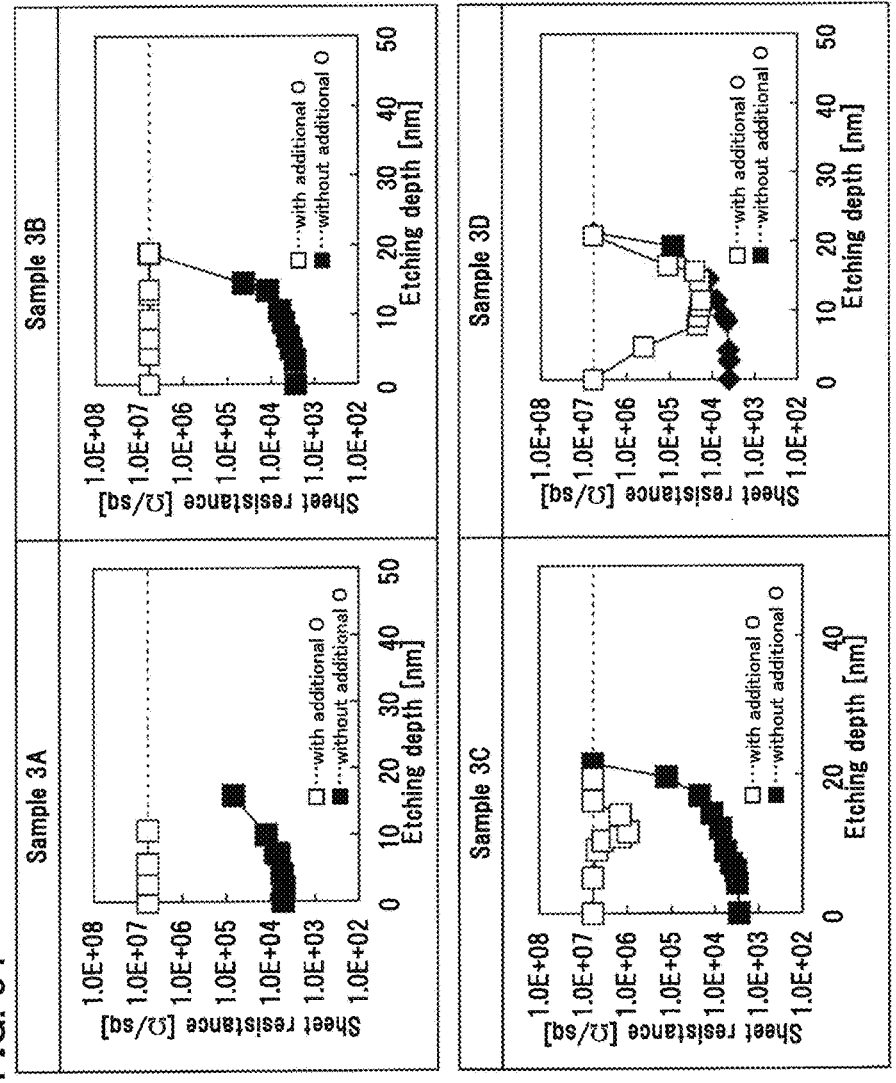
FIG. 34 shows measurement results of sheet resistances of samples formed in an example.
Figure 35:
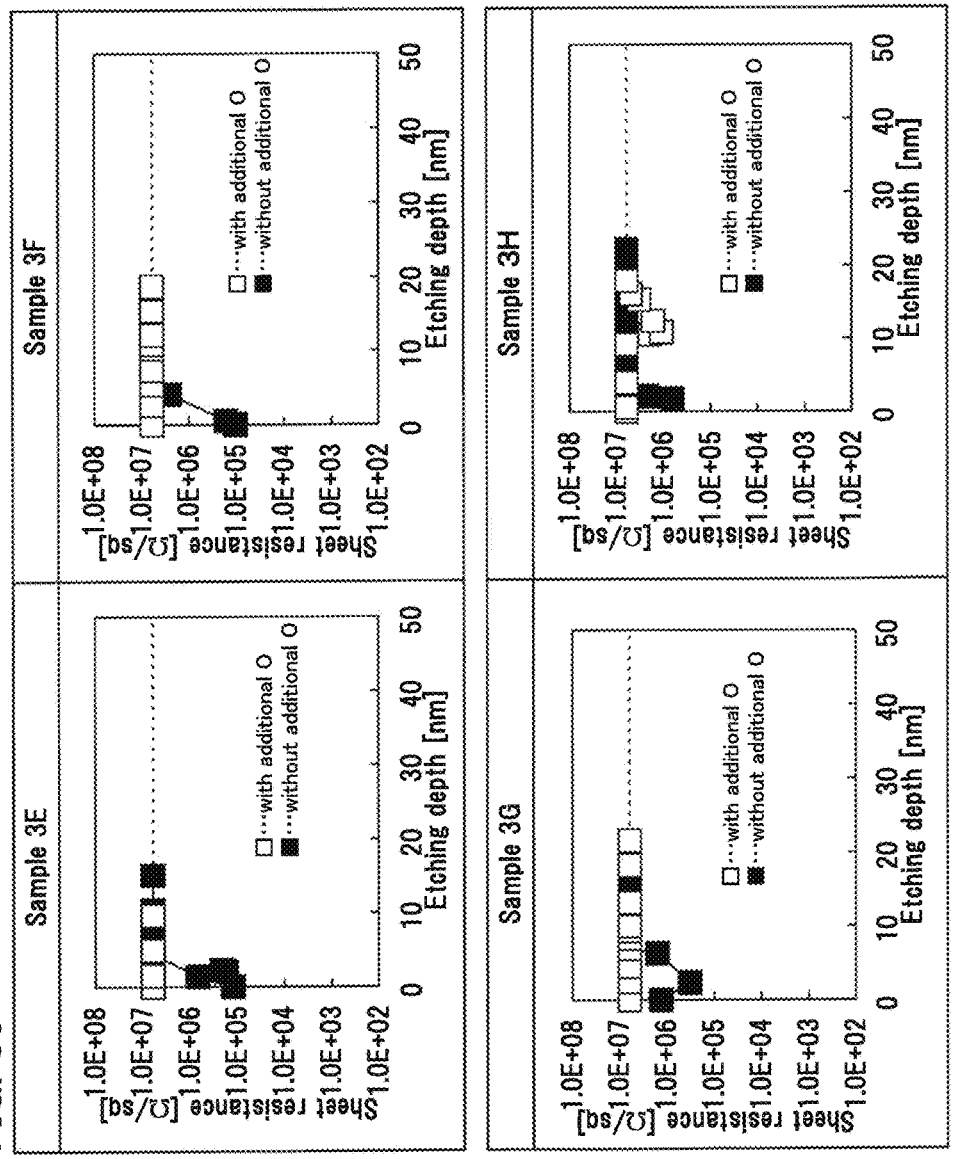
FIG. 35 shows measurement results of sheet resistances of samples formed in an example.

FIG. 34 shows the sheet resistances of Sample 3A to 3D, which were subjected to the heat treatment, and FIG. 35 shows the sheet resistances of Samples 3E to 3H, which were not subjected to the heat treatment. Note that dotted lines in the drawings each denote the measurement limit value (6M Ω/square).

FIG. 34 and FIG. 35 show that the sheet resistance value is increased by addition of oxygen and the sheet resistance value is reduced by heat treatment. Further, FIG. 34 and FIG. 35 show that when oxygen is added in the case where the second oxide film has a large thickness, the resistance around the surface is increased but a low-resistance region exists in the second oxide film.

It was found that in the samples in which the tungsten film was formed over the IGZO film (the second oxide film), the resistance of a region of the IGZO film, which was formed to a depth of about 15 nm from the surface of the IGZO film, was reduced. This suggests that a low-resistant mixed layer of IGZO and tungsten is formed in the vicinity of the surface of the second oxide film, and that an n-type region is formed owing to oxygen vacancies which exist in the vicinity of the surface of the IGZO film by transfer of oxygen of the IGZO film to the tungsten film, for example.

Example 4

In this example, evaluation results of a multilayer film obtained by secondary ion mass spectrometry (SIMS) are described.

The following samples were analyzed: Sample 3E, Sample 3F, and Sample 3G which were used in Example 3, and Sample 4A which was Sample 3F in which the thickness of the second oxide film was 15 nm. Oxygen was added to each sample by an ion implantation method.

Figure 36:
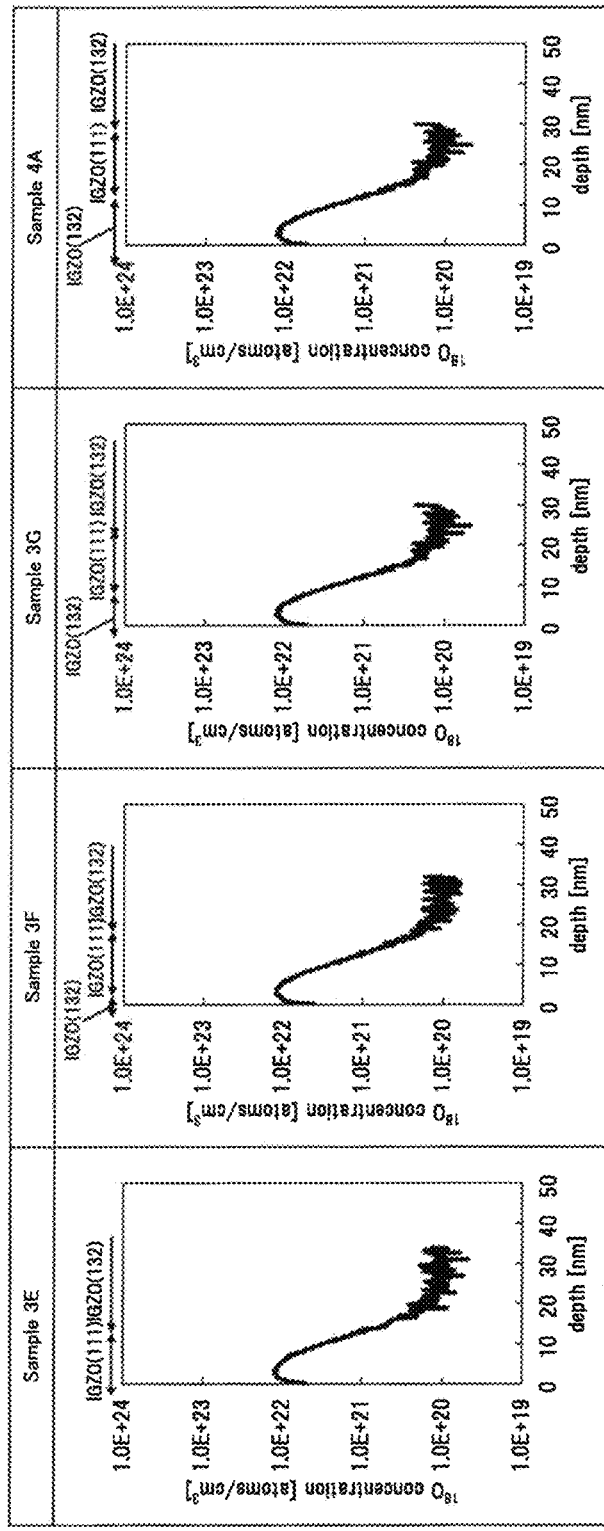
FIG. 36 shows SIMS analysis results of samples formed in an example.

FIG. 36 shows $^{18}O$ concentration profiles of Samples 3E to 3G and Sample 4A.

In each sample, a peak of the $^{18}O$ concentration was observed at a depth of approximately 5 nm from a surface of the multilayer film to which oxygen was added. Further, it was found that $^{18}O$ was diffused to a region at a depth of approximately 20 nm from the surface of the multilayer film.

Example 5

In this example, a transistor was formed and electrical characteristics thereof were evaluated. A method for forming a sample used for the evaluation is described.

First, a thermal oxidation film was formed over a silicon wafer. The thermal oxidation film was formed to a thickness of 100 nm at 950° C. in an oxygen atmosphere containing HCl at 3%. Next, a 300-nm-thick silicon oxide film was deposited over the thermal oxidation film by a sputtering method. The silicon oxide film was formed in the following manner: silicon oxide was used as a sputtering target, oxygen was supplied to a treatment chamber of a sputtering apparatus as a sputtering gas at a flow rate of 50 sccm, the pressure in the treatment chamber was controlled to 0.4 Pa, and an RF power of 1.5 kW was supplied. Note that the substrate temperature in the deposition of the silicon oxide film was 100° C.

Next, heat treatment was performed. The heat treatment was performed in a vacuum (reduced pressure) atmosphere at 450° C. for one hour. After that, oxygen ($^{16}O$) was added to the silicon oxide film by an ion implantation method. Note that the conditions of the addition were as follows: an acceleration voltage of 60 kV and a dosage of $2.0 \times 10^{16}$ ions/cm$^2$.

Next, a multilayer film was deposited over the silicon oxide film. The multilayer film included three layers and was formed in the following manner. First, a 20-nm-thick In—Ga—Zn oxide film having an atomic ratio of In:Ga:Zn=1:3:2 was deposited as a first oxide film over a silicon oxide film. The In—Ga—Zn oxide film was formed under the following conditions: a sputtering target having an atomic ratio of In:Ga:Zn=1:3:2 was used; argon and oxygen were supplied to a treatment chamber of a sputtering apparatus as a sputtering gas at flow rates of 15 sccm and 30 sccm, respectively; the pressure in the treatment chamber was controlled to 0.4 Pa; and a DC power of 0.5 kW was supplied. Note that the substrate temperature in the deposition of the In—Ga—Zn oxide film was 200° C.

Next, a 15-nm-thick In—Ga—Zn oxide film having an atomic ratio of In:Ga:Zn=1:1:1 was deposited as an oxide semiconductor film over the first oxide film. The In—Ga—Zn oxide film was formed under the following conditions: a sputtering target having an atomic ratio of In:Ga:Zn=1:1:1 was used; argon and oxygen were supplied to a treatment chamber of a sputtering apparatus as a sputtering gas at flow rates of 30 sccm and 15 sccm, respectively; the pressure in the treatment chamber was controlled to 0.4 Pa; and a DC power of 0.5 kW was supplied. Note that the substrate temperature in the deposition of the In—Ga—Zn oxide film was 300° C.

Next, a 10-nm-thick In—Ga—Zn oxide film having an atomic ratio of In:Ga:Zn=1:3:2 was deposited as a second oxide film over the oxide semiconductor film. The In—Ga—Zn oxide film was formed under the following conditions: a sputtering target having an atomic ratio of In:Ga:Zn=1:3:2 was used; argon and oxygen were supplied to a treatment chamber of a sputtering apparatus as a sputtering gas at flow rates of 30 sccm and 15 sccm, respectively; the pressure in the treatment chamber was controlled to 0.4 Pa; and a DC power of 0.5 kW was supplied. Note that the substrate temperature in the deposition of the In—Ga—Zn oxide film was set at 200° C.

Next, first heat treatment was performed. The first heat treatment was performed under a nitrogen atmosphere at 450° C. for one hour, and then performed under an oxygen atmosphere at 450° C. for one hour.

Next, a 100-nm-thick tungsten film was deposited as a conductive film over the second oxide film. The tungsten film was formed under the following conditions: a sputtering target of tungsten was used; argon and heated argon were supplied to a treatment chamber of a sputtering apparatus as a sputtering gas at flow rates of 80 sccm and 10 sccm, respectively; the pressure in the treatment chamber was controlled to 0.8 Pa; and a DC power of 1.0 kW was supplied. After the formation of the tungsten film, the tungsten film was partly etched (etching conditions: an etching gas ($CF_4$=55 sccm, $Cl_2$=45 sccm, $O_2$=55 sccm), a power of an ICP power supply of 3000 W, a bias power of 110 W, a pressure of 0.67 Pa, and a substrate temperature of 40° C.), whereby a source electrode and a drain electrode were formed.

Then, oxygen ($^{16}O_2^+$) was added to the multilayer film by an ion implantation method. Note that the conditions of the addition were as follows: an acceleration voltage of 5 kV and a dosage of $5.0 \times 10^{15}$ ions/$cm^2$.

Next, a gate insulating film was formed. A 20-nm-thick silicon oxide film was formed as the gate insulating film. The silicon oxide film was formed by a CVD method in which the pressure in a reaction chamber was controlled to 200 Pa.

Next, a gate electrode was formed. A 30-nm-thick tantalum nitride film was formed by a sputtering method and a 135-nm-thick tungsten film was formed over the tantalum nitride film by a sputtering method. The tantalum nitride film was formed under the following conditions: tantalum nitride was used as a sputtering target; argon and nitrogen were supplied to a treatment chamber of a sputtering apparatus as a sputtering gas at flow rates of 50 sccm and 10 sccm, respectively; the pressure in the treatment chamber was controlled to be 0.6 Pa; and a DC power of 1.0 kW was supplied. The tungsten film was formed under the following conditions: tungsten was used as a sputtering target; argon and heated argon were supplied to a treatment chamber of a sputtering apparatus as a sputtering gas at flow rates of 100 sccm and 10 sccm, respectively; the pressure in the treatment chamber was controlled to be 2.0 Pa; and a DC power of 4.0 kW was supplied. After the deposition of the tungsten film, the tantalum nitride film and part of the tungsten film were etched (etching conditions of the tungsten film: an etching gas ($CF_4$=55 sccm, $Cl_2$=45 sccm, $O_2$=55 sccm), a power of an ICP power source of 3000 W, a bias power of 110 W, a pressure of 0.67 Pa, and a substrate temperature of 40° C.; etching conditions of the tantalum nitride film: an etching gas ($Cl_2$=100 sccm), a power of an ICP power supply of 2000 W, a bias power of 50 W, a pressure of 0.67 Pa, and a substrate temperature of 40° C.), so that the gate electrode was formed.

Then, an oxide insulating film was formed. A 70-nm-thick aluminum oxide film was formed by sputtering and then a 135-nm-thick silicon oxynitride film was formed over the aluminum oxide film by a CVD method.

Then, openings reaching the source electrode and the drain electrode were formed in the gate insulating film and the oxide insulating film.

A wiring layer (a 200-nm-thick aluminum film was formed over a 50-nm-thick titanium film and a 50-nm-thick titanium film was formed over the 200-nm-thick aluminum film) was formed in the openings.

A 1.5-μm-polyimide film was formed over the wiring layers and was subjected to heat treatment at 300° C. in the air for one hour.

Through the above process, an example transistor with a channel length of 0.44 μm and a channel width of 1 μm was formed. Further, a comparative example transistor to which oxygen was not added was formed for comparison.

Figure 37A:
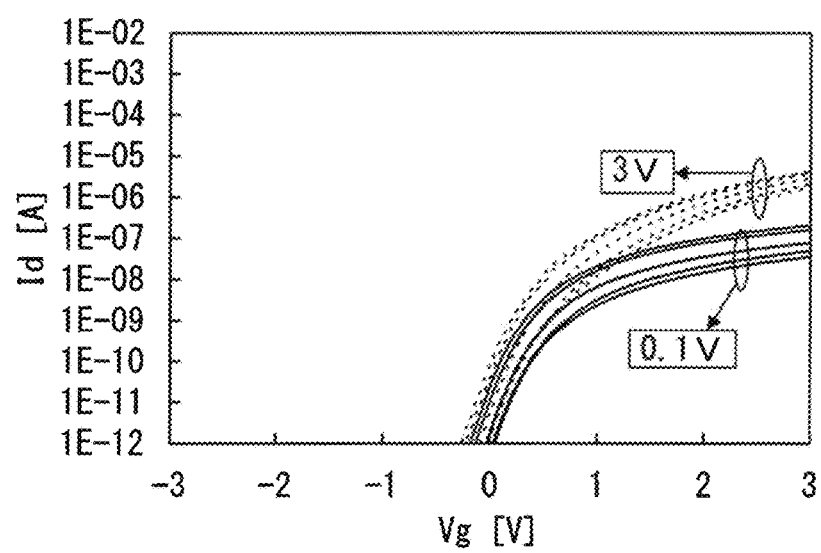
FIGS. 37A and 37B each show evaluation results of electric characteristics of transistors formed in an example.
Figure 37B:
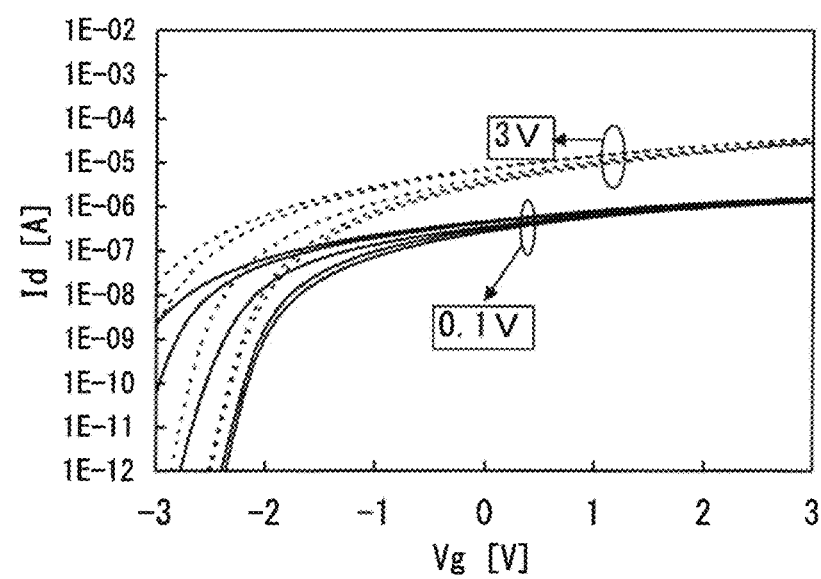

Next, in the formed transistors, a drain current ($I_d$: [A]) was measured under the conditions where a drain voltage ($V_d$: [V]) was set to 3 V or 0.1 V and a gate voltage ($V_g$: [V]) was swept from −3 V to 3 V. FIG. 37A shows measurement results of the example transistor and FIG. 37B shows measurement results of the comparative example transistor. FIGS. 37A and 37B show measurement results in the cases of drain voltages ($V_d$: [V]) of 3 V and 0.1 V, where the horizontal axis represents the gate voltage ($V_g$: [V]) and the vertical axis represents the drain current ($I_d$: [A]). Note that "drain voltage ($V_d$: [V])" refers to a potential difference between a drain and the source when the potential of the source is used as a reference potential, and "gate voltage ($V_g$: [V])" refers to a potential difference between a gate and a source when the potential of the source is used as a reference potential.

It was found that electrical characteristic variation of the transistor formed in this example shown in FIG. 37A was smaller than that of the comparative example transistor shown in FIG. 37B.

The above results suggested that the transistor in this example had extremely high electric characteristics.

Reference Example 1

Measurement of Vg-Id characteristics of a transistor shows that a gate voltage (also referred to as a rising gate voltage) at which on-state current due to a drain voltage Vd begins to flow varies as the channel length of the transistor is reduced. Thus, a relation between the channel length and the rising gate voltage was examined by calculation.

Figure 38:
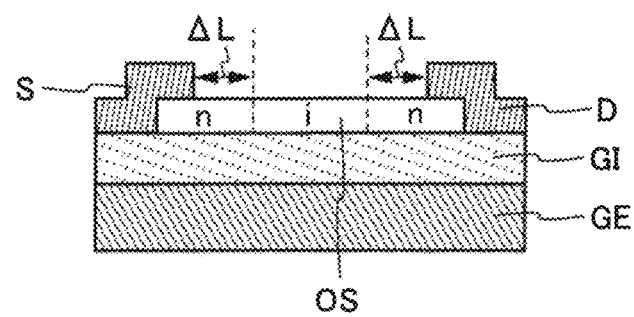
FIG. 38 illustrates the structure of a transistor formed in an example.

FIG. 38 illustrates a structure of the transistor structure assumed in the calculation. In FIG. 38, "OS" denotes an oxide semiconductor film, "S" denotes a source electrode, "D" denotes a drain electrode, "GI" denotes a gate insulating film, and "GE" denotes a gate electrode. Note that an n-layer (denoted by "n" in the drawings) having higher carrier density than the oxide semiconductor film is included between the oxide semiconductor film and the source and drain electrodes. An oxide semiconductor film (OS) is shown as an i-layer (denoted by "i") to be distinguished from the n-layer. Each length of regions in the channel length direction of the n-layer which do not overlap with the source and drain electrodes is denoted by ΔL. At this time, when an effective channel length Leff is defined as Leff=L−2ΔL (ΔL≥0), Leff is shorter than the channel length L.

The following calculation conditions were employed: L (channel length) was 2 μm; W (channel width) was 1 μm; the work function of the gate electrode was 5 eV, the gate insulating film was a stack in which a 400-nm-thick silicon nitride film (the dielectric constant ε=7.5) and a 50-nm-thick silicon oxynitride film (the dielectric constant ε=4.1) were stacked sequentially from the gate electrode side; and the oxide semiconductor film had a thickness of 35 nm. An energy difference Eg between the bottom of the conduction band and the top of the valence band in the oxide semiconductor film was 3.2 eV. The electron affinity x of the oxide semiconductor film was 4.8 eV. The dielectric constant ε of the oxide semiconductor film was 15. The electron mobility $\mu n$ of the oxide semiconductor film was 10 cm$^2$/Vs. The hole mobility $\mu m$ of the oxide semiconductor film was 0.01 cm$^2$/Vs. The effective density of states Nc in the conduction band was 5×10$^{18}$ cm$^{-3}$. The effective density of states Nv in the valence band was 5×10$^{18}$ cm$^{-3}$. The donor density Nd was 6.6×10$^{-9}$ cm$^{-3}$. Further, the donor density of the n-layer was 5×10$^{18}$ cm$^{-3}$. Note that four conditions of the length $\Delta L$, i.e., 0 µm, 0.1 µm, 0.3 µm, and 0.5 µm were used for the calculation.

Figure 39:
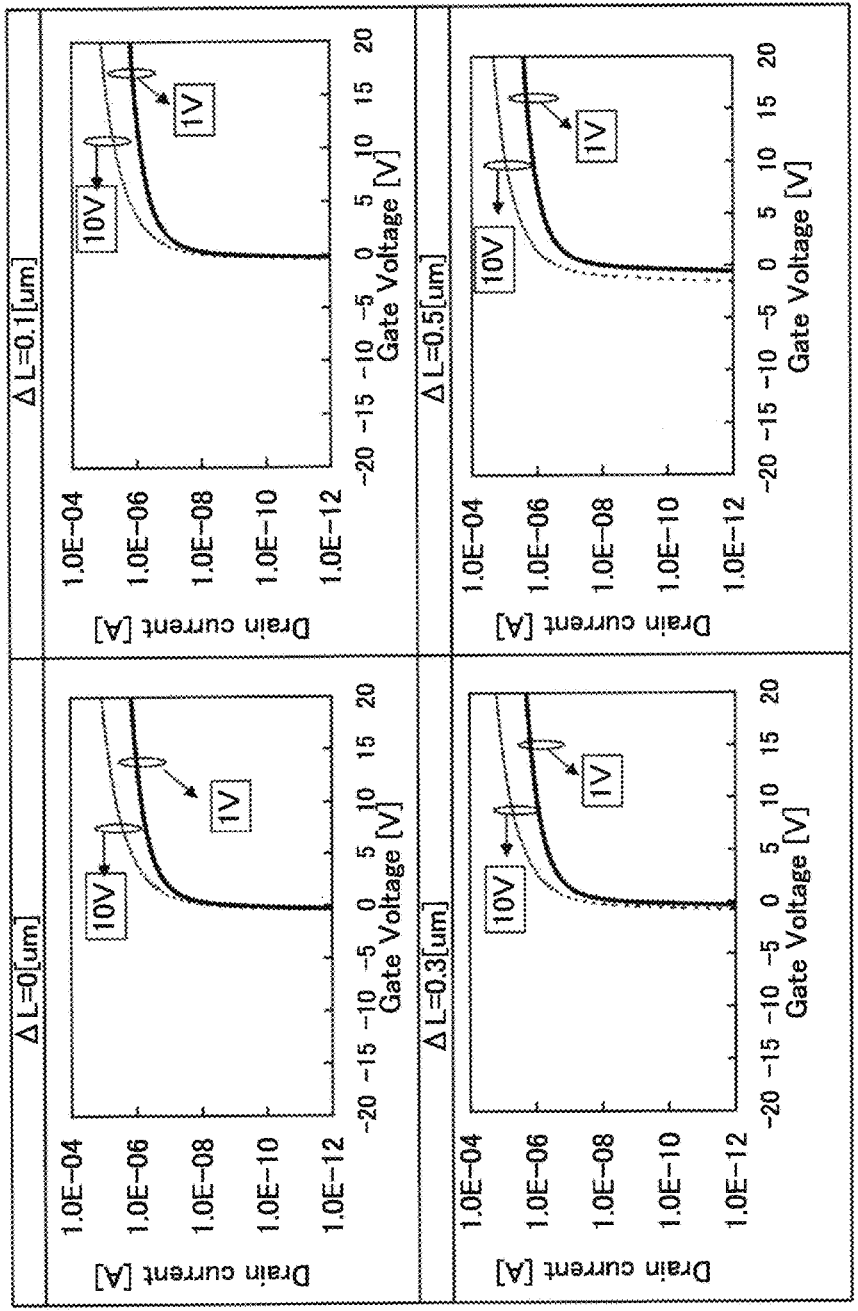
FIG. 39 shows calculation results of electrical characteristics of a transistor formed in an example.

The calculation results are shown in FIG. 39. As shown in FIG. 39, the rising gate voltage at a drain voltage Vd of 1 V was the same as that at a drain voltage of 10 V in the following cases: when the length $\Delta L$ was 0 µm (that is, the effective channel length was 2.0 µm), when the length $\Delta L$ was 0.1 µm (that is, the effective channel length was 1.8 µm (10% of the channel length was the length $\Delta L$)), and when the length $\Delta L$ was 0.3 µm (that is, the effective channel length was 1.4 µm (30% of the channel length was $\Delta L$)). On the other hand, when the length $\Delta L$ was 0.5 µm (that is, the effective channel length was 1.0 µm), the rising gate voltage at a drain voltage Vd of 1 V was different from that at a drain voltage of 10 V, i.e., the rising positions, were split.

The above results show that the ring positions are split when the effective channel length is short, and therefore, when the n-layer is made an i-layer by addition of oxygen to the oxide semiconductor film, the effective channel length can be increased and the split of the rising positions can be prevented.

The length $\Delta L$ is less than 30%, preferably less than 10%, further preferably less than 3% of the channel length. The width of the split at 1 pA/µm between two drain voltages which are different by one or more digits is smaller than a larger one of the two drain voltages. The width of the split is preferably less than ⅓ of the larger one of the two drain voltages.

EXPLANATION OF REFERENCE

100: substrate, 102: base insulating film, 104: multilayer film, 104a: oxide film, 104b: oxide semiconductor film, 104c: oxide film, 104d: region, 104e: oxide film, 105: low-resistance region, 105a: low-resistance region, 105b: low-resistance region, 105c: region, 106: conductive film, 106a: source electrode, 106b: drain electrode, 107a: conductive film, 107b: conductive film, 108: gate insulating film, 110: gate electrode, 112: oxide insulating film, 114: nitride insulating film, 120: oxygen, 150: transistor, 190: transistor, 195: transistor, 200: transistor, 210: transistor, 220: transistor, 230: transistor, 240: transistor, 250: transistor, 290: transistor, 295: transistor, 300: transistor, 310: transistor, 320: transistor, 330: transistor, 340: transistor, 400: transistor, 402: transistor, 404: capacitor, 406: element isolation insulating layer, 410: substrate, 420: insulating film, 550: memory cell, 551: memory cell array, 551a: memory cell array, 551b: memory cell array, 553: peripheral circuit, 554: capacitor, 562: transistor, 600: sputtering target, 601: ion, 602: sputtered particle, 603: deposition surface, 700: microcomputer, 701: direct-current power source, 702: bus line, 703: power gate controller, 704: power gate, 705: CPU, 706: volatile memory portion, 707: nonvolatile memory portion, 708: interface, 709: sensor portion, 711: optical sensor, 712: amplifier, 713: AD converter, 730: light-emitting element, 801: semiconductor substrate, 803: element isolation region, 804: gate electrode, 805a: low-resistance region, 805b: low-resistance region, 806a: oxide film, 806b: oxide semiconductor film, 806c: oxide film, 807: gate insulating film, 809: gate electrode, 811a: impurity region, 811b: impurity region, 812: gate insulating film, 815: insulating film, 816a: source electrode, 816b: drain electrode, 816c: electrode, 817: insulating film, 818: oxide insulating film, 819a: contact plug, 819b: contact plug, 820: insulating film, 821: insulating film, 822: insulating film, 823a: wiring, 823b: wiring, 825: insulating film, 845: insulating film, 849: wiring, 856: wiring, 860: semiconductor film, 870: transistor, 880: transistor, 890: photoelectric conversion element, 901: switching element, 902: memory cell, 903: memory cell group, 919: ROM interface, 920: substrate, 921: ALU, 922: ALU controller, 923: instruction decoder, 924: interrupt controller, 925: timing controller, 926: register, 927: register controller, 928: bus interface, 929: ROM, 1000: display device, 1001: housing, 1002: display portion, 1003: speaker portion, 1004: CPU, 1010: alarm device, 1011: microcomputer, 1020: indoor unit, 1021: housing, 1022: air outlet, 1023: CPU, 1024: outdoor unit, 1030: electric refrigerator-freezer, 1031: housing, 1032: door for a refrigerator, 1033: door for a freezer, 1034: CPU, 1040: electric vehicle, 1041: secondary battery, 1042: control circuit, 1043: driving device, 1044: processing unit, 1100: pixel portion, 1101: pixel, 1102: substrate, 1103: transistor, 1104: scan line driver circuit, 1105: capacitor, 1106: signal line driver circuit, 1107: scan line, 1108: liquid crystal element, 1109: signal line, 1111: semiconductor film, 1113: conductive film, 1115: capacitor line, 1117: opening, 1120: conductive film, 1121a: electrode, 1121b: pixel electrode, 1123a: opening, 1123b: opening, 1125: conductive film, 1127: gate insulating film, 1129: insulating film, 1131: insulating film, 1132: insulating film, 1133: insulating film, 1154: counter electrode, 1623: transistor, 1627: gate electrode, 1628: semiconductor film, 1629: source electrode, 1639: drain electrode, 1641: conductive film.

This application is based on Japanese Patent Application serial no. 2012-281801 filed with Japan Patent Office on Dec. 25, 2012, the entire contents of which are hereby incorporated by reference.

The invention claimed is:
1. A semiconductor device comprising:
a first insulating film comprising a first region, a second region, and a third region between the first region and the second region;
a multilayer film comprising:
a first oxide semiconductor film over and in contact with the third region of the first insulating film and not in contact with the first region and the second region of the first insulating film, wherein the first oxide semiconductor film comprises indium, gallium, and zinc; and
a second oxide semiconductor film over and in contact with the first oxide semiconductor film, wherein the second oxide semiconductor film comprises indium, gallium, and zinc;
a source electrode and a drain electrode each over the second oxide semiconductor film;
a second insulating film over the second oxide semiconductor film; and
a gate electrode over the second oxide semiconductor film with the second insulating film interposed therebetween,
wherein the third region of the first insulating film has a larger thickness than the first region and the second region of the first insulating film.

2. The semiconductor device according to claim 1, comprising:
a first low-resistance region and a second low-resistance region over the multilayer film.

3. The semiconductor device according to claim 1, comprising:
a first low-resistance region between the source electrode and the multilayer film; and
a second low-resistance region between the drain electrode and the multilayer film.

4. The semiconductor device according to claim 1,
wherein the source electrode is in contact with the first region of the first insulating film, and
wherein the drain electrode is in contact with the second region of the first insulating film.

5. The semiconductor device according to claim 1, wherein an end portion of the multilayer film has a curved surface.

6. The semiconductor device according to claim 1, wherein an end portion of each of the source electrode and the drain electrode has a step overlapping with the multilayer film.

7. The semiconductor device according to claim 1, wherein the second insulating film is positioned over the source electrode and the drain electrode.

8. The semiconductor device according to claim 1, wherein the gate electrode overlaps with the source electrode and the drain electrode.

9. A semiconductor device comprising:
a first insulating film comprising a first region, a second region, and a third region between the first region and the second region;
a multilayer film comprising:
  a first oxide semiconductor film over and in contact with the third region of the first insulating film and not in contact with the first region and the second region of the first insulating film, wherein the first oxide semiconductor film comprises indium, gallium, and zinc;
  a second oxide semiconductor film over and in contact with the first oxide semiconductor film, wherein the second oxide semiconductor film comprises indium, gallium, and zinc; and
  a third oxide semiconductor film over and in contact with the second oxide semiconductor film, wherein the second oxide semiconductor film comprises indium, gallium, and zinc;
a source electrode and a drain electrode each over the second oxide semiconductor film;
a second insulating film over the third oxide semiconductor film; and
a gate electrode over the third oxide semiconductor film with the second insulating film interposed therebetween,
wherein the third region of the first insulating film has a larger thickness than the first region and the second region of the first insulating film.

10. The semiconductor device according to claim 9, comprising:
a first low-resistance region and a second low-resistance region over the multilayer film.

11. The semiconductor device according to claim 9, comprising:
a first low-resistance region between the source electrode and the multilayer film; and
a second low-resistance region between the drain electrode and the multilayer film.

12. The semiconductor device according to claim 9,
wherein the source electrode is in contact with the first region of the first insulating film, and
wherein the drain electrode is in contact with the second region of the first insulating film.

13. The semiconductor device according to claim 9, wherein an end portion of the multilayer film has a curved surface.

14. The semiconductor device according to claim 9, wherein an end portion of each of the source electrode and the drain electrode has a step overlapping with the multilayer film.

15. The semiconductor device according to claim 9, wherein the second insulating film is positioned over the source electrode and the drain electrode.

16. The semiconductor device according to claim 9, wherein the gate electrode overlaps with the source electrode and the drain electrode.

17. The semiconductor device according to claim 9, wherein the source electrode and the drain electrode are positioned over the third oxide semiconductor film.

18. The semiconductor device according to claim 9, wherein the third oxide semiconductor film is in contact with a side surface of the source electrode and a side surface of the drain electrode.

19. The semiconductor device according to claim 9, wherein the third oxide semiconductor film is positioned over the source electrode and the drain electrode.

20. The semiconductor device according to claim 9, wherein the third oxide semiconductor film is in contact with a side surface of the second oxide semiconductor film.

* * * * *